US00RE36932E

United States Patent [19]

Furutani

[11] E Patent Number: Re. 36,932

[45] Reissued Date of Patent: Oct. 31, 2000

[54] SEMICONDUCTOR MEMORY DEVICE OPERATING STABLY UNDER LOW POWER SUPPLY VOLTAGE WITH LOW POWER CONSUMPTION

[75] Inventor: Kiyohiro Furutani, Itami, Japan

[73] Assignee: Mitsubishi Denki Kabushiki Kaisha, Tokyo, Japan

[21] Appl. No.: 09/221,835

[22] Filed: Dec. 28, 1998

Related U.S. Patent Documents

Reissue of:

[64] Patent No.: 5,673,232
Issued: Sep. 30, 1997
Appl. No.: 08/486,755
Filed: Jun. 6, 1995

[30] Foreign Application Priority Data

Jul. 18, 1994 [JP] Japan ..... 6-165614

[51] Int. Cl.[7] ..... G11C 7/00

[52] U.S. Cl. ..... 365/226; 365/203; 365/189.07; 365/189.09; 365/189.05

[58] Field of Search ..... 365/226, 227, 365/203, 189.05, 189.07, 189.09

[56] References Cited

U.S. PATENT DOCUMENTS 5,249,155 9/1993 Arimoto et al. ..... 365/226

FOREIGN PATENT DOCUMENTS 3-214669 9/1991 Japan .

4-130766 5/1992 Japan .

OTHER PUBLICATIONS

"A 1.5V Circuit Technology for 64Mb DRAMs," by Y. Nakagome et al., Digest for Technical Papers, 1990 Symposium on VLSI Circuits pp. 17–18.

*Primary Examiner*—Viet Q. Nguyen
*Attorney, Agent, or Firm*—McDermott, Will & Emery

[57] ABSTRACT

A semiconductor memory device of the present invention includes an internal power supply voltage generating circuit down converting external power supply voltage to generate first and second internal power supply voltages, a Vpp generating circuit generating a high voltage from external power supply voltage by charge pumping operation, and a Vbb generating circuit generating negative voltage from external power supply voltage by charge pumping operation. The first internal supply voltage is applied to a control circuit and a sense amplifier drive signal generating circuit. The second internal power supply voltage is applied to a circuit generating a bit line equalize/precharge signal. Even if the first internal power supply voltage is made small, the Vpp generating circuit and the Vbb generating circuit generate a prescribed voltage from external power supply voltage. Therefore, these circuits generate a prescribed internal high voltage and negative voltage efficiently and stably. The bit line equalize/precharge signal is at a voltage level higher than the first internal power supply voltage. The bit line equalize/precharge signal can equalize/precharge a bit line at a high speed. As a result, a semiconductor memory device which operates stably with low power consumption is provided.

19 Claims, 46 Drawing Sheets

:INITIAL STATE

:BOOST

:DISCHARGE

:PRECHARGE

SEMICONDUCTOR MEMORY DEVICE OPERATING STABLY UNDER LOW POWER SUPPLY VOLTAGE WITH LOW POWER CONSUMPTION

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to structures of a voltage generating circuit for generating a voltage required stably with low power consumption, and more particularly, to a structure implementing, in use in a semiconductor memory device, low power consumption and low voltage operation of the semiconductor memory device.

2. Description of the Background Art

A dynamic random access memory (DRAM) has found expanded application to portable appliances such as a notebook personal computer. Such a portable appliance uses a battery as its power source. Each component must operate with as low power consumption as possible in order to make the battery life as long as possible. In the DRAM, an external power supply voltage of 5 V, for example, is internally down-converted to 3.3 V for example, and the internally down-converted voltage is used as operation power supply voltage, in order to implement low power consumption. The low power supply voltage decreases the amplitude of a signal, thereby reducing current consumption associated with charge/discharge of a signal line.

FIG. 54 is a diagram showing the entire structure of a conventional DRAM. Referring to FIG. 54, the conventional DRAM includes a memory cell array 1 having memory cells MC arranged in a matrix of rows and columns. Memory cell array 1 is divided into two array blocks MAR and MAL. Array blocks MAR and MAL each include a plurality of word lines arranged corresponding to each row of memory cells, and a plurality of bit line pairs arranged corresponding to each column of memory cells.

In FIG. 54, for simplicity of illustration, memory cells MC1 and MC2 in array blocks MAL and MAR are representatively shown. Memory cell MC1 included in array block MAL is arranged corresponding to a crossing portion of a word line WLL and a bit line BLL, and includes a capacitor 12 for storing information, and an access transistor 13 formed of an n channel MOS transistor rendered conductive in response to a signal potential on word line WLL for connecting capacitor 12 to bit line BLL. An intermediate voltage VH from a Vcc/2 generating circuit 2 to be described later is applied to the electrode (cell plate) of capacitor 12.

Memory cell MC2 included in array block MAR is arranged corresponding to a crossing portion of a word line WLR and a bit line BLR, and includes a capacitor 14 and an access transistor 15 formed of an n channel MOS transistor rendered conductive in response to a signal potential on word line WLR for connecting capacitor 14 to bit line BLR. Intermediate voltage VH from Vcc/2 generating circuit 2 is applied to the cell plate of capacitor 14. Bit line BLL is paired with a bit line /BLL, and bit line BLR is paired with a bit line /BLR. In a respective bit line pair, data of a memory cell is transmitted to one bit line, and the other bit line provides a comparison reference voltage of the memory cell data.

Between a bit line pair BLL, /BLL and a bit line pair BLR, /BLR, provided are a sense amplifier 21 activated in response to a sense amplifier drive signal ϕp for differentially amplifying potentials on a selected bit line pair, block select gates 22 and 23 rendered conductive in response to an array block select signal ΦR from a signal Φ generating circuit 10 for connecting bit lines BLR and/BLR to sense amplifier 21, block select gates 16 and 17 rendered conductive in response to an array block select signal ΦL from signal Φ generating circuit 10 for connecting bit lines BLL and /BLL to sense amplifier 21, and transistors 18, 19, and 20 precharging and equalizing potentials on bit lines BLL, /BLL, BLR, and /BLR to intermediate voltage VH in response to a bit line equalize signal BLEQ from a BLEQ generating circuit 9.

Transistors 18 and 19 transmit intermediate voltage VH to bit lines BLL and BLR, and bit lines /BLL and /BLR, respectively, in response to bit line equalize signal BLEQ. Transistor 20 electrically connects bit lines BLL and BLR, and bit lines /BLL and /BLR, in response to bit line equalize signal BLEQ.

The conventional DRAM further includes an internal Vcc generating circuit 4 down-converting an external power supply voltage EXV and generating an internal power supply voltage Vcc1, a Vpp generating circuit 5 generating an internal high voltage Vpp higher than internal power supply voltage vcc1 from internal power supply voltage Vcc1, and a sense amplifier drive signal generating circuit 6 generating sense amplifier drive signal ϕp at the internal power supply voltage Vcc1 level at a prescribed timing in response to a timing signal (signal path of which is not shown) from a control circuit 7 to be described later.

Control circuit 7 receives an address signal Add, a row address strobe signal /RAS, a column address strobe signal /CAS, an output enable signal /OE, and a write enable signal /WE, and generates an internal address signal (not shown) and a control signal determining an operation timing of each internal circuit. Control circuit 7 further generates internal write data from external write data Din, and external read data Dout from internal read data.

The conventional DRAM further includes a word line decoder 8 provided corresponding to array block MAL for decoding an internal address signal from control circuit 7 and transmitting a word line drive signal at the internal high voltage level from Vpp generating circuit 5 onto a corresponding word line of array block MAL, and a word line decoder 11 provided corresponding to array block MAR for decoding an internal address signal from control circuit 7 and transmitting a word line drive signal at the internal high voltage Vpp level from Vpp generating circuit 5 onto a selected word line (word line corresponding to an addressed row).

BLEQ generating circuit 9 generates bit line equalize signal BLEQ at the internal power supply voltage Vcc1 level in response to an internal control signal from control circuit 7. Signal Φ generating circuit 10 brings one of block select signals ΦL and ΦR to a non-active state according to part of an internal control signal and an internal address signal from control circuit 7. Note that, in the following description, "generating a signal" means "bringing a signal to an active state". More specifically, signal Φ generating circuit 10 connects an array block including a selected word line to sense amplifier 21, and disconnects a non-selected array block from sense amplifier 21. At the time of stand-by, signals ΦL and ΦR are in an active state of "H", block select gates 16, 17, 22 and 23 are all turned on, and bit lines BLL, /BLL, BLR, /BLR are all precharged to intermediate voltage VH.

Vpp generating circuit 5 generates a negative voltage Vbb at a prescribed voltage level from internal power supply voltage Vcc1, and applies negative voltage Vpp to a region of a semiconductor substrate on which memory cell array 1 is formed. The negative voltage Vbb prevents generation of a parasitic MOS transistor (insulated gate type field effect transistor), reduces parasitic capacitance caused by a PN junction between the substrate and an impurity region, and stabilizes the threshold voltage of an access transistor. Data writing/reading operation will now be described briefly.

At the time of stand-by, row address strobe signal /RAS is in a non-active state at an "H" level. In this state, word lines WLL and WLR are both at an "L" level, and access transistors 13 and 15 are both in an off state. Bit line equalize signal BLEQ is at "H" at the internal power supply voltage Vcc1 level, transistors 18, 19, and 20 are in an on state, and bit lines BLL, /BLL, BLR, and /BLR are precharged and equalized to intermediate voltage VH (block select gates 16, 17, 22 and 23 are in an on state).

In response to the falling of signal /RAS to the "L" level, a memory cycle starts. In this state, bit line equalize signal BLEQ from BLEQ generating circuit 9 attains the "L" level, and transistors 18, 19 and 20 are turned off. Accordingly, bit lines BLL, /BLL, BLR, and /BLR are brought to a floating state of intermediate voltage VH. In response to the falling of signal /RAS, external address signal Add is strobed, and an internal address signal is provided from control circuit 7. The internal address signal includes a block address designating an array block. According to the block address from control circuit 7, signal Φ generating circuit 10 maintains block select signal ΦL (or ΦR) for a selected array block at the "H" level, and sets block select signal ΦR (or ΦL) for a non-selected array block to the "L" level.

One word line decoder provided corresponding to an array block including a selected word line is activated among word line decoders 8 and 11. Here, assume that word line WLL included in array block MAL is selected. In this case, word line decoder 8 operates, decodes an internal address signal from control circuit 7, and transmits a word line drive signal at the internal high voltage Vpp level from Vpp generating circuit 5 onto word line WLL. As a result, access transistor 13 is turned on, and information stored in capacitor 12 is transmitted onto bit line BLL. Bit line /BLL maintains precharge level VH.

Then, sense amplifier drive signal ϕp from sense amplifier drive signal generating circuit 6 is boosted to the internal power supply voltage Vcc1 level, and sense amplifier 21 is activated to differentially amplifying potentials on bit lines BLL and /BLL.

Then, column selecting operation (bit line pair selecting operation) is carried out according to an internal address signal generated by address signal Add strobed in response to the falling of column address strobe signal /CAS, writing/reading of data for memory cells (MC1) on a selected column is carried out. Whether data is written or read out is determined by signals /OE and /WE.

When writing/reading of data is complete, row address strobe signal /RAS is brought to a non-active state, and the signal potential on a selected word line WL4 attains the "L" level, followed by sense amplifier drive signal ϕp attaining the "L" level.

Then, block select signal ΦR which was in a non-active state attains the "H" level, block select gates 22 and 23 are turned on, bit line equalize signal BLEQ attains the "H" level, and bit lines BLL, /BLL, BLR, and /BLR are precharged and equalized.

Block select signal ΦL or ΦR from signal Φ generating circuit 10 is at the internal high voltage Vpp level because of the following reason. During the restoring operation after completion of the sensing operation, sense amplifier 21 sets, according to storage data of memory cell MC1 (or MC2), corresponding bit lines BLL and /BLL (or BLR and /BLR) to the internal power supply voltage Vcc1 level and a ground potential Vss level. Between sense amplifier 21 and bit lines BLL and /BLL (or BLR and /BLR), block select gates 16 and 17 (or 22 and 23) are provided. Block select gates 16 and 17 (or 22 and 23) can transmit a voltage corresponding to a voltage applied to their gates minus the threshold voltage to corresponding bit lines BLL and /BLL (or BLR and /BLR). In order to eliminate the influence of loss of the threshold voltage in block select gates 16 and 17 (or 22 and 23), and to transmit a voltage at the internal power supply voltage Vcc1 level to bit lines BLL and /BLL (or BLR and /BLR), block select signal ΦL or ΦR is set at the internal high voltage Vpp level. Block select signal ΦL or ΦR may be set at the internal high voltage Vpp level only at the time of memory cycle, or only at the time when so-called "restoring operation" is carried out. Block select signal ΦL or ΦR has only to be at the internal high voltage Vpp level when a voltage at the internal power supply voltage Vcc1 level is transmitted to corresponding bit lines BLL and /BLL (or BLR and /BLR).

Word line decoders 8 and 11 generate a word line drive signal at the internal high voltage Vpp level because of the following reason. Memory cell MC1 (or MC2) writes storage data in memory cell capacitor 12 (or 14) through access transistor 13 (or 15). In order to sufficiently increase the amount of stored electric charge of capacitor 12 (or 14), it is necessary to transmit as high a voltage as possible to capacitor 12 (or 14) from bit line BLL (or BLR). In order to eliminate the influence of loss of the threshold voltage in access transistor 13 (or 15), and to transmit a voltage at the internal power supply voltage Vcc1 level to capacitor 12 (or 14), a word line drive signal at the internal high voltage Vpp level is used.

Intermediate voltage VH from Vcc/2 generating circuit 2 is applied to the cell plates of capacitors 12 and 14 because of the following reason. Ground voltage Vss or internal power supply voltage Vcc1 is applied to the opposing electrodes (storage nodes) of capacitors 12 and 14. From the standpoint of precise sensing operation (sensing margin), it is preferable that the amount of potential change of a bit line BL (which indicates BLL, /BLL, BLR, /BLR collectively) is made equal at the time of reading data of "H" at the Vcc1 level and at the time of reading data of "L" at the Vss level. Bit line BL is precharged to intermediate voltage VH. Therefore, in order to make the amount of potential change from the precharge level VH of bit line BL at the time of reading memory cell data equal between the time of reading data of "H" and at the time of reading data of "L", intermediate voltage VH is applied to the cell plates of capacitors 12 and 14. The amount of stored electric charge Q of the storage nodes of capacitors 12 and 14 at the time of storing data of "H" is C·Vcc1/2, and the amount of stored electric charge Q at the time of writing data of "L" is −C·Vcc1/2, wherein C is the capacitance of capacitors 12 and 14. More specifically, application of intermediate voltage VH to the cell plates of the memory cell capacitors makes the amount of potential change of bit line BL equal between the time of reading data of "H" and the time of reading data of "L".

The conventional DRAM down-converts external power supply voltage EXV using an internal Vcc generating circuit, generates internal power supply voltage Vcc1, and applies internal power supply voltage Vcc1 to each circuit, so that a signal amplitude is made small to reduce current consumption and power consumption.

In order to implement lower power consumption using lower operation power supply voltage, however, a signal at a required voltage level must be generated with as low power consumption as possible without the operation speed decreased by reduction of internal operation power supply voltage. Description will now be given of a circuit affected by reduction of internal power supply voltage Vcc1.

(i) Vbb generating circuit /Vpp generating circuit:

Negative voltage Vbb applied to the semiconductor substrate region as a bias voltage and internal high voltage Vpp used for driving a word line or the like are both generated using charge pump operation of a capacitor. A Vbb generating circuit will be described hereinafter.

FIG. 55 is a diagram showing one example of the structure of a Vbb generating circuit 3 shown in FIG. 54. Referring to FIG. 55, Vbb generating circuit 3 includes a pump drive signal generating circuit 224 providing a clock signal CK having a prescribed pulse width and a prescribed period, a pump circuit 225 generating negative voltage Vbb by charge pumping operation according to block signal CK from pump drive signal generating circuit 224, and a level detecting circuit 223 stopping generation of clock signal CK by pump drive signal generating circuit 224 when negative voltage Vbb generated by pump circuit 225 attains a prescribed level. Level detecting circuit 223, pump drive signal generating circuit 224, and pump circuit 225 receive internal power supply voltage Vcc1 as one operation power supply voltage and ground voltage Vss as the other power supply voltage.

Level detecting circuit 223 includes an n channel MOS transistor 87 having its source connected to an output node (or semiconductor substrate region) NA of pump circuit 225, and its gate and drain connected to a node NB, and an n channel MOS transistor 79 provided between node NB and a node NC and receiving ground voltage Vss at its gate, and a p channel MOS transistor 78 connected between an internal power supply node Vcc1 and node NC and receiving ground voltage Vcc at its gate. Note that power supply nodes and voltages applied thereto have the same reference characters in the following description.

MOS transistor 78 has large on resistance, and serves as a resistance element. MOS transistor 79 has small on resistance, and current supplying capability larger than that of MOS transistor 78. MOS transistor 79 is rendered conductive when the potential at node NB is Vss−Vthn or less, and sets node NC at the "L" level. Vthn is a threshold voltage of MOS transistor 79. MOS transistor 87 serves as a diode, and maintains a difference in potentials at node NB and node NA at the threshold voltage Vthn when rendered conductive.

Pump drive signal generating circuit 224 includes an inverter 91 inverting a signal at node NC of level detecting circuit 223, a 2-input NOR circuit 101 receiving an output signal from inverter 91 at one input, and three stages of cascade-connected inverters 92, 93, and 94 receiving an output signal from NOR circuit 101. NOR circuit 101 operates as an inverter when an output signal from inverter 91 is at the "L" level. In this state, NOR circuit 101, inverters 92 and 93 form a ring oscillator, and a clock signal having a prescribed pulse width and a prescribed period is generated. When an output signal from inverter 91 is at the "H" level, an output signal from NOR circuit 101 is fixed to the "L" level, clock signal CK is fixed to the "H" level, and pump drive signal generating circuit 224 stops generation of clock signal CK.

Pump circuit 225 includes an inverter 95 receiving clock signal CK from pump drive signal generating circuit 224, two stages of cascade-connected inverters 96 and 97 receiving an output signal from inverter 95, a capacitor 103 capacitively coupling an output portion of inverter 97 and a node N6, two stages of cascade-connected inverters 98 and 99 receiving an output signal from inverter 95, a capacitor 104 capacitively coupling an output portion of inverter 99 and a node N5, a capacitor 105 capacitively coupling an output portion of inverter 98 and a node N7, p channel MOS transistors 80 and 82 discharging the potentials at nodes N5 and N6 to the ground potential level in response to the potential at node N7, a p channel MOS transistor 83 clamping the potential on node N7 to the threshold voltage Vthp level, and a p channel MOS transistor 81 rendered conductive in response to the potential on node N6 for supplying a negative voltage from node N5 to output node NA. It should be noted that Vthp is the threshold voltage of p channel MOS transistors 80, 81, 82 and 83. Operation of pump circuit 225 will now be described with reference to FIG. 56.

In FIG. 56, a state is shown where pump circuit 225 conducts pumping operation stably. When clock signal CK rises to the "H" level, an output signal from inverter 98 also rises to the "H" level, and the potential on node N7 is increased by capacitive coupling (charge pump) of capacitor 105. Increase in the potential on node N7 brings MOS transistor 13 to an on state, and the potential on node N7 is clamped to |Vthp|. On the other hand, output signals from inverters 97 and 99 attain the "L" level, and the potentials on nodes N6 and N5 are decreased to negative potentials by capacitive coupling of capacitors 103 and 104. The potentials at nodes N6 and N5 are at the −Vcc1 level, as will be described later. MOS transistors 80 and 82 are turned off, because they receive the potential of |Vthp| at their gates. When the potential of negative voltage Vbb from output node NA is higher than −Vcc1+|Vthp|, MOS transistor 81 is turned on, and there is a current flow to node N5 from node NA. More specifically, negative electric charge is supplied from node N5 to node NA. As a result, the potential at node NA is decreased.

When clock signal CK falls to the "L" level, an output signal from inverter 98 falls to the "L" level, and output signals from inverters 97 and 99 rise to the "H" level. The potential at node N5 attains the negative potential level (−Vcc1+|Vthp|) by capacitive coupling of capacitor 105. On the other hand, although the potentials at nodes N6 and N5 once increase by capacitive coupling of capacitors 103 and 105, the potentials are discharged to the ground potential Vss level because of an on state of MOS transistors 80 and 82. MOS transistor 81 is turned off because the potential at node NA is lower than the potentials at nodes N5 and N6. When output signals from inverters 95 and 99 fall to the "L" level, the potential at node N5 decreases to the voltage level of −Vcc1 and the potential at node N6 also decreases to the voltage level of −Vcc1 similarly. Therefore, MOS transistor 81 can transmit the potential of −Vcc1+|Vthp| to node NA. More specifically, negative voltage Vbb can decrease down to −Vcc1+|Vthp|.

Although the negative voltage Vbb is applied to the semiconductor substrate region, the reverse bias voltage is applied to a PN junction formed between the semiconductor substrate region and an impurity region formed on the surface thereof. Therefore, from the standpoint of breakdown voltage of the PN junction, the value of negative voltage Vbb is preferably small. Making the value of negative voltage Vbb larger than necessary (more negative) is not preferable from the standpoint of current consumption. Therefore, level detecting circuit 223 detects the voltage level of negative voltage Vbb provided from node NA, and stops generation of clock signal CK by pump drive signal generating circuit 224 when negative voltage Vbb is −2·Vthn or less. More specifically, in level detecting circuit 223, when negative voltage Vbb is −2·Vthn or less, the potential at node NB is −Vthn or less, MOS transistor 79 receiving ground voltage Vss at its gate is turned on, and the potential at node NC is decreased to the "L" level. As a result, an output from inverter 91 attains the "H" level, an output from NOR circuit 101 is fixed to the "L" level, and clock signal CK is fixed to the "H" level in pump drive signal generating circuit 224. Pump operation of pump circuit 225 is halted, and supply of negative electric charge (electrons) to node NA is stopped.

Pump circuit 225 causes negative electric charge (electrons) to flow out to output node NA for every one cycle of clock signal CK. The speed at which negative voltage Vbb from node NA decreases is determined by the amount of current (the amount of negative electric charge) supplied from MOS transistor 81 of the output portion of pump circuit 225. As shown in FIG. 57, the potential at node N5 basically vibrates between Vss and −Vcc1. MOS transistor 81 supplies negative electric charge to node NA according to a difference in potentials between nodes N5 and NA. As shown by hatching in FIG. 57, negative electric charge is supplied for every one cycle. However, the amount of negative electric charge supplied from output node NA is decreased as the potential level of negative voltage Vbb decreases. When supply of negative electric charge by MOS transistor 81 is stopped, Vbb=V(N5)+|Vthp|, wherein V(N5) is the potential at node N5.

Therefore, as the potential level of negative potential Vbb approaches −Vcc1+|Vthp|, negative voltage current (the amount of negative electric charge) flowing through MOS transistor 81 decreases, and the speed at which the potential decreases is decreased. When internal power supply voltage Vcc1 is decreased for low power consumption, the threshold voltage Vthn of the MOS transistor is not scaled down (because of larger subthreshold current). Therefore, the potential level of the lowest potential −Vcc1 which node N5 attains approaches a target voltage level −2·Vthn of negative voltage Vbb. Accordingly, the speed at which the potential of negative voltage Vbb decreases is decreased (because of reduction of the amount of supply of negative electric charge), and long time is required for negative voltage Vbb to attain a prescribed level −2·Vthn.

Further, when a substrate bias voltage (negative voltage Vbb) varies due to substrate current at the time of operation of the semiconductor substrate, the substrate bias voltage cannot be returned to a prescribed potential level −2·Vthn at a high speed because of decrease of the amount of supply of negative electric charge from pump circuit 225. As a result, stable operation cannot be guaranteed.

The above problem of reduction of efficiency of the negative voltage Vbb generating circuit caused by low power supply voltage arises in the Vpp generating circuit generating internal high voltage Vpp, similarly. In the internal high voltage generating circuit (Vpp generating circuit), by replacing the p channel MOS transistors of pump circuit 225 shown in FIG. 55 with n channel MOS transistors, and by replacing ground voltage Vss with internal power supply voltage Vcc1, a pump circuit for generating internal high voltage Vpp is obtained theoretically. A level sensing circuit for internal high voltage Vpp is also implemented by replacing negative voltage Vbb in the level sensing circuit shown in FIG. 55 with internal high voltage Vpp, reversing conductivity types of the MOS transistors, and by replacing ground voltage Vss with internal power supply voltage Vcc1.

As described above, when a pump circuit is used as a conventional negative voltage generating circuit and a conventional internal high voltage generating circuit, and the internal power supply voltage level is further decreased for low power consumption, electric charge cannot be supplied efficiently, and a voltage at a prescribed level (negative voltage Vbb and internal high voltage Vpp) cannot be generated at a high speed. Accordingly, a semiconductor memory device which operates stably with lower power consumption cannot be implemented.

(ii) BLEQ generating circuit

FIG. 58 is a diagram showing schematically the structure of BLEQ generating circuit 9 shown in FIG. 54. Referring to FIG. 58, BLEQ generating circuit 9 generates bit line equalize signal BLEQ in response to an internal row address strobe signal RAS applied from control circuit 7 shown in FIG. 54. BLEQ generating circuit 9 operates with internal power supply voltage Vcc1 and ground voltage Vss as operation power supply voltages. Internal row address strobe signal RAS is generated from control circuit 7 shown in FIG. 54 in response to external row address strobe signal /RAS. When internal row address strobe signal RAS is at the "H" level, bit line equalize/precharge signal BLEQ attains the "L" level. Description will be given hereinafter of operation of BLEQ generating circuit 9 shown in FIG. 58 with reference to FIG. 59 which shows the operation waveform diagram.

When external row address strobe signal /RAS is at the "H" level, internal row address strobe signal RAS is at the "L" level, and bit line equalize signal BLEQ from BLEQ generating circuit 9 is at the "H" level of the internal power supply voltage Vcc1 level. As a result, MOS transistors 18, 19, and 20 are turned on, precharging and equalizing bit lines BL and /BL (which indicate bit lines BLL, /BLL, and BLR, /BLR shown in FIG. 54 collectively) to a prescribed intermediate voltage VH.

When external row address strobe signal /RAS falls to the "L" level, internal row address strobe signal /RAS accordingly rises to the "H" level, and a memory cycle starts. In response to the rising of internal row address strobe signal RAS, bit line equalize signal BLEQ from BLEQ generating circuit 9 attains the "L" level, MOS transistors 18, 19, and 20 are turned off, and bit lines BL and /BL are brought to a floating state at intermediate voltage VH.

Then, a word line, not shown, is selected, and the potential increases. Data of memory cells connected to the selected word line is transmitted to bit line BL or /BL. Then, sensing operation is carried out. The potentials on bit lines BL and /BL attain "H" at the internal power supply voltage Vcc1 level and "L" at the ground voltage Vss level depending on data read out from memory cells.

When the memory cycle is complete, external row address strobe signal /RAS rises to the "H" level. After a prescribed time, internal row address strobe signal /RAS falls to the "L" level. In response to the falling of internal row address strobe signal RAS, bit line equalize signal BLEQ from BLEQ generating circuit 9 rises to the "H level, and MOS transistors 18, 19, and 20 are turned on. This causes bit lines BL and /BL to be precharged/equalized to the internal voltage VH level again.

Bit line equalize signal BLEQ is at the internal power supply voltage Vcc1 level. When the voltage level of internal power supply voltage Vcc1 is decreased for low power consumption of a semiconductor memory device, the potential at the "H" level of bit line equalize signal BLEQ decreases accordingly. In this case, the gate-source voltages of MOS transistors 18–20 become small (the sources of n channel MOS transistors are electrodes having a low potential), and their conductivities become small. Therefore, current supplying capabilities of MOS transistors 18–20 become small, and the potentials of bit lines BL and /BL are set at a prescribed intermediate voltage VH later as shown by a broken line in FIG. 59 after completion of the memory cycle. On the other hand, for external row address strobe signal /RAS, RAS precharge time tPR is set. Once it attains the "H" level, external row address strobe signal /RAS can be set to the "L" level again only after a lapse of RAS precharge time tPR (for reliably precharging an internal signal line to a prescribed potential). If the potentials of bit lines BL and /BL cannot be precharged/equalized to a prescribed intermediate voltage VH within a prescribed time, the RAS precharge time becomes longer, and it takes longer time to start the next memory cycle. Accordingly, the semiconductor memory device cannot be accessed at a high speed.

(iii) Vcc/2 generating circuit

FIG. 60 is a diagram showing the structure of a conventional Vcc/2 generating circuit, which is found in pages 17 and 18 of Digest of Technical Papers, 1990 Symposium on VLSI Circuits, for example.

Referring to FIG. 60, the Vcc/2 generating circuit includes resistors 34 and 35 connected in series between power supply node Vcc1 and a ground node Vss, a resistor 36 connected between power supply node Vcc1 and a node ND2, an n channel MOS transistor 38 having its gate and drain connected to node ND2 and its source connected to a node ND1, a p channel MOS transistor 40 having its gate and drain connected to a node ND3 and its source connected to node ND1, a resistor 37 connected between node ND3 and ground node Vss, an n channel MOS transistor 39 connected between power supply node Vcc1 and node ND1 and receiving the signal potential at node ND2 at its gate, and a p channel MOS transistor 41 connected between node ND1 and ground node Vss and receiving the signal potential at node ND3 at its gate.

Resistors 34 and 35 have the same resistance value, and resistors 36 and 37 have a sufficiently large resistance value. Transistors 38 and 40 have respective threshold voltages Vthn and Vthp. Operation will now be described briefly.

Since resistors 34 and 35 have the same resistance value, the potential of node ND1 is Vcc1/2. Since resistors 36 and 37 have a sufficiently large resistance value, there is only a small current flow through MOS transistors 38 and 40. Therefore, MOS transistors 38 and 40 operate in a diode mode, the potential of node ND2 is Vcc1/2+Vthn, and the potential of node ND3 is Vcc1/2−|Vthp|. MOS transistors 39 and 41 have threshold voltages Vthn and Vthp, respectively. When the potential VH of node ND4 is lower than Vcc1/2, MOS transistor 39 is turned on, and MOS transistor 41 is turned off. Node ND4 is supplied with current from power supply node Vcc1 through MOS transistor 39, increasing voltage VH.

When voltage VH of node ND4 is higher than Vcc1/2, MOS transistor 39 is turned off, and MOS transistor 41 is turned on. Node ND4 is discharged through MOS transistor 41, decreasing the potential. As a result, voltage VH of node ND4 is set to intermediate voltage Vcc1/2.

MOS transistor 38 causes voltage drop between node ND2 and node ND1, and MOS transistor 40 causes voltage drop of |Vthp| between node ND1 and node ND3. Therefore, in order for Vcc1/2 generating circuit 2 to operate, the condition of Vcc1≧Vthn+|Vthp| must be satisfied. More specifically, internal power supply voltage Vcc1 has a lower limit value, and low power consumption cannot be implemented by reduction of the internal power supply voltage.

Further, there is also a problem that current consumption is increased depending on a defective mode of a memory cell as described below.

As shown in FIG. 61, consider the case where short-circuiting occurs between the electrode (cell plate) of a memory cell capacitor MQ and a word line WL. Intermediate voltage VH from Vcc/2 generating circuit 2 is applied to the electrode of memory cell capacitor MQ. Therefore, when the potential of word line WL is at the "L" level, there is a current flow from power supply node Vcc1 through MOS transistor 39 shown in FIG. 60 to word line WL through node ND4 and the memory cell capacitor electrode (cell plate). In general, in order to ensure the production yield, a DRAM is used as a non-defective product even if there is a leakage current of 0.2 mA in memory cell capacitor MQ, provided that a defective memory cell in which the capacitor electrode is short-circuited is replaced with a redundancy circuit (the defective memory cell per se exists in the device). Since current must be supplied to the capacitor electrode of the defective memory cell through the Vcc/2 generating circuit, the internal power supply voltage generating circuit must have current supplying capability of 0.2 mA even at the time of stand-by of the DRAM. Accordingly, the stand-by current of the DRAM cannot be made small.

In addition, even when voltage VH from node ND4 attains a prescribed level Vcc1/2, current is consumed wastefully, because the gate-source voltages of MOS transistors 39 and 41 are Vthn and Vthp, respectively, and there is a subthreshold current flow in ground node Vss from power supply node Vcc1 through MOS transistors 39 and 41. In order to reduce the subthreshold current, ions must be implanted into the channel regions of transistors 39 and 41, and the threshold voltages Vthn and |Vthp| of MOS transistors 39 and 41 must be increased. In this case, an additional manufacturing step for adjusting the threshold voltages of MOS transistors 39 and 41 is required, preventing simplification of the manufacturing process. When the threshold voltages of MOS transistors 39 and 41 are increased, even if voltage VH from node ND4 is offset from a prescribed intermediate voltage Vcc1/2, MOS transistors 39 and 41 are not turned on. A non-sensitive belt where the Vcc/2 generating circuit does not operate even if voltage VH changes from a prescribed level, making it impossible to precisely maintain voltage VH at the intermediate voltage level.

(iv) Internal power supply voltage generating circuit

FIG. 62 is a diagram showing the structure of a conventional internal power supply voltage generating circuit. Referring to FIG. 62, conventional internal power supply voltage generating circuit 4 includes an activation internal power supply voltage generating circuit 313 operating at the time of activation (during memory cycle) and supplying internal power supply voltage Vcc1, and a stand-by internal power supply voltage generating circuit 314 maintaining internal power supply voltage Vcc1 at a prescribed voltage level at the time of stand-by.

Activation internal power supply voltage generating circuit 313 includes an inverter 170 inverting row address strobe signal /RAS (generated from control circuit 7 shown in FIG. 54), a p channel MOS transistor 310 rendered conductive in response to an output signal from inverter 170 for transmitting external power supply voltage EXV to a node ND5, an N channel MOS transistor 164 provided between node ND5 and a node ND7 for receiving a reference voltage Vref at its gate, an n channel MOS transistor 165 provided between a node ND6 and node ND7 for receiving the signal potential on a node ND9 at its gate, an n channel MOS transistor 166 provided between node ND7 and ground node Vss for receiving an output from inverter 170 at its gate, a p channel MOS transistor 158 provided between node ND5 and an external power supply node EXV receiving external power supply voltage EXV, and a p channel MOS transistor 159 provided between external power supply node EXV and node ND6. Node ND6 is connected to respective gates of MOS transistors 158 and 159. MOS transistors 158 and 159 form a current mirror circuit, and MOS transistors 164 and 165 form a source coupling type comparing circuit.

Stand-by internal power supply voltage generating circuit 314 includes an n channel MOS transistor 167 provided between a node ND10 and a node ND12 for receiving reference voltage Vref at its gate, an n channel MOS transistor 168 provided between a node ND11 and node ND12 for receiving the signal potential on a node ND9 at its gate, a p channel MOS transistor 161 provided between external power supply node EXV and node ND10, and a p channel MOS transistor 162 provided between node ND11 and external power supply node EXV. Node ND11 is connected to respective gates of MOS transistors 161 and 162. MOS transistors 161 and 162 form a current mirror circuit, and MOS transistors 167 and 168 form a source coupling type comparing circuit. Stand-by internal power supply voltage generating circuit 314 further includes an n channel MOS transistor 159 provided between node ND12 and ground node Vss for receiving internal power supply voltage Vcc1 at its gate to serve as a constant current source.

Internal power supply voltage generating circuit 4 further includes a p channel MOS transistor 160 rendered conductive in response to the signal potential on node ND5 of activation internal power supply voltage generating circuit 313 for supplying current to a node ND8 from external power supply node EXV, a p channel MOS transistor 163 rendered conductive in response to the signal potential on node ND10 of stand-by internal power supply voltage generating circuit 314 for supplying current from external power supply node EXV to output node ND8, and resistors 171 and 172 connected in series between node ND8 and ground node Vss. The resistance values of resistors 171 and 172 are so set that the ratio is 2:3, for example. Operation will now be described briefly.

In a stand-by state, row address strobe signal /RAS is at the "H" level, and an output from inverter 170 is at the "L" level. In this state, MOS trnsistor 310 is turned on, and MOS transistor 166 is turned off. Node ND5 is charged to external power supply voltage EXV by MOS transistor 310, and MOS transistor 160 is turned off.

On the other hand, in stand-by internal power supply voltage generating circuit 314, MOS transistor 169 operates as a constant current source, and compares reference voltage Vref and the signal potential on node ND9. When the signal potential on node ND9 is higher than reference voltage Vref, the potential of node ND10 increases, thereby decreasing the conductance of MOS transistor 163. On the other hand, when the signal potential on node ND9 is lower than reference voltage Vref, the potential of node ND10 decreases, thereby increasing the conductance of MOS transistor 163, and supplying current to node ND8. This makes the signal potential on node ND9 equal to reference voltage Vref. The ratio of the resistance values of resistors 171 and 172 are set to 2:3. Therefore, internal power supply voltage Vcc1 is maintained at a voltage level of 5·Vref/3. When the value of reference voltage Vref is 1.5 V, for example, the value of internal power supply voltage Vcc1 is maintained at 2.5 V.

When an active cycle (memory cycle) starts, row address strobe signal /RAS attains the "L" level, and activation internal power supply voltage generating circuit 313 is brought to an active state. More specifically, an output signal from inverter 170 attains the "H" level, MOS transistor 310 is turned off, and MOS transistor 166 is turned on. Operation of a current mirror type differentially amplifying circuit formed of MOS transistors 158, 159, 164, and 165 is the same as that of the stand-by internal power supply voltage generating circuit. By adjusting the conductance of MOS transistor 160 according to the relationship between the voltage of node ND9 and reference voltage Vref, internal power supply voltage Vcc1 on node ND8 is maintained at a constant voltage level of 5·Vref/3.

At the time of stand-by when internal power supply voltage Vcc1 is hardly used, current consumption at the time of stand-by is reduced by operating only stand-by internal power supply voltage generating circuit 314 consuming a little current. In the memory cycle (active cycle) when internal power supply voltage Vcc1 is consumed (current is consumed from internal power supply voltage Vcc1 by charging of a signal line by operation of internal circuits), a large amount of current is supplied to node ND8 by MOS transistor 10 having a large current drivability, thereby stabilizing internal power supply voltage Vcc1.

With the structure of the conventional internal power supply voltage generating circuit shown in FIG. 62, however, there is always a current flow from node ND8 to ground node Vss through resistors 171 and 172. When the resistance values of resistors 171 and 172 are increased in order to decrease a current flow through resistors 171 and 172, RC delay from node ND8 to node ND9 becomes larger. In this case, change of the signal potential on node ND8 is transmitted to circuits 313 and 314 later. Change of internal power supply voltage Vcc1 cannot be followed at a high speed, and internal power supply voltage Vcc1 cannot be kept at a constant level stably.

More specifically, with the structure of the conventional internal power supply voltage generating circuit, operating the semiconductor memory device with low power consumption prevents stable generation of internal power supply voltage.

As described above, with the structure of the conventional semiconductor memory device, low power consumption cannot be implemented without decreasing performance.

SUMMARY OF THE INVENTION

One object of the present invention is to provide a semiconductor memory device operating stably with low power consumption.

Another object of the present invention is to provide each component for implementing low power consumption of the semiconductor memory device.

Still another object of the present invention is to provide an internal power supply voltage generating circuit which can generate an internal voltage at a prescribed voltage level efficiently and stably with low power consumption.

A further object of the present invention is to provide a negative voltage generating circuit capable of generating a substrate bias voltage efficiently with low power consumption.

A further object of the present invention is to provide an internal high voltage generating circuit capable of generating an internal high voltage efficiently.

A further object of the present invention is to provide an intermediate voltage generating circuit capable of generating an intermediate voltage stably with low power consumption.

A further object of the present invention is to provide an internal power supply voltage generating circuit capable of generating internal power supply voltage stably with low power consumption.

A further object of the present invention is to provide a reference voltage generating circuit capable of generating a reference voltage at a constant voltage level stably with low power consumption, and a constant current source therefor.

A further object of the present invention is to provide a semiconductor memory device operating at a high speed with low power consumption.

A semiconductor memory device according to one aspect of the present invention includes an internal power supply circuit down-converting externally applied external power supply voltage to generate internal power supply voltage, and an internal voltage generating circuit generating an internal voltage at a voltage level different form the internal power supply voltage from the external power supply voltage by charge pumping operation.

In the semiconductor memory device according to the one aspect of the present invention, the internal voltage at a prescribed voltage level is generated from the external power supply voltage by charge pumping operation. Therefore, even if the internal voltage level provided from a pump circuit approaches a target voltage level, sufficient electric charge can be supplied, and the internal voltage at a prescribed voltage level can be generated stably at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given hereinafter of a negative voltage generating circuit, an internal high voltage generating circuit, an intermediate voltage generating circuit, and an internal power supply voltage generating circuit. Although they may be used independently, these circuits can implement a semiconductor memory device which operates stably with low power consumption in combination.

[Internal Voltage Generating Circuit]

Figure 1:
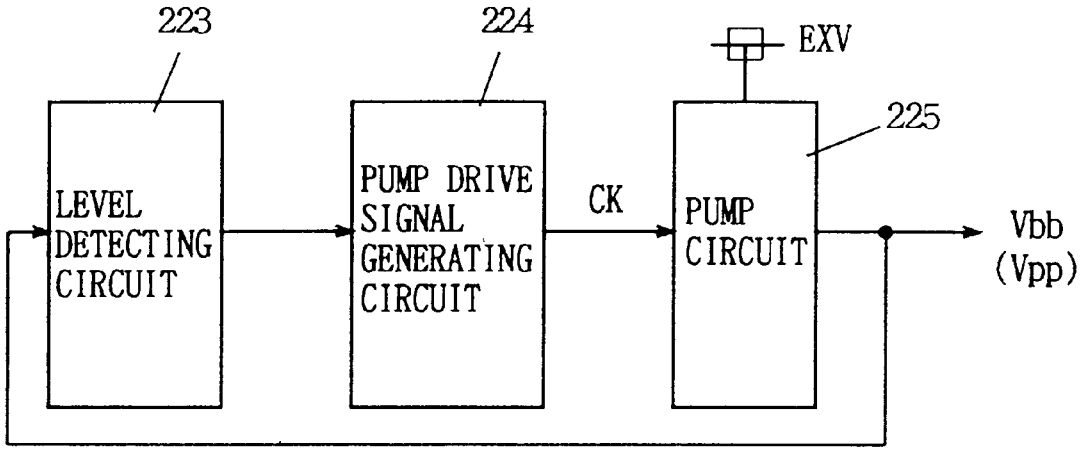
FIG. 1 is a diagram showing the structure of an internal voltage generating circuit using charge pumping operation according to the present invention.

FIG. 1 is a diagram showing a schematic structure of the internal voltage generating circuit according to the present invention. Referring to FIG. 1, the internal voltage generating circuit includes pump drive signal generating circuit 224 generating pump drive signal CK, pump circuit 225 operating with external power supply voltage EXV applied to external power supply node EXV as one operation power supply voltage for carrying out charge pumping operation according to clock signal CK from pump drive signal generating circuit 224 to generate an internal voltage (negative voltage Vbb or internal high voltage Vpp), and level detecting circuit 223 detecting a level of the internal voltage generated by pump circuit 225 and controlling signal generating operation of pump drive signal generating circuit 224 according to the level detection result. Level detecting circuit 223 and pump drive signal generating circuit 224 may receive either external power supply voltage EXV or internal power supply voltage Vcc1 as operation power supply voltage.

Figure 2:
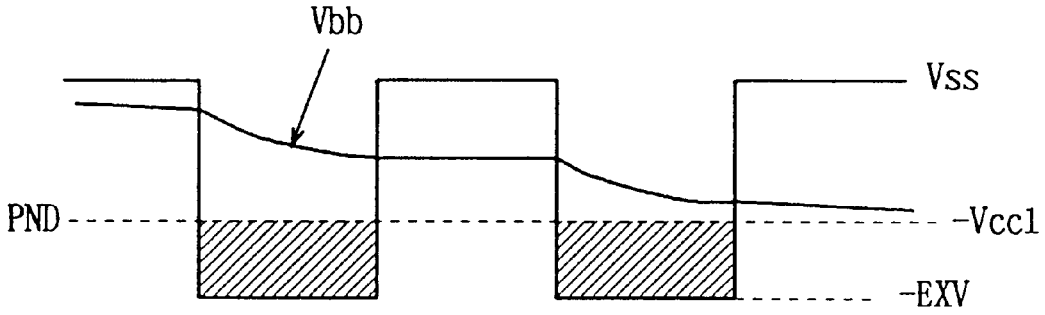
FIG. 2 is a diagram for explaining the effect brought about by the internal voltage generating circuit shown in FIG. 1.

FIG. 2 is a diagram schematically showing operation of the internal voltage generating circuit shown in FIG. 1. In FIG. 2, a state where negative voltage Vbb is generated as an internal voltage is shown as an example.

Pump circuit 225 operates with external power supply voltage EXV as operation power supply voltage. Therefore, the potential amplitude of an internal node for supplying negative voltage Vbb to an output node is between Vss and −EXV. External power supply voltage EXV is higher than internal power supply voltage Vcc1. Therefore, even when negative voltage Vbb approaches a prescribed voltage level (−2·Vthn), that is, a voltage level of −Vcc1, a difference between the potential of an internal node PND and negative voltage Pbb is sufficiently large as shown in FIG. 2. The pump circuit affords to supply negative electric charge, thereby decreasing negative voltage Vpp. More specifically, the amount of negative electric charge stored in internal node PND is greater in the case where external power supply voltage EXV is used than in the case where internal power supply voltage Vcc1 is used as shown by hatching in FIG.

2. The increased amount of electric charge makes it possible to supply a sufficient amount of negative electric charge even if negative voltage Vbb approaches a prescribed level, thereby decreasing negative voltage Vbb at a high speed.

The structure shown in FIG. 2 can be applied to the case where internal high voltage Vpp is generated. More specifically, by generating an internal voltage according to charge pumping operation using external power supply voltage EXV in pump circuit 225, the potential amplitude of an internal node for supplying electric charge can be made sufficiently large. Even when the internal voltage approaches a prescribed level, a sufficient amount of electric charge can be supplied, and the internal voltage at a prescribed level can be generated at a high speed. Description will be given hereinafter of a specific structure of the negative voltage generating circuit and the internal high voltage generating circuit.

[Negative Voltage Generating Circuit 1]

Figure 3:
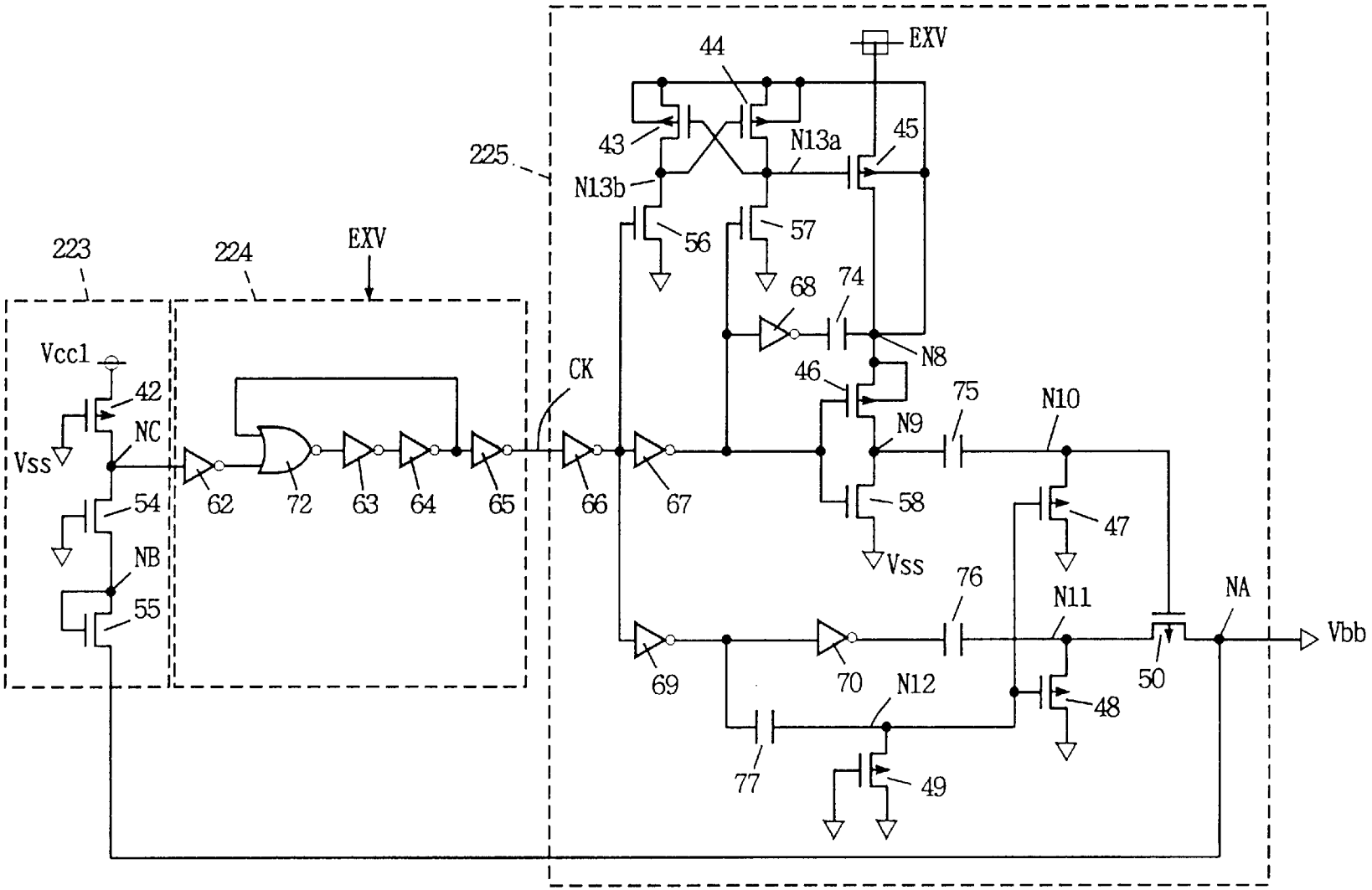
FIG. 3 is a diagram showing a specific structure of the internal voltage generating circuit according to the present invention.

FIG. 3 is a diagram showing a first embodiment of the negative voltage generating circuit according to the present invention. Referring to FIG. 3, the circuit generating negative voltage Vbb includes level detecting circuit 223, pump drive signal generating circuit 224, and pump circuit 225 similar to the structure shown in FIG. 1.

Level detecting circuit 223 includes a diode-connected n channel MOS transistor 55 provided between an output node NA and a node NB of pump circuit 225, an n channel MOS transistor 54 provided between node NB and a node NC and connected to receive ground voltage Vss at its gate, and a p channel MOS transistor 42 provided between an internal power supply node Vcc1 and a node NC1 and receiving ground voltage Vss at its gate. MOS transistor 42 serves as a resistance element, and supplies small current from internal power supply node Vcc1 to node NC. More specifically, MOS transistor 42 serves as a pull up element pulling up the potential of node NC to the internal power supply voltage Vcc1 level.

MOS transistor 55 causes voltage drop of Vthn when rendered conductive. As far as not mentioned otherwise, Vthn denotes a threshold voltage of an n channel MOS transistor, and Vthp denotes a threshold voltage of a p channel MOS transistor. MOS transistor 54 is rendered conductive when the potential of node NB is −Vthn. More specifically, when negative voltage Vbb of output node NA of pump circuit 225 is −2·Vthn or less by MOS transistors 54 and 55, the potential of node NC of level detecting circuit 223 attains the "L" level.

Pump drive signal generating circuit 224 includes an inverter 62 receiving the signal potential on node NC of level detecting circuit 223, an NOR circuit 72 receiving an output signal from inverter 62 at one input, and three stages of cascade-connected inverters 63, 64 and 65 receiving an output signal from NOR circuit 72. An output signal from inverter 64 is applied to the other input of NOR circuit 72. Pump drive clock signal CK is provided form inverter 65. Pump drive signal generating circuit 224 operates with external power supply voltage EXV as one operation power supply voltage. Therefore, in clock signal CK, the "H" level corresponds to the external power supply voltage EXV level, and the "L" level corresponds to the ground voltage Vss level.

The "H" level of node NC of level detecting circuit 223 corresponds to the internal power supply voltage Vcc1 level. Inverter 62 operates with external power supply voltage EXV as operation power supply voltage. In order to prevent through current in inverter 62, inverter 62 is structured as shown in FIG. 4.

Figure 4:
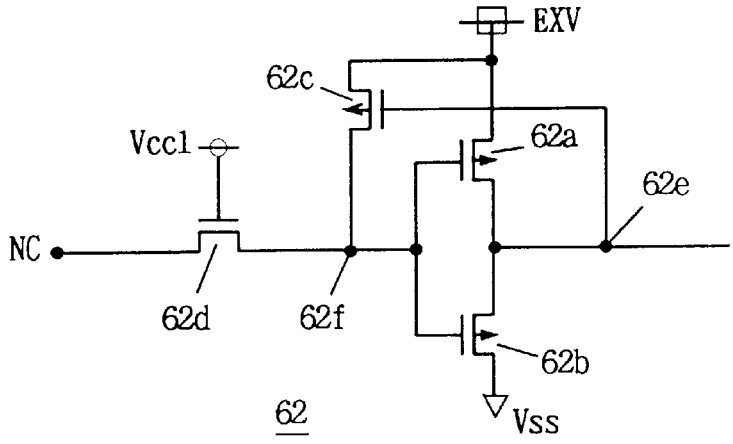
FIG. 4 is a diagram showing the structure of an inverter at the first stage of a pump drive signal generating circuit shown in FIG. 3.

Referring to FIG. 4, inverter 62 includes an n channel MOS transistor 62d provided between node NC and a node 62f and receiving internal power supply voltage Vcc1 at its gate, a p channel MOS transistor 62a provided between external power supply node EXV and a node 62e and receiving the signal potential on node 62f at its gate, an n channel MOS transistor 62b provided between node 62e and ground node Vss and receiving the signal potential on node 62f at its gate, and a p channel MOS transistor 62c provided between external power supply node EXV and node 62f and receiving the potential on node 62e at its gate.

When the potential of node NC is at the internal power supply voltage Vcc1 level, a signal of "H" at the Vcc1−Vthn level is transmitted to node 62f through MOS transistor 62d. In response to the potential of node 62f, MOS transistor 62b is turned on, decreasing the potential of node 62e. The decreased potential of node 62b brings MOS transistor 62c to an on state, supplies current from external power supply node EXV to node 62f, and increases the potential of node 62f. MOS transistors 62b is turned on more strongly, the potential of node 62e attains the ground voltage Vss level, and the potential of node 62f attains the external power supply voltage EXV level by MOS transistor 62c. As a result, MOS transistor 62a is turned off. When the potential of node 62f attains external power supply voltage EXV, MOS transistor 62d is in an off state, and node NC maintains the internal power supply voltage Vcc1 level without the influence of external power supply voltage EXV.

When the potential level of node NC decreases to the "L" level, the potential of node 62f decreases through MOS transistor 62d, and p channel MOS transistor 62a is turned on, thereby increasing the potential level of node 62e.

As a result, MOS transistor 62c transitions to an off state. Finally, MOS transistor 62a is turned on, and MOS transistor 62b is turned off.

As described above, by inverter 62 functioning to convert the level, through current in inverter 62 can be prevented even if the potential level of an output signal from level detecting circuit 223 is at the internal power supply voltage Vcc1 level, thereby implementing low current consumption.

Operation of pump drive signal generating circuit 224 shown in FIG. 3 is the same as that of a conventional circuit. More specifically, when the potential level of node NC of level detecting circuit 223 is at "H", an output from inverter 62 attains the "L" level. NOR circuit 72 functions as an inverter. A ring oscillator is formed by NOR circuit 72 and inverters 63 and 64, and a signal having a prescribed pulse width and a prescribed period is generated. An output signal from inverter 64 is inverted by inverter 65, and clock signal CK is generated.

When the potential level of node NC of level detecting circuit 223 is at "L", an output from inverter 62 attains the "H" level, and an output signal from NOR circuit 72 is fixed at the "L" level. Oscillating operation of the ring oscillator is stopped, and clock signal is fixed at the "H" level.

More specifically, when negative voltage Vbb output from pump circuit 225 attains a prescribed level −2·Vthn or less, pump drive signal generating circuit 224 stops the oscillating operation, maintains clock signal CK at a prescribed level, and stops pumping operation of pump circuit 225.

Pump circuit 225 includes an inverter 66 receiving clock signal CK from pump drive signal generating circuit 224, an inverter 67 receiving an output from inverter 66, two stages of cascade-connected inverters 69 and 70 receiving an output from inverter 66, an inverter 68 receiving an output from inverter 67, a capacitor 74 changing the potential of a node N8 by charge pumping operation in response to an output signal from inverter 68, and a p channel MOS transistor 46 and an n channel MOS transistor 58 operating with the potential on node N8 as one operation power supply voltage and ground voltage Vss as the other power supply voltage and forming an inverter inverting an output signal from inverter 67. The inverter formed of transistors 46 and 58 has an output node N9.

Pump circuit 225 further includes an n channel MOS transistor 56 discharging the potential of a node N13b to the ground potential level in response to an output signal from inverter 66, an n channel MOS transistor 57 discharging the potential of a node N13a to the ground potential level in response to an output signal from inverter 67, a p channel MOS transistor 43 transmitting the signal potential on node N8 onto node N13b in response to the signal potential on node N13a, a p channel MOS transistor 44 transmitting the signal potential on node N8 onto node N13a in response to the signal potential on node N13b, and a p channel MOS transistor 45 transmitting external power supply voltage EXV from external power supply node EXV onto node N8 in response to the signal potential on node N13a. The substrate region (semiconductor substrate or well region) of p channel MOS transistors 43, 44, and 45 is connected to node N8. This is for the potential of node N8 to increase up to the 2·EXV level, to be described later.

Pump circuit 225 further includes a capacitor 75 capacitively coupling node N9 and node N10, a capacitor 77 changing the potential of node N12 by charge pumping operation in response to an output signal from inverter 169, a capacitor 76 changing the potential of node N11 by charge pumping operation in response to an output signal from inverter 70, a diode-connected p channel MOS transistor 49 clamping the signal potential on node N12 to |Vthp|, p channel MOS transistors 47 and 48 discharging the potentials of nodes N10 and N11 to the ground potential Vss level in response to the signal potential on node N12, and a p channel MOS transistor 50 supplying negative electric charge from node N11 to output node NA in response to the signal potential on node N10.

Figure 5:
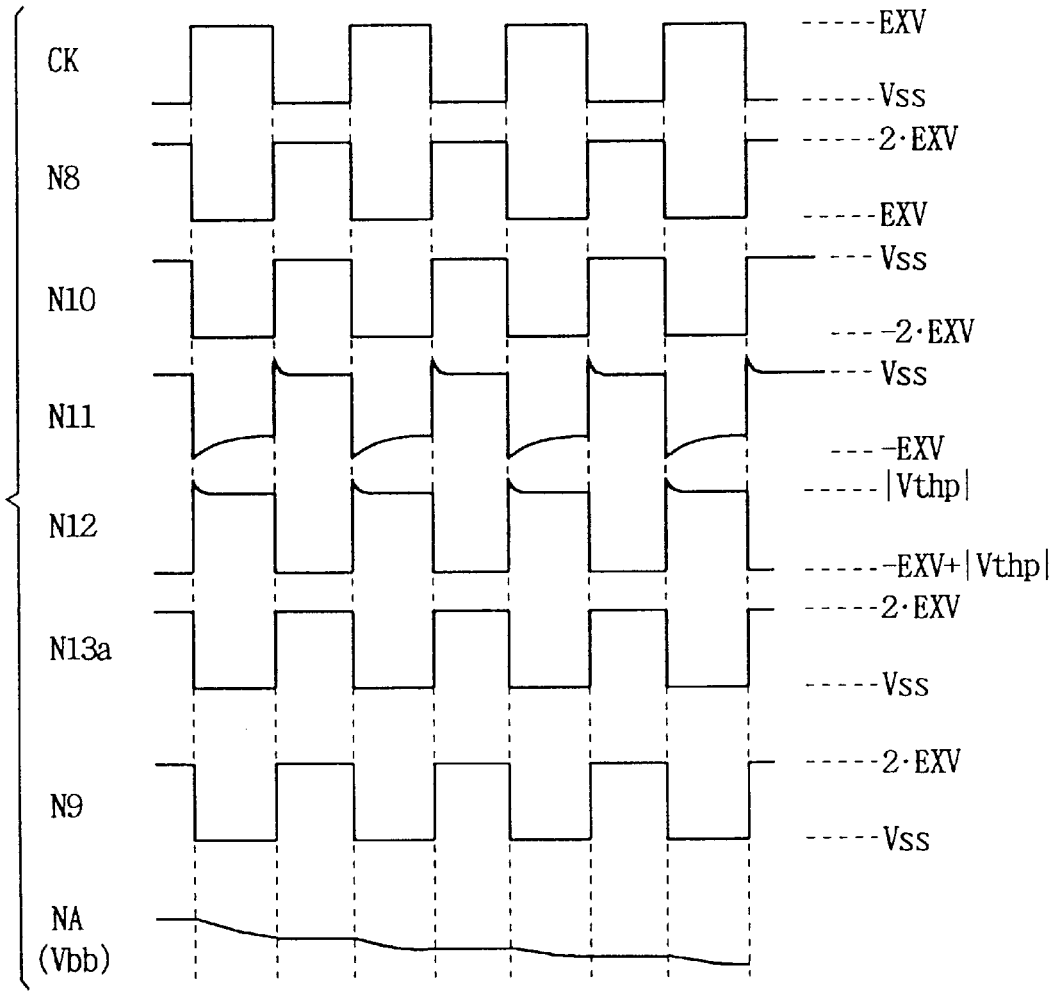
FIG. 5 is a signal waveform diagram showing operation of a negative voltage generating circuit shown in FIG. 3.

Inverters 66–70 included in pump circuit 225 operate with external power supply voltage EXV as one operation power supply voltage, and with ground voltage Vss as the other operation power supply voltage. Description will now be given of operation of the pump circuit shown in FIG. 3 with reference to FIG. 5, which is its operation waveform diagram.

When clock signal CK from pump drive signal generating circuit 224 rises to the "H" level, an output form inverter 66 falls to the "L" level, and output signals from inverters 67 and 69 rise to the "H" level. MOS transistor 57 is rendered conductive in response to an output signal from inverter 67, and discharges node N13a to the ground potential Vss level. Accordingly, MOS transistor 45 is turned on, and charges node N8 to the external power supply voltage EXV level.

On the other hand, an output signal from inverter 69 attains the "H" level, and the potential of node N12 is increased by charge pumping operation (capacitive coupling) of capacitor 77. However, the potential of node N12 is clamped to |Vthp| by MOS transistor 49. On the other hand, an output signal from inverter 70 falls to the "L" level, and the potential of node N11 is decreased by charge pumping operation of capacitor 76. At the time, MOS transistor 48 receives a voltage of the absolute value |Vthp| of the threshold voltage at its gate to be turned off, and the potential of node N11 attains −EXV.

Similarly, when an output signal from inverter 67 attains the "H" level, MOS transistor 58 is turned on, and the potential of node N9 decreases to the ground potential Vss level. Accordingly, the potential of node N10 is decreased by charge pumping operation. At the time, MOS transistor 47 is in an off state similar to MOS transistor 48. The potential of node N10 attains −2·EXV, to be described later. As a result, MOS transistor 50 is turned on, negative electric charge (electrons) flows out from node N11 to node NA, and voltage Vbb of node NA decreases while the potential on node N11 increases. When the potentials of nodes N11 and NA become equal, MOS transistor 50 is turned off. At the time, MOS transistor 57 is turned on in response to an output signal from inverter 67, and node N13a is discharged to the ground voltage Vss level. Accordingly, MOS transistor 45 is turned on, and node N8 is charged to EXV.

When clock signal CK falls to the "L" level, an output signal from inverter 66 rises to the "H" level. In response to this, MOS transistor 56 is turned on, node N13b is discharged to the ground potential level, MOS transistor 44 is turned on, and the potential on node N8 is transmitted onto node N13a. At the time, an output signal from inverter 67 is at "L", and MOS transistor 57 is turned off. Since an output signal from inverter 68 rises to the "H" level, the potential of node N8 which has been precharged to external power supply voltage EXV increases to 2·EXV by charge pumping operation of capacitor 74. As a result, MOS transistor 45 is turned off.

An output signal from inverter 67 attains the "L" level, causing MOS transistor 46 to be turned on, MOS transistor 58 to be turned off, and node N9 to be supplied with electric charge from node N8 to increase up to the voltage level of 2·EXV. In response to the rising of the potential of node N9, the potential of node N10 increases by charge pumping operation of capacitor 75. At the time, an output signal from inverter 69 falls to the "L" level, causing the potential of node N12 to be decreased to the potential level of −EXV+|Vthp| by charge pumping operation of capacitor 74, both MOS transistors 47 and 48 to be turned on, and nodes N10 and N11 to be charged to the ground voltage Vss level. As a result, MOS transistor 50 is turned off.

The potential of node N8 changes between 2·EXV and EXV, and the potential of node N9 changes between 2·EXV and Vss. More specifically, the amplitude is 2·EXV. Therefore, node N10 changes between Vss and −2·EXV by charge pumping operation of capacitor 75. The potential of node N11 changes between Vss and −EXV. Therefore, pump circuit 225 can decrease negative voltage Vbb down to the voltage level of −EXV. In response to negative voltage Vbb attaining −2·Vthn at a prescribed level, level detecting circuit 223 fixes the level of clock signal CK, thereby stopping pumping operation of pump circuit 225.

By changing the voltage of node N8 between EXV and 2·EXV, the potential amplitude of node N9 can be set to 2·EXV. This enables the potential amplitude of node N10 by capacitive coupling of capacitor 75 to be 2·EXV, and the lowest potential which negative voltage Vbb of an output from pump circuit 225 attains to be −EXV. Therefore, even if internal power supply voltage Vcc1 is decreased in order to make power consumption lower, and if negative voltage Vbb approaches a prescribed voltage level −2·Vthn, a sufficient amount of negative electric charge can be supplied to output node NA because there is a sufficiently big difference between −EXV and −2·Vthn, making it possible to implement a negative voltage generating circuit with high efficiency.

Stable power supply voltage Vcc1 is supplied to level detecting circuit 223, so that change in external data EXV causes no variation of the potential level of node NC. Therefore, a prescribed voltage level −2·Vthn can be detected precisely.

In pump drive signal generating circuit 224 shown in FIG. 3, external power supply voltage EXV is applied. Alternatively, internal power supply voltage Vcc1 may be supplied to pump drive signal generating circuit 224 as one operation power supply voltage. In this case, inverter 66 in an input portion of pump circuit 225 has only to be structured as shown in FIG. 4.

[Negative Voltage Generating Circuit 2]

Figure 6:
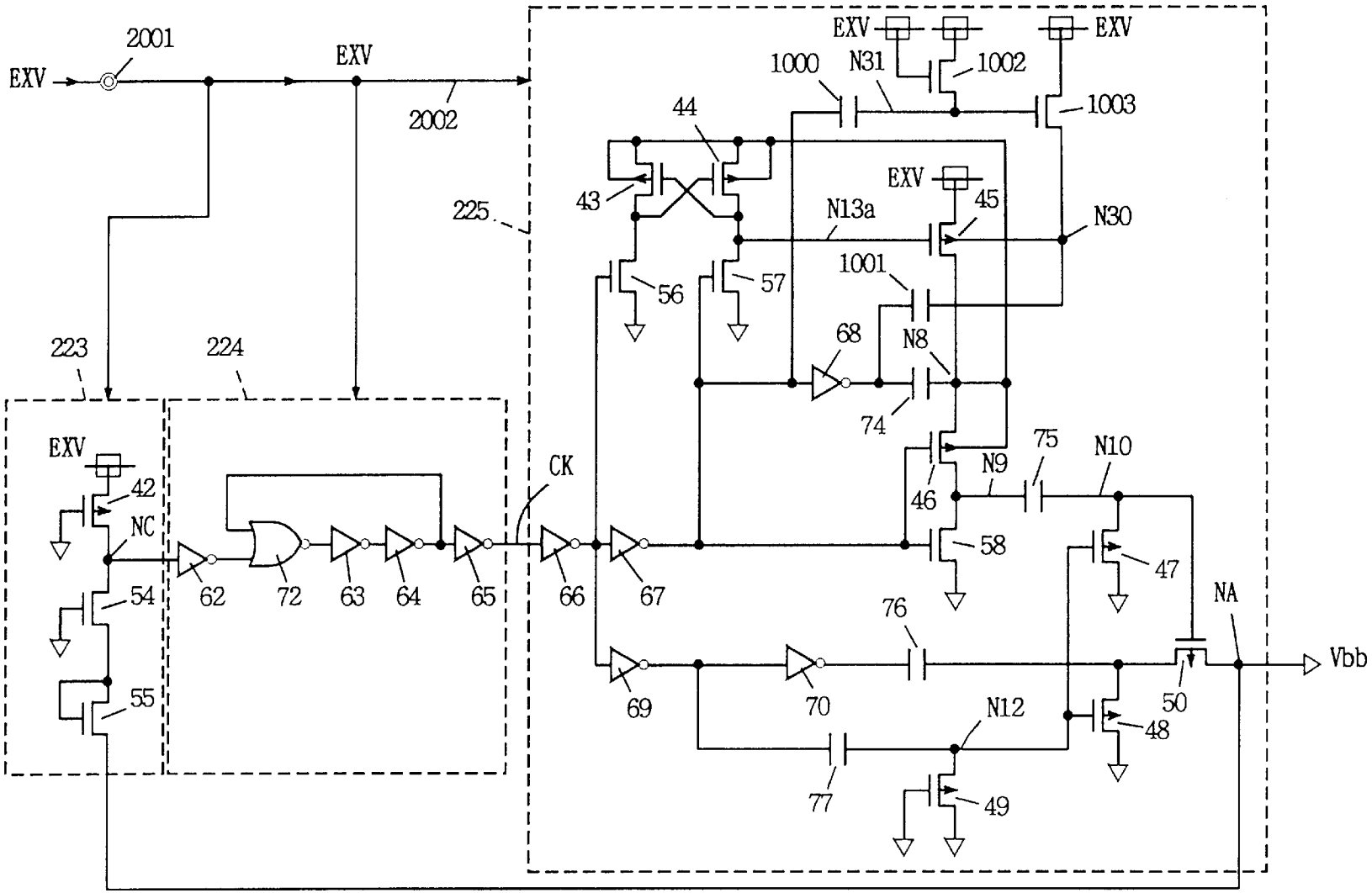
FIG. 6 is a diagram showing another structure of the negative voltage generating circuit according to the present invention.

FIG. 6 is a diagram showing a structure of a second embodiment of the negative voltage generating circuit according to the present invention. The negative voltage generating circuit shown in FIG. 6 is different from that shown in FIG. 3 in that external power supply voltage EXV is applied to level detecting circuit 223. By applying external power supply voltage EXV to level detecting circuit 223, an interconnection line for supplying internal power supply voltage Vcc1 is unnecessitated, thereby simplifying the layout. More specifically, by transmitting power supply voltage EXV externally applied to a power supply pad 2001 to level detecting circuit 223, pump drive signal generating circuit 224, and pump circuit 225 through an external power supply line 2002, only external power supply line 2002 is required as a power supply line for transmitting operation power supply voltage of these circuits, simplifying the power supply line layout.

The structure of pump drive signal generating circuit 224 is similar to that shown in FIG. 6, and the same or corresponding portions are labeled with the same reference characters. Similarly, the structure of level detecting circuit 223 is similar to that shown in FIG. 3 and the same or corresponding portions are labeled with the same reference characters. In addition to the structure shown in FIG. 3, pump circuit 225 further includes an n channel MOS transistor 1002 connected between external power supply node EXV and a node N31 and receiving external power supply voltage EXV at its gate, a capacitor 1000 changing the potential of node N31 by charge pumping operation in response to an output signal from inverter 67, an n channel MOS transistor 1003 transmitting external power supply voltage EXV to a node N30 in response to the signal potential on node N31, and a capacitor 1001 changing the potential of node N30 by charge pumping operation in response to an output signal from inverter 68.

The substrate region of p channel MOS transistor 45 for precharging node N8 is connected to node N30. Other than that, the structure of pump circuit 225 is similar to that shown in FIG. 3, and the same or corresponding portions are labeled with the same reference characters. Description will now be given of operation of an additional portion of pump circuit 225 shown in FIG. 6 with reference to FIG. 7, which is its operation waveform diagram.

When clock signal CK from pump drive signal generating circuit 224 rises to the "H" level, the potential of node N8 attains the external power supply voltage EXV level, and the potential of node N13a attains the ground potential Vss level. At the time, the potential of node N31 which has been clamped to EXV−Vthn by MOS transistor 1002 attains the 2·EXV−Vthn level by charge pumping operation of capacitor 1000. This causes MOS transistor 1003 to be turned on, and node N30 to attain the external power supply voltage EXV level. At the time, an output signal from inverter 68 falls to the "L" level, and charge pumping operation is carried out by capacitor 1001. However, the potential of node N30 is maintained at the external power supply voltage EXV level by charging operation of MOS transistor 1003.

When clock signal CK falls to the "L" level, as described above, the potential of node N8 attains 2·EXV by charge pumping operation of capacitor 74, and the potential of node N13a also attains 2·EXV through MOS transistor 44. Node N31 is cramped to EXV−Vthn by MOS transistor 1002, and MOS transistor 1003 is turned off. Therefore, an output signal from inverter 68 rises to the "H" level, causing node N30 to be boosted to a voltage level of 2·EXV from EXV of a precharge level by charge pumping operation of capacitor 1001.

The structure newly added in FIG. 6 does not affect the voltage level itself of negative voltage Vbb generated by pump circuit 225. Pump circuit 225 generates negative voltage Vbb with a sufficient margin similar to the structure shown in FIG. 3. The advantages of the structure shown in FIG. 6 will now be described.

Figure 8:
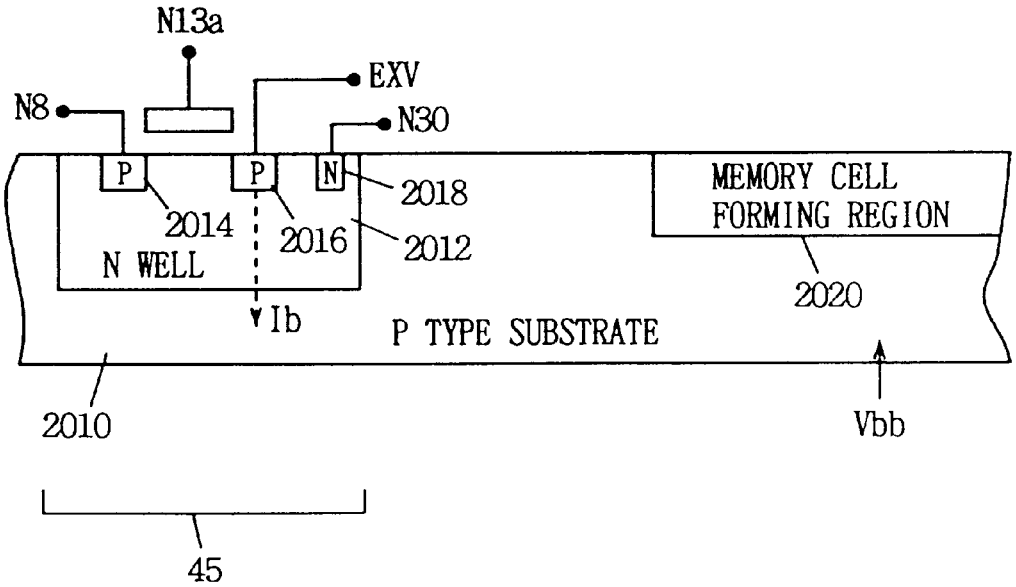
FIG. 8 is a diagram showing a sectional structure of a precharge MOS transistor shown in FIG. 6, and explaining the effect brought about by the negative voltage generating circuit shown in FIG. 6.

FIG. 8 is a diagram showing a schematic sectional structure of p channel MOS transistor 45 shown in FIG. 6. MOS transistor 45 is formed in an N type well 2012 formed on the surface of a P type semiconductor substrate 2010 to which negative voltage Vb is applied as a bias voltage. MOS transistor 45 includes p type impurity regions 2014 and 2016 spaced in the surface of N type well 2012, and an N type impurity region 2018 serving as a region for leading out a substrate electrode. P type impurity region 2014 is connected to node N8, P type impurity region 2016 is connected to external power supply node EXV, and N type impurity region 2018 for leading out an electrode is connected to node N30.

Figure 7:
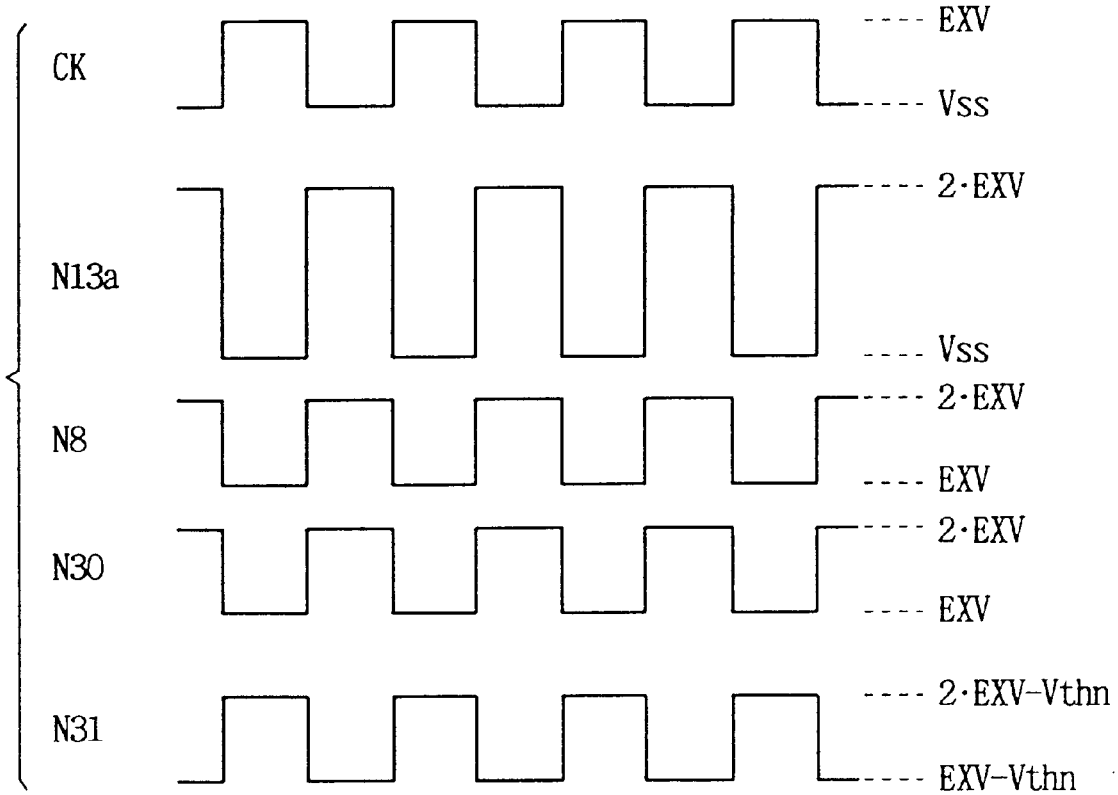
FIG. 7 is a signal waveform diagram showing operation of the negative voltage generating circuit shown in FIG. 6.

As is clear from the waveform diagram shown in FIG. 7, the potential of node N8 changes between voltages EXV and 2·EXV. The voltage of node N30, that is, N well 2012 changes between EXV and 2·EXV. The potential of node N30, that is, the voltage of N well 2012 is never lower than the voltage levels of P type impurity regions 2014 and 2016. More specifically, PN junctions formed between P type impurity regions 2014 and 2016, and N type well 2012 are never biased in the forward direction. Therefore, a parasitic bipolar transistor having P type impurity regions 2014 and 2016 as its collector, N type well 2012 as its base, and P type semiconductor substrate 2010 as its emitter always maintains an off state. As a result, generation of leakage current Ib flowing in P type semiconductor substrate 2010 from P type impurity regions 2014 and 2016 can be prevented.

More specifically, leakage current Ib flows in P type semiconductor substrate 2010, causing the voltage level of negative voltage Vbb applying a substrate bias to be increased. The pump circuit must supply negative electric charge which compensates for positive electric charge injected by leakage current Ib. Accordingly, the operation period of the pump circuit becomes longer, increasing current consumption. Therefore, by suppressing generation of substrate leakage current Ib with the structure shown in FIG. 6, negative electric charge is not consumed wastefully (the pump circuit itself never consumes generated electric charge), resulting in generation of negative voltage Vbb with low current consumption.

Note that, in the above embodiment, a memory cell forming region 2020 is provided in the surface of P type semiconductor substrate 2010. When a so-called "triple well structure" is used in which transistor 45 is not formed in the same P type semiconductor substrate surface as memory cell forming region 2020, the P type semiconductor substrate region of memory cell forming region 2020 and the substrate region in which transistor 45 is formed are isolated from each other, and ground voltage Vss is applied to the semiconductor substrate region, low power consumption can be implemented even in the pump circuit shown in FIG. 3.

[Negative Voltage Generating Circuit 3]

Figure 9:
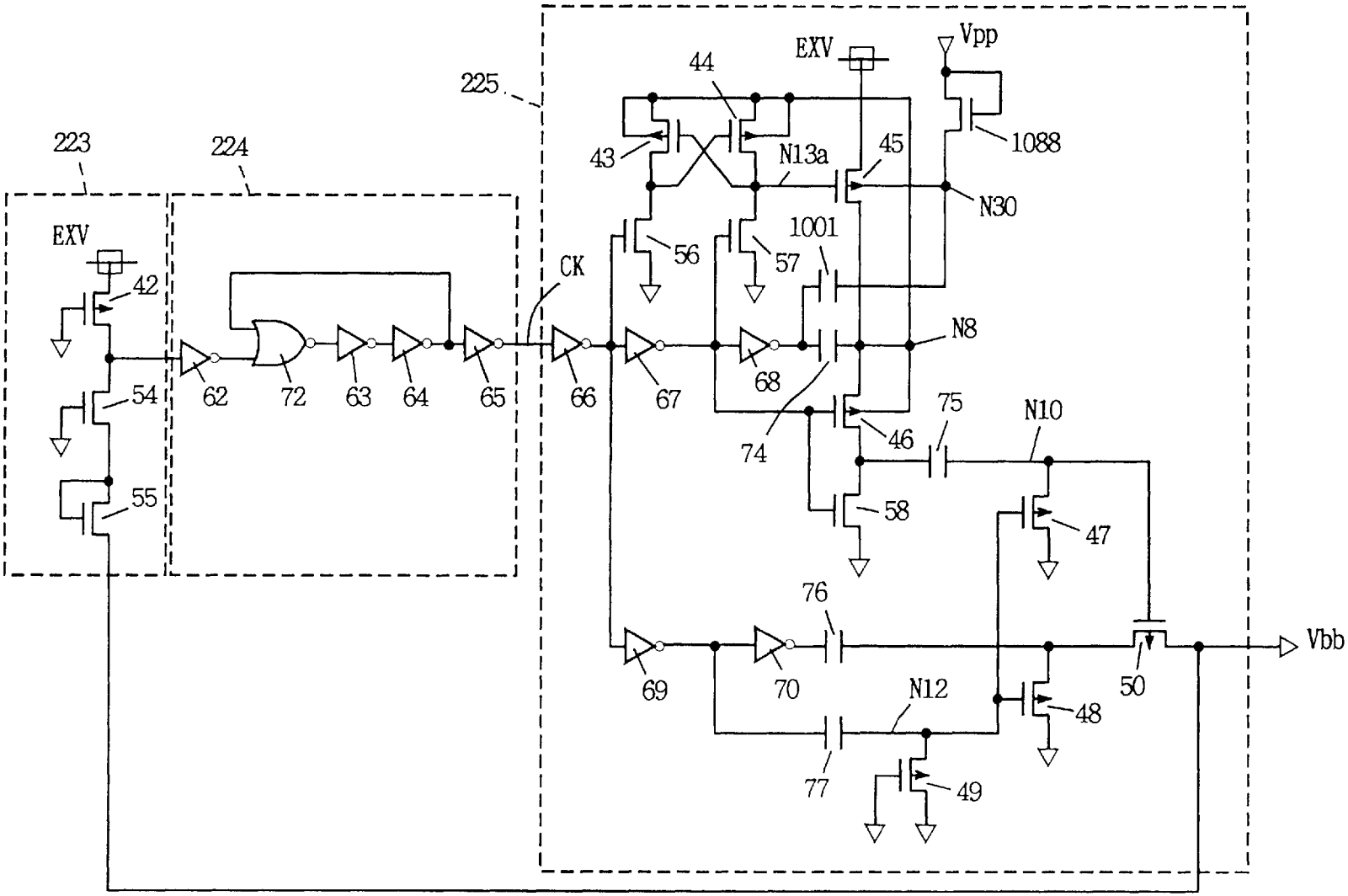
FIG. 9 is a diagram showing still another structure of the negative voltage generating circuit according to the present invention.

FIG. 9 is a diagram showing a third embodiment of the negative voltage generating circuit according to the present invention. The structure shown in FIG. 9 is different from the structure shown in FIG. 6 in that, in pump circuit 225, node N30 connected to the substrate region (backgate) of MOS transistor 45 receives internal high voltage Vpp through a diode-connected n channel MOS transistor 1088 (or a junction diode formed of a P type diffusion layer and an n well).

Figure 10:
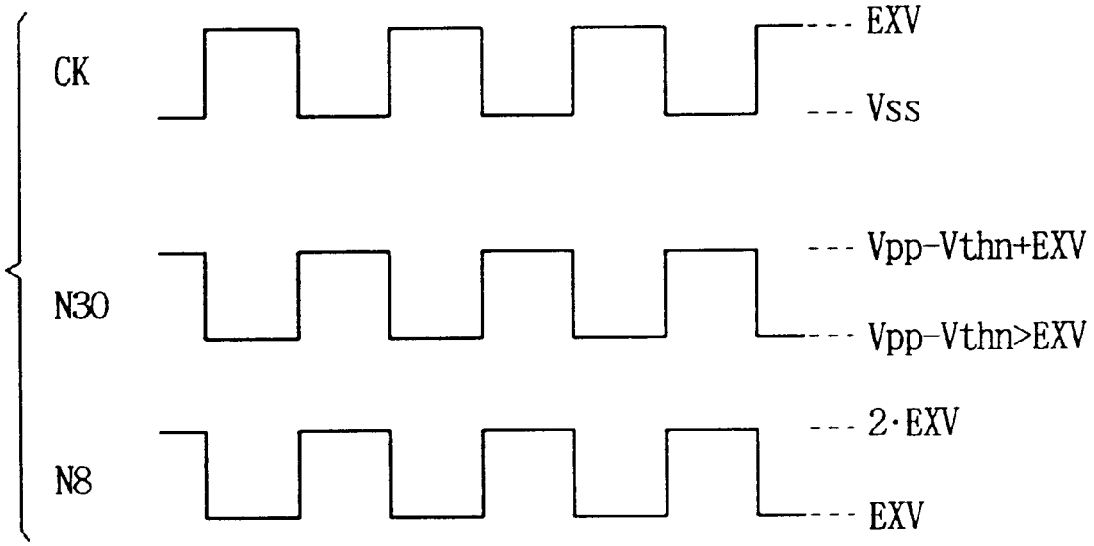
FIG. 10 is a signal waveform diagram for explaining the operation and effect of the negative voltage generating circuit shown in FIG. 9.

In the structure shown in FIG. 9, capacitor 1000, and MOS transistors 1002 and 1003 shown in FIG. 6 are not provided. The number of components included in pump circuit 225 can be reduced, and an area occupied by the device can be reduced accordingly. Other than that, the structure shown in FIG. 9 is the same as that shown in FIG. 6, and the same or corresponding portions are labeled with the same reference characters. Operation of generating negative voltage Vbb is approximately the same as that of the Vbb generating circuit shown in FIG. 3. Description will be given only of the difference with reference to the operation waveform diagram shown in FIG. 10.

When clock signal CK rises to "H" at the external power supply voltage EXV level, node N8 is charged by MOS transistor 45 to the voltage level of external power supply voltage EXV, similar to the case of FIGS. 3 and 6. As to node N30, an output signal from inverter 68 falls to the "L" level, and the potential of node N30 is decreased by charge pumping operation of capacitor 1001. However, MOS transistor 1008 is turned on at the time, thereby clamping the potential of node N30 to Vpp−Vthn.

Clock signal CK falls to the "L" level, causing an output signal from inverter 68 to rise to the "H" level, and the potential of node N30 to increase up to the voltage level of Vpp−Vthn+EXV by charge pumping operation of capacitor 1001. At the time, MOS transistor 1008 is brought to a reverse bias state, and turned off. Further, the potential of node N8 is boosted up to the voltage level of 2·EXV by charge pumping operation of capacitor 74. The potential is increased by voltage EXV by the charge pumping operation, because inverter 68 operates with external power supply voltage EXV as its operation power supply voltage, and because the "H" level of the output signal corresponds to the external power supply voltage EXV level. Even in the structure in which internal high voltage Vpp is transmitted through node N30 and MOS transistor 1088, generation of substrate leakage current in MOS transistor 45 can be prevented as will be described hereinafter.

More specifically, referring to the sectional structure shown in FIG. 8, when the potential of node N8 attains the voltage level of external power supply voltage EXV, the voltage level of node N30, that is, N well 2012 is Vpp−Vthn. At the time, as will be clear from description of the internal high voltage generating circuit later, if Vpp−Vthn>EXV, a PN junction between P type impurity regions 2014 and 2016, and N well 2012 is brought to a reverse bias state.

When the voltage of node N8 increases to 2·EXV, the voltages at nodes N8 and N30 change in the same phase, and the voltage of node N30 is Vpp−Vthn+EXV. Therefore, the voltage level of N well 2012 is higher than that of P type impurity region 2014 even in this case. Accordingly, irrespective of the voltage level of node N8, a PN junction between N well 2012, and p type impurity regions 2014 and 2016 is always brought to a reverse bias state. As a result, a parasitic bipolar transistor formed of P type impurity regions 2014 and 2016, N well 2012, and P type semiconductor substrate 2010 is always turned off, and generation of substrate leakage current Ib is inhibited. As a result, the structure shown in FIG. 9 can generate negative voltage Vbb with low current consumption similar to the structure shown in FIG. 6.

As described above, according to the structure of the negative voltage generating circuit of the present invention, negative voltage Vbb is generated from external power supply voltage EXV by charge pumping operation. Therefore, even if negative voltage Vbb approaches a prescribed voltage level, a sufficient amount of negative electric charge can be supplied, making it possible to generate negative voltage Vbb stably at a high speed.

Note that an arbitrary circuit configuration may be used as a circuit generating internal high voltage Vpp, as far as the circuit can generate internal high voltage Vpp which satisfies the condition of Vpp−Vthn>EXV. An internal high voltage generating circuit to be described below may be used. An internal high voltage generating circuit can be theoretically implemented by reversing conductivity types and power supply voltage polarities of the transistors of the negative voltage generating circuit described above. Structures will be described hereinafter which can generate an internal high voltage more efficiently with low power consumption.

[Internal High Voltage Generating Circuit 1]

Figure 11:
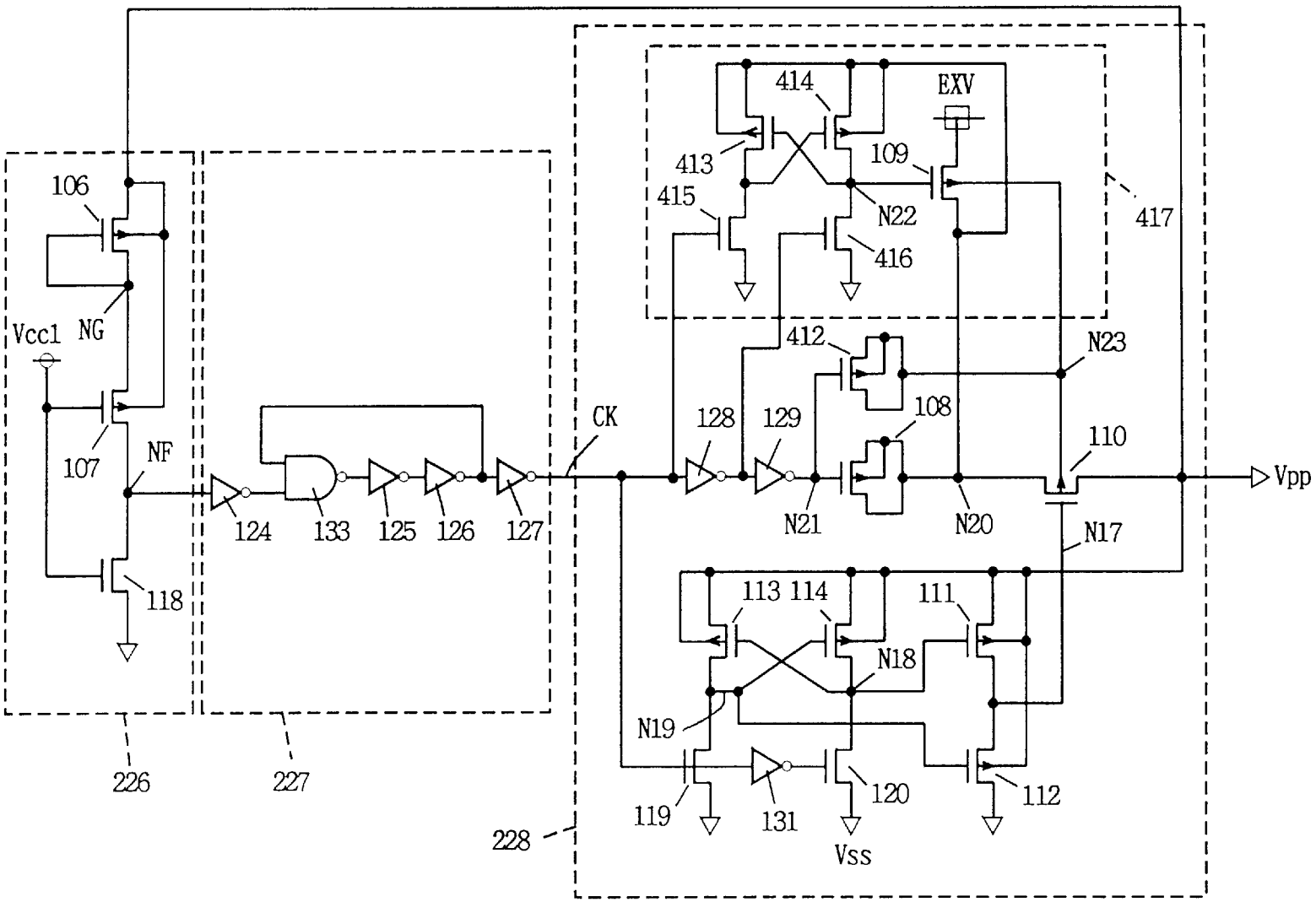
FIG. 11 is a diagram showing the structure of an internal high voltage generating circuit according to the present invention.

FIG. 11 is a diagram showing a structure of a first embodiment of the internal high voltage generating circuit according to the present invention. Referring to FIG. 11, the internal high voltage generating circuit includes a pump circuit 228 carrying out charge pumping operation to generate a prescribed internal high voltage Vpp from external power supply voltage EXV, a pump drive signal generating circuit 227 generating clock signal CK causing pump circuit 228 to carry out charge pumping operation, and a level detecting circuit 226 detecting the level of internal high voltage Vpp generated by pump circuit 228 and stopping clock signal generating operation of pump drive signal generating circuit 227 according to the detection result.

Level detecting circuit 226 includes a diode-connected p channel MOS transistor 106 decreasing internal high voltage Vpp by the absolute value |Vthp| of the threshold voltage when rendered conductive to transmit the decreased voltage to a node NG, a p channel MOS transistor 107 provided between node NG and a node NF and receiving internal power supply voltage Vcc1 at its gate, and an n channel MOS transistor 118 connected between node NF and a ground node Vss and receiving internal power supply voltage Vcc1 at its gate to operate as a resistance element. Internal high voltage Vpp is applied to the substrate region (backgate) of MOS transistors 106 and 107. MOS transistor 107 is rendered conductive when the voltage of node NG attains Vcc1+|Vthp|, and increases the voltage level of node NF. When internal high voltage Vpp is Vcc1+|Vthp| or less, MOS transistors 106 and 107 are turned off, and node NF is held at ground voltage Vss by MOS transistor 118. The current drivability of MOS transistor 118 is set sufficiently small, and a current flow in level detecting circuit 226 is set to a sufficiently small value.

Pump drive signal generating circuit 227 includes an inverter 124 receiving the signal potential of node NF of level detecting circuit 226, an NAND circuit 133 receiving an output signal from inverter 124 at one input, and three stages of cascade-connected inverters 125, 126 and 127 receiving an output signal from NAND circuit 133. Clock signal CK for charge pumping operation is provided from inverter 127. An output signal from inverter 126 is applied to the other input of NAND circuit 133. Pump drive signal generating circuit 227 may operate with external power supply voltage EXV as operation power supply voltage, or with internal power supply voltage Vcc1 as operation power supply voltage. The "H" level of node NF of level detecting circuit 226 corresponds to the internal power supply voltage Vcc1 level. According to operation power supply voltage (external power supply voltage or internal power supply voltage) used by pump drive signal generating circuit 227, a level converting element is provided at the input stage or output stage (cf. FIG. 4). Operation of pump drive signal generating circuit 227 is as follows.

When a signal at the "L" level is provided from node NF of level detecting circuit 226, an output signal from inverter 124 attains the "H" level. In this case, NAND circuit 133 operates as an inverter, NAND circuit 133 and inverters 125 and 126 form a ring oscillator, and clock signal CK having a prescribed pulse width and a prescribed period is provided from inverter 127.

When the potential of node NF of level detecting circuit 226 is at the "H" level, an output signal from inverter 124 attains the "L" level. In this state, an output signal from NAND circuit 133 is fixed to the "H" level, causing the ring oscillator formed of NAND circuit 133 and inverters 125 and 126 to stop its oscillation operation, and clock signal CK provided from inverter 127 to be fixed to the "H" level. Pump circuit 228 carries out charge pumping operation in response to the clock signal CK, to be described in detail hereinafter. Therefore, when internal high voltage Vpp is Vcc1+2|Vthp| or more, charge pumping operation of pump circuit 228 is stopped. Accordingly, internal high voltage Vpp at the Vcc1+2|Vthp| level is generated.

Pump circuit 228 includes two states of cascade-connected inverters 128 and 129 receiving clock signal CK from pump drive signal generating circuit 227, an MOS capacitor 108 carrying out charge pumping operation according to an output signal from inverter 129 and changing the potential of a node N20, a p channel MOS transistor 110 generating internal high voltage Vpp by discharging positive electric charge stored in node N20, and an MOS capacitor 412 carrying out charge pumping operation in response to an output signal from inverter 129 and changing the potential of a node N23.

MOS capacitors 108 and 412 are each formed of a p channel MOS transistor, having its substrate region (backgate) connected to the source/drain region, and receiving an output signal from inverter 129 at its gate. Node N23 is connected to the substrate region (backgate) of MOS transistor 110.

Pump circuit 228 further includes an n channel MOS transistor 119 rendered conductive in response to clock signal CK for discharging a node N19 to ground potential Vss, an inverter 131 inverting clock signal CK, an n channel MOS transistor 120 rendered conductive in response to an output signal from inverter 131 for discharging a node N18 to the ground voltage Vss level, a p channel MOS transistor 112 rendered conductive in response to the signal potential on node N19 for discharging the gate of MOS transistor N17 to the ground potential level, a p channel MOS transistor 111 rendered conductive in response to the signal potential on node N18 for transmitting internal high voltage Vpp to the gate of MOS transistor 110, a p channel MOS transistor 114 rendered conductive in response to the signal potential on node N19 for transmitting internal high voltage Vpp to node N18, and a p channel MOS transistor 113 rendered conductive in response to the signal potential on node N18 for transmitting internal high voltage Vpp to node N19. Internal high voltage Vpp is transmitted to the substrate region (backgate) of MOS transistors 111–114.

Pump circuit 228 further includes a precharge circuit 417 for precharging node N20 to the external power supply voltage EXV level. Precharge circuit 417 includes p channel MOS transistors 413 and 414 having their gates and drains cross-coupled and transmitting the voltage on node N20 when rendered conductive, respectively, an n channel MOS transistor 415 discharging the gate of MOS transistor 414 to the ground potential level in response to clock signal CK, an n channel MOS transistor 416 rendered conductive in response to an output signal from inverter 128 for discharging the gate of MOS transistor 413 to the ground potential level through a node N22, and a p channel MOS transistor 109 rendered conductive in response to the signal potential on node N22 for transmitting the external power supply voltage EXV to node N20.

The substrate region (backgate) of MOS transistor 109 is connected to a node N23. The reason why MOS capacitors 108 and 412 are each formed of a p channel MOS transistor and have its substrate region (backgate) connected to the source and drain, and the reason why node N23 is connected to the substrate region (backgate) of MOS transistors 109 and 110 will be described in detail hereinafter. Inverters 128, 129, and 131 included in pump circuit 228 operate with external power supply voltage EXV as one operation power supply voltage, each providing an output signal having an amplitude of external power supply voltage EXV. Operation of pump circuit 228 will now be described with reference to the operation waveform diagram shown in FIG. 12.

When clock signal CK is at the "L" level, output signals from inverters 128 and 131 attain the "H" level, MOS transistors 120 and 416 are turned on, and MOS transistors 119 and 415 are turned off. At the time, node N22 is discharged to the ground voltage level, MOS transistor 109 is turned on, and node N20 is charged to external power supply voltage EXV level. The signal potential on node N20 is transmitted to the gate of MOS transistor 414 through MOS transistor 413, bringing MOS transistor 414 to an off state.

On the other hand, the on state of MOS transistor 120 causes node N18 to be discharged to the ground voltage Vss level, MOS transistors 111 and 113 to be turned on, nodes N17 and N19 to attain the internal high voltage Vpp level, and both MOS transistors 114 and 112 to be turned off. MOS transistor 110 is turned off since the potential of node N17 is at the internal high voltage Vpp level. The voltage of node N23 attains at least the Vpp−VBE level, as will be described in detail later. Here, VBE denotes the threshold voltage of a PN junction formed by the impurity region and the substrate region (backgate) of MOS transistor 110.

When clock signal CK rises to the "H" level, output signals from inverters 129 and 131 attain the "L" level, MOS transistors 119 and 415 are turned on, and MOS transistors 416 and 120 are turned off. Accordingly, MOS transistor 414 is turned on, thereby transmitting the voltage on node N20 to node N22 and bringing MOS transistor 109 to an off state. In response to the rising of an output signal from inverter 129 to the "H" level, MOS capacitor 108 increases the voltage of node N20 which was precharged to the level of external power supply voltage EXV up to 2·EXV. Further, MOS capacitor 412 increases the potential of node N23 up to the voltage level of EXV+Vpp−VBE.

On the other hand, the potential of node N19 attains the ground voltage Vss level, and MOS transistor 112 is turned on, thereby clamping the potential of node N17 to the |Vthp| level. At the time, MOS transistor 114 is turned on, node N18 attains the internal high voltage Vpp level, and MOS transistors 111 and 113 are in an off state.

Since the gate potential of MOS transistor 110 (the potential of node N17) is |Vthp|, and the potential of node N20 is 2·EXV, MOS transistor 110 is turned on, causing the stored positive electric charge to flow out and increasing the voltage level of internal high voltage Vpp. Since the gate voltage of MOS transistor 110 is |Vthp|, internal high voltage Vpp can be increased to 2·EXV−|Vthp| at maximum. The speed at which internal high voltage Vpp increases during one cycle of clock signal CK is determined by the charge potential of node N20. The load capacitance associated with the output node (Vpp output node) of pump circuit 228 is charged from node N20 to increase internal high voltage Vpp. Therefore, the speed is determined by the difference between the charge potential of the load capacitance and that of node N20.

Internal high voltage Vpp is generated using external power supply voltage EXV. Even if the voltage level of internal high voltage Vpp approaches a target voltage level of Vcc1+2 |Vthp|, the difference between the target voltage level and the voltage level of 2·EXV−|Vthp| is sufficient, enabling a sufficient amount of positive electric charge to flow out through MOS transistor 110 during one clock cycle. Therefore, internal high voltage Vpp can be generated without the influence of internal power supply voltage Vcc1 reduced to implement low power consumption, making it possible to generate internal high voltage stably at high efficiency. The reason will now be described why the voltage of node N23 is applied to the substrate region (backgate) of MOS transistor 109 for precharge and MOS transistor 110 for output.

Figure 13:
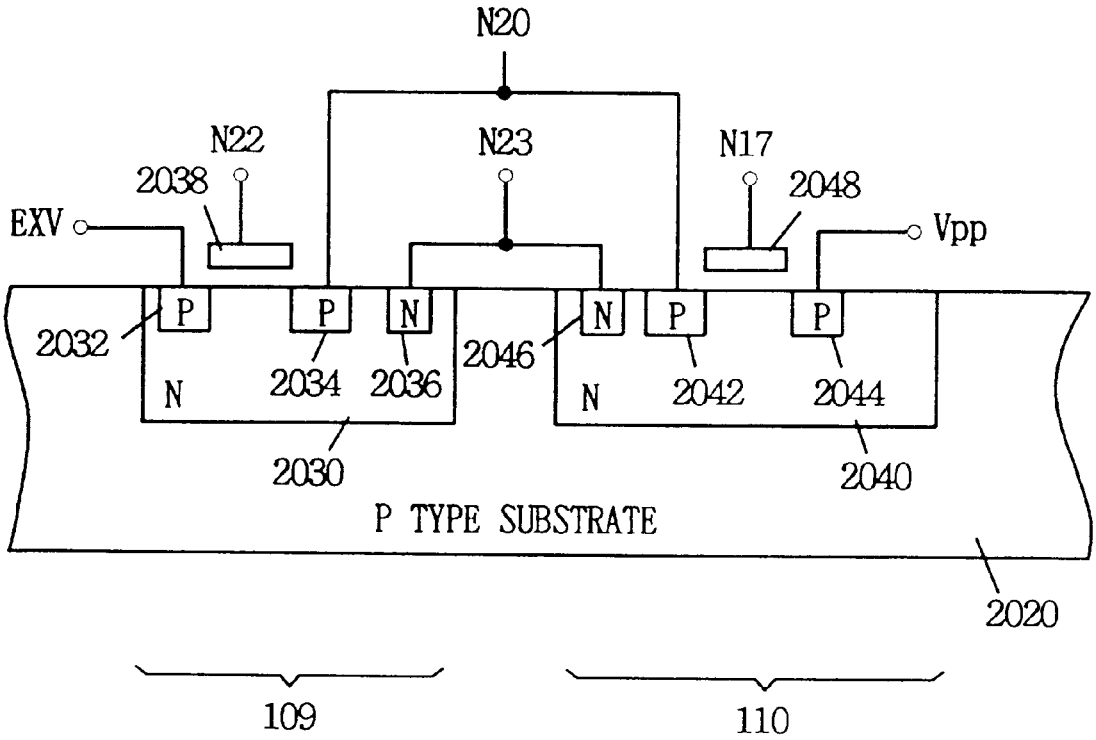
FIG. 13 is a diagram showing a sectional structure of a precharge MOS transistor and an output MOS transistor shown in FIG. 11.

FIG. 13 schematically shows a sectional structure of MOS transistors 109 and 110 shown in FIG. 11. As shown in FIG. 13, MOS transistors 109 and 110 are formed on N wells 2030 and 2040 formed in the surface of P type semiconductor substrate 2020. MOS transistor 109 includes P type impurity regions 2032 and 2034 formed in the surface of N well 2030, an N type impurity layer 2036 for leading out an electrode through which a substrate voltage is applied to N well 2030, and a gate electrode 2038. P type impurity region 2032 is connected to external power supply node EXV, gate electrode 2038 is connected to node N22, and P type impurity region 2034 is connected to node N20. N type impurity region 2036 is connected to node N23.

MOS transistor 110 includes P type impurity regions 2042 and 2044 formed in the surface of N well 2040, a gate electrode 2048 formed on P type impurity regions 2042 and 2044, and an N type impurity region 2046 for applying the substrate voltage to N well 2040. N type impurity region 2046 is connected to node N23, P type impurity region 2042 is connected to node N20, and P type impurity region 2044 is connected to a node providing internal high voltage Vpp. A prescribed bias voltage (negative voltage or ground voltage) is applied to P type semiconductor substrate 2020.

When clock signal CK is at the "L" level, the potential of node N20 is at the external power supply voltage EXV level, and the voltage of P type impurity region 2042 is also at the external power supply voltage EXV level. The voltage level of P type impurity region 2044 is at the internal high voltage Vpp level. Therefore, at the time, the voltage level of N well 2040 attains at least the Vpp−VBE level, and this voltage is transmitted to node N23 through N type impurity region 2046. Here, VBE is forward voltage drop of a PN junction formed by P type impurity region 2044 and N well 2040. When clock signal CK is at the "H" level, node N20 is boosted to the voltage level of 2·EXV by MOS capacitor 108. At the time, the voltage of node N17 is |Vthp|, MOS transistor 110 is turned on, and the potential of node N20 becomes higher than internal high voltage Vpp temporarily (when MOS transistor 110 is rendered conductive, node N20 is discharged to attain the same voltage level as internal high voltage Vpp). At the time, the voltage level of node N23 is boosted by MOS capacitor 412 to attain the voltage level of EXV+Vpp−VBE.

Therefore, a PN diode formed by P type impurity region 2042 and N well 2040 always maintains a reverse bias state. Therefore, a parasitic bipolar transistor formed of P type impurity region 2042, N well 2040, and P type semiconductor substrate 2040 is not turned on, not causing leakage current. More specifically, positive electric charge stored in node N20 is all used for generation of internal high voltage Vpp through P type impurity regions 2042 and 2044, implementing high pumping efficiency.

On the other hand, in MOS transistor 109, when clock signal CK is at the "L" level, the potential of node N23 is at least Vpp−VBE, and the potential of N well 2030 is Vpp−VBE, similarly. At the time, the potential of node N20 is at the level of external power supply voltage EXV. Therefore, the voltage levels of P type impurity regions 2032 and 2034 are both at the external power supply voltage EXV level. More specifically, since internal high voltage Vpp is boosted from external power supply voltage EXV, and Vpp−VBE>EXV, PN junctions between P type impurity region 2032 and N well 2030, and between P type impurity region 2034 and N well 2030 are brought to a reverse bias state, and leakage current from P type impurity regions 2032 and 2034 to N well 2030 is not generated.

When clock signal CK is at the "H" level, the potential of node N23 is Vpp−VBE+EXV, the potential of P type impurity region 2034 is 2·EXV, and the voltage level of P type impurity region 2032 is at the external power supply voltage EXV level. Therefore, since the PN junctions formed between P type impurity regions 232 and 234, and N well 2030 are not brought to a forward bias state even in this state, leakage current from P type impurity regions 2032 and 3024 to N well 2030 is not generated. Therefore, in MOS transistor 109, that is, precharge circuit 417, leakage current is not generated at all, making it possible to transmit all positive electric charge applied from external power supply node EXV, and to discharge node N20 to a prescribed voltage level at high efficiency. As a result, a pump circuit generating internal high voltage Vpp at high efficiency can be implemented. Description will now be given of the reason why MOS capacitors 412 and 109 are used.

Figure 14:
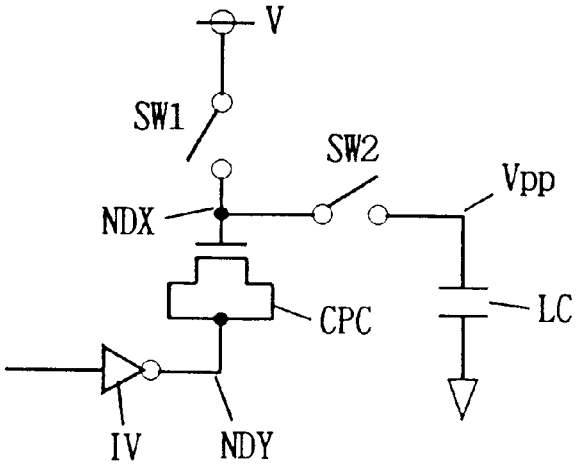
FIG. 14 is a diagram for explaining charge pumping operation for generating an internal high voltage.

For simplicity of description, now consider such an internal high voltage generating circuit as shown in FIG. 14. The internal high voltage generating circuit includes an MOS capacitor CPC formed of an N channel MOS transistor as a charge pump capacitor, an inverter IV transmitting a clock signal to one electrode of MOS capacitor CPC, a switching element SW1 precharging the other electrode of MOS capacitor CPC to a voltage V, and a switching element SW2 generating internal high voltage Vpp by connecting a node NDX of the other electrode of MOS capacitor CPC to an output node. The internal high voltage generating circuit generates internal high voltage Vpp by charging an external load capacitance LC. Operation of the internal high voltage generating circuit shown in FIG. 14 will be described in order with reference to FIGS. 15A–15E.

Figure 15A:
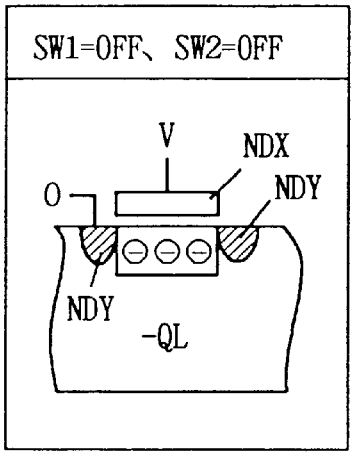
FIGS. 15A–15E are diagrams for explaining operation of a charge pump MOS capacitor in a charge pump circuit shown in FIG. 14.
Figure 15B:
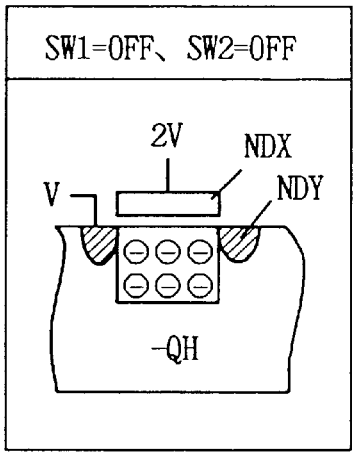

(i) Initial State: As shown in FIG. 15A, switching elements SW1 and SW2 are both set to an off state in the initial state. In this state, node NDX is charged to voltage V, and the voltage level of a node NDY is at the ground voltage Vss (0 V) level. At the time, electric charge −QL is stored in a depletion layer formed in the surface of a semiconductor layer under the gate electrode (node NDY). This state is defined as an initial state.

(ii) Boost: At the time of boosting operation for boosting the voltage of node NDX shown in FIG. 15B, switching elements SW1 and SW2 are both in an off state. An output signal from inverter IV increases to the voltage V level, and the voltage of node NDX is boosted to 2·V. Since the source potential of the MOS capacitor increases to the V level, the depletion layer formed in the substrate surface is extended. Much negative electric charge is stored in the extended depletion layer due to the potential increase of node NDX. Here, the amount of stored electric charge at the time is −QH. The amount of electric charge which inverter IV charges is equal to the amount of positive electric charge increased in node NDX, which is the same as the amount of negative electric charge stored in the depletion layer. Therefore, the amount of electric charge supplied by inverter IV is QH−QL . . . (1).

Figure 15C:
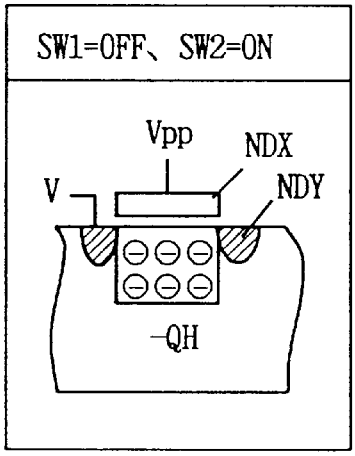

(iii) Discharging Operation: As shown in FIG. 15C, when node NDX is discharged, switching element SW1 is in an off state, and switching element SW2 is in an on state. As a result, positive electric charge stored in node NDX is discharged, and the voltage level of internal high voltage Vpp increases. At the time, the voltage level of node NDX becomes equal to internal high voltage Vpp. Let Cox denote the capacitance of MOS capacitor CPC. Since the voltage change in node NDX is 2·V−Vpp, the following amount of electric charge is discharged:

$$(2\cdot V-Vpp)\cdot Cox \tag{2}$$

The amount of electric charge stored in a region of MOS capacitor CPC connecting to node NDY changes from −(2·V−V)·Cox=−V·Cox stored at the time of boosting operation of 2·V to −(Vpp−V)·Cox. The change amount of electric charge stored on the side of electrode region connecting to node NDY is supplied by inverter IV. More specifically, inverter IV supplied electric charge of:

$$-(Vpp-V)\cdot Cox(-V\cdot Cox)=(2\cdot V-Vpp)\cdot Cox \tag{3}$$

Figure 15D:
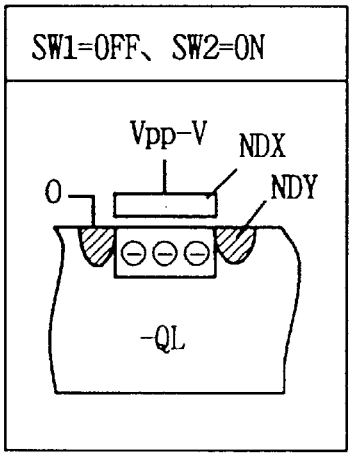

(iv) Completion of Discharging: As shown in FIG. 15D, precharging operation is carried out after completion of discharging. Therefore, an output from inverter IV changes to the ground voltage level. At the time, switching element SW1 is turned off, and switching element SW2 is turned on. In this state, the voltage of node NDX changes from Vpp to Vpp−V.

Figure 15E:
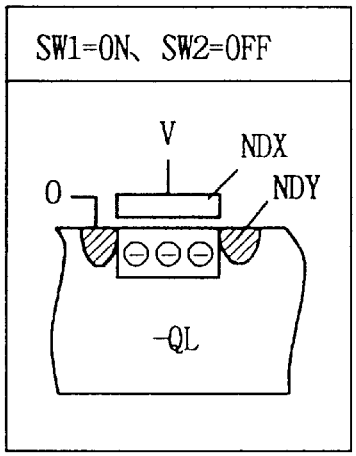

(v) Precharging Operation: During precharging operation of node NDX, as shown in FIG. 15E, switching element SW1 is turned on, and switching element SW2 is turned off. When switching element SW1 is turned on, the voltage of node NDX becomes V. Therefore, electric charge supplied from a power source is:

$$\{V-(Vpp-V)\}\cdot Cox=(2\cdot V-Vpp)\cdot Cox \tag{4}$$

It is assumed now that the amount of electric charge consumed for on/off control of switching elements SW1 and SW2 is Qloss . . . (5). The ratio η of electric charge consumed in the above series of operation, that is, a series of cycle shown in FIGS. 15A to 15E to generated electric charge is represented by the following expression, because only the above expression (2) denotes the amount of electric charge consumed and the remaining expressions (1), and (3) to (5) denote the amount of electric charge generated.

$$\eta=\frac{(2\cdot V-Vpp)\cdot Cox}{QH-QL+(2\cdot V-Vpp)\cdot Cox+(2\cdot V-Vpp)\cdot Cox+Qloss}$$

wherein $$QH=\sqrt{2\cdot\epsilon\cdot q\cdot Na}\cdot\sqrt{Vbi+Vcs+|Vbb|}$$

$$QL=\sqrt{2\cdot\epsilon\cdot q\cdot Na}\cdot\sqrt{Vbi+|Vbb|}$$

Vbb: Substrate bias voltage

Na: Substrate surface impurity concentration q: Unit electric charge

ϵ: Substrate dielectric constant

Vbi: Built-in voltage by substrate surface potential

Vbb: Substrate bias voltage

Vcs: Source-ground voltage

Suppose $$K=\frac{\sqrt{2\cdot\epsilon\cdot q\cdot Na}}{Cox}$$

the following expression η is given:

$$\eta=\frac{(2\cdot V-Vpp)}{2(2\cdot V-Vpp)+K\left(\sqrt{Vbi+Vcs+|Vbb|}-\sqrt{Vbi+|Vbb|}\right)+\frac{Qloss}{Cox}}$$

The second term of the denominator is equal to a difference between the threshold voltages of the MOS transistor when the source-substrate voltage of the MOS capacitor CPC are V+|Vbb| and |Vbb|. The third term of the denominator denotes the amount of loss of electric charge α used by a circuit portion driving the switching elements. Therefore, the above expression is represented as follows:

$$\eta=\frac{2\cdot V-Vpp}{2\cdot(2\cdot V-Vpp)+VTH''-VTH'+\alpha} \tag{6}$$

In the above expression, VTH" denotes the threshold voltage of the MOS transistor when the source-substrate potential difference of the MOS transistor is V+|Vbb|, and VTH' denotes the threshold voltage when the source-substrate voltage is |Vbb|.

Therefore, according to the above expression (6), by setting VTH"=VTH', the value of the coefficient η can be made larger, making it possible to improve the efficiency of the charge pump. More specifically, when a p channel MOS transistor is used as a capacitor, the coefficient η denoting the efficiency of the charge pump is approximately represented by:

$$(2\cdot EXV-Vpp)/\{2\cdot(2\cdot EXV-Vpp)+|Vthp2|-|Vthp1|+\alpha\}$$

wherein Vthp2 denotes the threshold voltage of the MOS transistor when node N21 is external power supply voltage EXV, and Vthp1 denotes the threshold voltage of the MOS transistor when node N21 is ground voltage.

The source and drain and the substrate region (backgate) of the p channel MOS transistor are interconnected to attain the same potential, so that the source-substrate voltage Vcs is set to 0, thereby eliminating the substrate effect and implementing Vthp1=Vthp2. Accordingly, the pump efficiency of the charge pump circuit is improved. The structure of MOS capacitors 108 and 412 will be described hereinafter.

Figure 16:
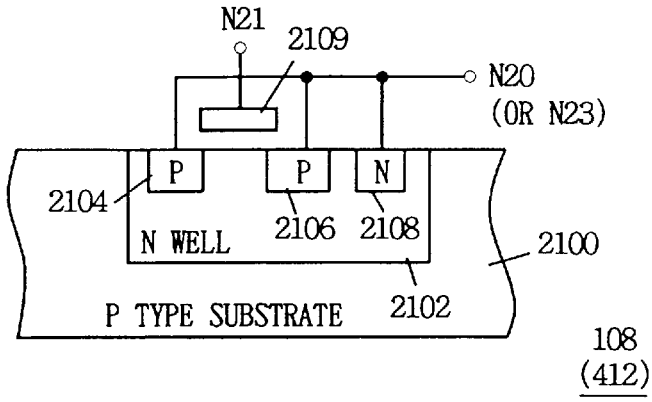
FIG. 16 is a diagram showing a sectional structure of the charge pump MOS capacitor shown in FIG. 11.

FIG. 16 is a diagram showing a schematic sectional structure of MOS capacitors 108 and 412 shown in FIG. 11. In FIG. 16, the sectional structure of only one of MOS capacitors 108 and 412 is shown. These MOS capacitors 108 and 412 are formed in N well regions different from each other. In FIG. 16, MOS capacitor 108 (or 412) is formed in an N type well 2102 formed in the surface of a P type semiconductor substrate 2100. MOS capacitor 108 (or 412) includes P type impurity regions 2104 and 2106 formed in the surface of N type well 2102, an N type impurity layer 2108 formed in the surface of N type well 2102 and serving as an electrode layer for N type well 2102, and a gate electrode 2109 formed on the substrate surface between P type impurity layers 2104 and 2106.

Figure 12:
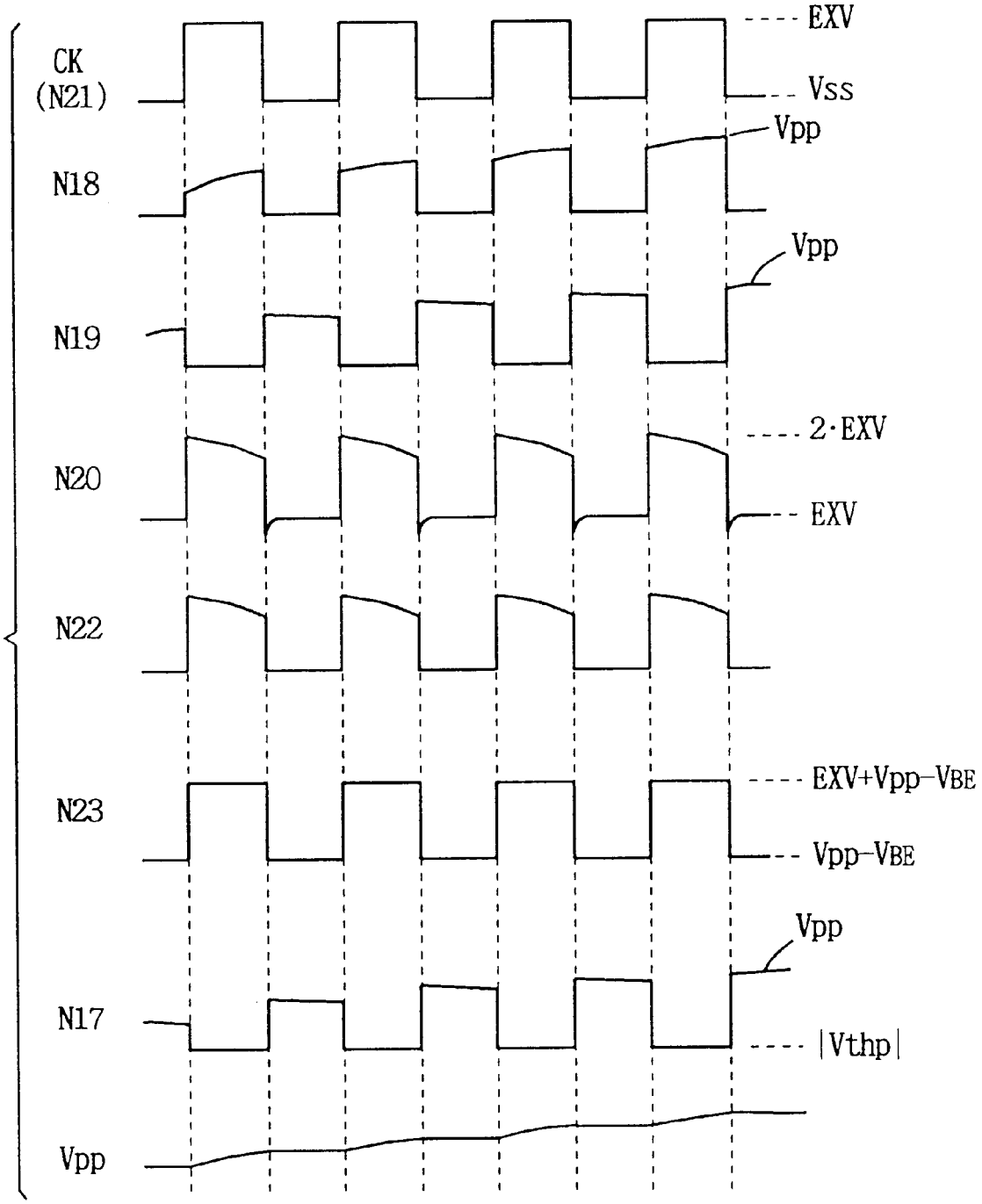
FIG. 12 is a signal waveform diagram showing operation of the circuit shown in FIG. 11.

P type impurity layers 2104 and 2106 and N type impurity layer 2108 are connected to node N20 (or N23), and gate electrode 2109 is connected to node N21. A prescribed bias voltage is applied to P type impurity semiconductor substrate 2100, and P type semiconductor substrate 2100 and N well 2102 are maintained in a reverse bias state. The voltage of N type well 2102 (node N20) is externally power supply voltage EXV or more as shown in FIG. 12. As shown in FIG. 16, by setting P type impurity layers 2104 and 2106 and N type impurity layer 2108 (in other words, N type well 2102) all to the same potential, the substrate effect of the p channel MOS transistor can be eliminated. As shown in the above expression, variation of the threshold voltage can be suppressed, enabling efficient injection of electric charge.

Figure 17:
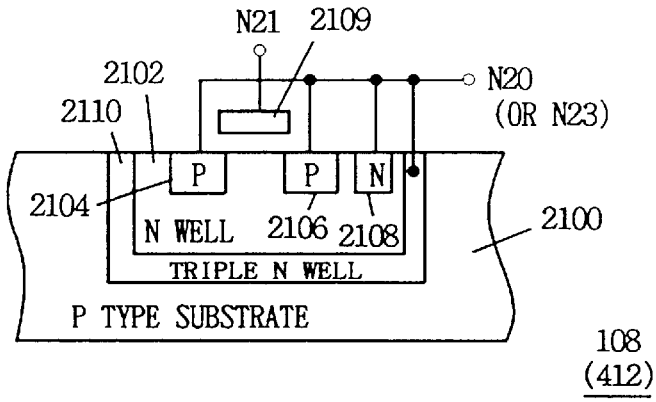
FIG. 17 is a diagram showing another structure of the charge pump MOS capacitor shown in FIG. 11.

FIG. 17 is a diagram showing another structure of MOS capacitors 108 and 412 shown in FIG. 11. Also in FIG. 17, only one of MOS capacitors 108 and 412 is shown. These MOS capacitors 108 and 412 are formed in well regions isolated from each other. In FIG. 17, a triple N well 2110 of low resistance is formed in the surface of P type semiconductor substrate 2100 so as to surround N type well 2102. Although not clearly shown, triple N well 2110 is connected to node N20 through a region for leading out an electrode. Similar to the structure shown in FIG. 16, P type impurity layers 2104 and 2106 and N type impurity layer 2108 are formed in N type well 2102. Gate electrode 2109 is further formed in N type well 2102. Provision of triple N type well 2110 of low resistance between N type well 2102 and P type semiconductor substrate 2100 can reduce effective resistance of N type well 2102, and can change the potential of node N20 at a high speed (can reduce RC delay in node N20).

Figure 18:
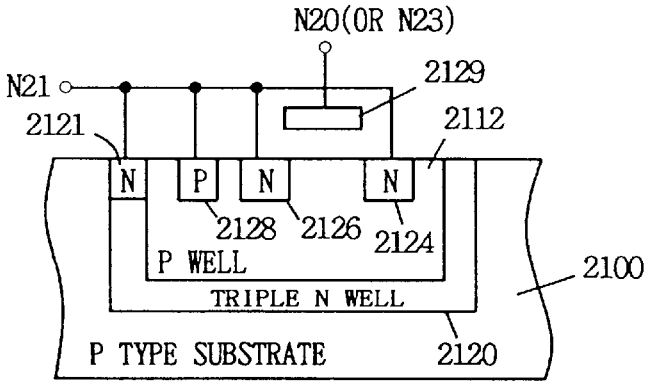
FIG. 18 is a diagram showing still another structure of the charge pump MOS capacitor shown in FIG. 11.

FIG. 18 is a diagram showing a further structure of MOS capacitors 108 and 412 shown in FIG. 11. The MOS capacitor shown in FIG. 18 is formed of an n channel MOS transistor. In FIG. 18, the MOS capacitor is formed in a P well 2122 isolated from P type semiconductor substrate 2100 by a triple N well 2120. The MOS capacitor includes N type impurity regions 2124 and 2126 formed in the surface of P type well 2122, a P type impurity layer 2128 serving as an electrode of P type well 2122, and a gate electrode 2129 formed on the surface of P type well 2122 between P type impurity regions 2124 and 2126.

Gate electrode 2129 is connected to node N20 (or node N23), and N type impurity layers 2124 and 2126 and P type impurity region 2128 are connected to node N21. Triple N well 2120 is connected to node N21 through an N type impurity region 2121 serving as an electrode layer. By setting N type impurity regions 2124 and 2126, P type impurity region 2128, and P type well 2122 to the same potential, electric charge can be injected efficiently without the influence of the substrate effect of the MOS transistor. Low resistance of triple N well 2120 makes it possible to change the potential of node N21 (output node of inverter 129 of FIG. 11) at a high speed. Since P type well 2122 and triple N type well 2120 are the same in potential, and are not brought to a forward bias state, there is no leakage current flow from P type well 2122 to P type semiconductor substrate 2100 through triple N type well 2120 (P type semiconductor substrate 2100 is biased to negative voltage Vbb).

As described above, according to the structure of the internal high voltage generating circuit of the present invention, the following advantages are obtained.

(1) Since the substrate region (backgate) of precharge MOS transistor 109 and output MOS transistor 110 is structured so as to be boosted according to charge pumping operation, the parasitic bipolar transistor can be always in an off state. Leakage current is not generated in the substrate region of these MOS transistors, and electric charge is not consumed wastefully, making it possible to implement a highly efficient pump circuit.

(2) Since an MOS capacitor is used as a charge pump capacitor, and the substrate region (backgate) of the MOS capacitor is connected to the source and drain region, variation of the threshold voltage at the time of pumping operation can be prevented without the influence of the substrate effect. The charge pump efficiency of the MOS capacitor is considerably improved, making it possible to implement a pump circuit injecting electric charge efficiently.

(3) Internal high voltage Vpp is generated using external power supply voltage EXV. Even if internal power supply voltage Vcc1 is reduced for low current consumption, external power supply voltage EXV is sufficiently higher than the target voltage level Vcc1+2 |Vthp| of internal high voltage Vpp. Therefore, if output voltage Vpp of the pump circuit approaches a prescribed level, the efficiency of electric charge injection is not decreased at all, making it possible to supply internal high voltage Vpp at a prescribed level stably at high efficiency.

Note that level detecting circuit 226 shown in FIG. 11 uses internal power supply voltage Vcc1. In this case, internal power supply voltage Vcc1 is stable, enabling a constant detection level of level detecting circuit 226.

[Intermediate Voltage Generating Circuit]

A: Intermediate voltage generating circuit 1

Figure 19:
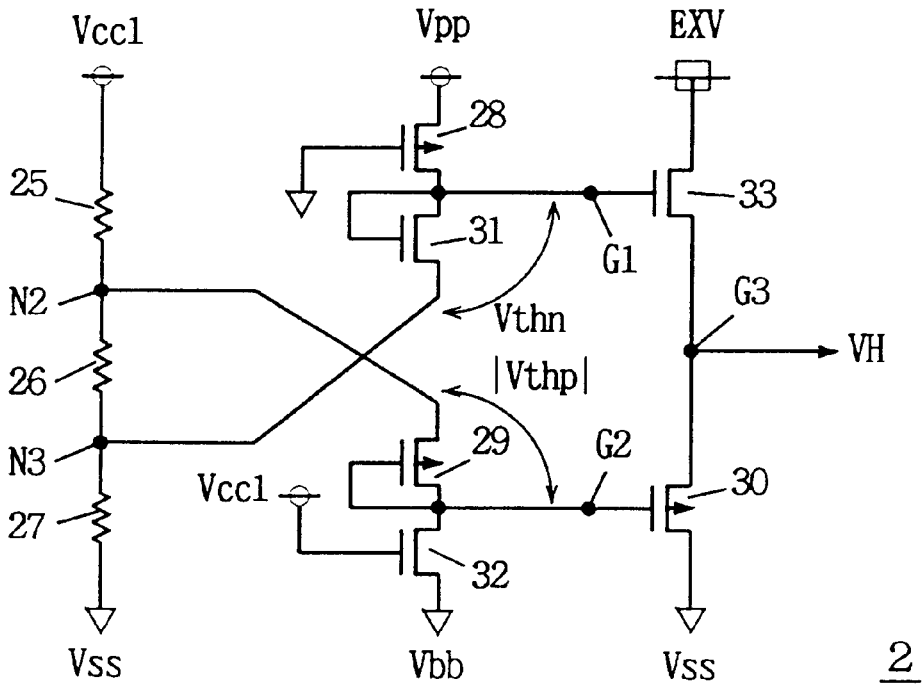
FIG. 19 is a diagram showing the structure of an intermediate voltage generating circuit according to the present invention.

FIG. 19 is a diagram showing a structure of a first embodiment of the intermediate voltage generating circuit according to the present invention. Referring to FIG. 19, intermediate voltage generating circuit (Vcc/2 generating circuit) 2 includes resistors 25, 26, and 27 connected in series between internal power supply node Vcc1 and ground node Vss, a p channel MOS transistor 28 connected between a node receiving internal high voltage Vpp (hereinafter referred to as "internal high voltage node") and a node G1 and receiving ground voltage Vss at its gate, an n channel MOS transistor 31 having its gate and drain connected to node G1 and its source connected to node N3, a p channel MOS transistor 29 having its gate and drain connected to a node G2 and its source connected to node N2, and an n channel MOS transistor 32 connected between node G2 and a node to which negative voltage Vpp is applied (hereinafter referred to as a "negative voltage node") and receiving internal power supply voltage Vcc1 at its gate.

MOS transistors 28 and 32 serve as high resistance elements, supplying small current. Therefore, MOS transistors 31 and 29 operate in a diode mode, causing voltage shifts of Vthn and |Vthp|, respectively. Resistors 25, 26, and 27 have a ratio of resistance values of 49:2:49, for example. Therefore, the potential of node N2 is 0.51 Vcc1, and the potential of node N3 is 0.49 Vcc1. Accordingly, the potential of node G1 is set to 0.49·Vcc1+Vthn, and the potential of node G2 is set to 0.51·Vcc1−|Vthp|.

Figure 20:
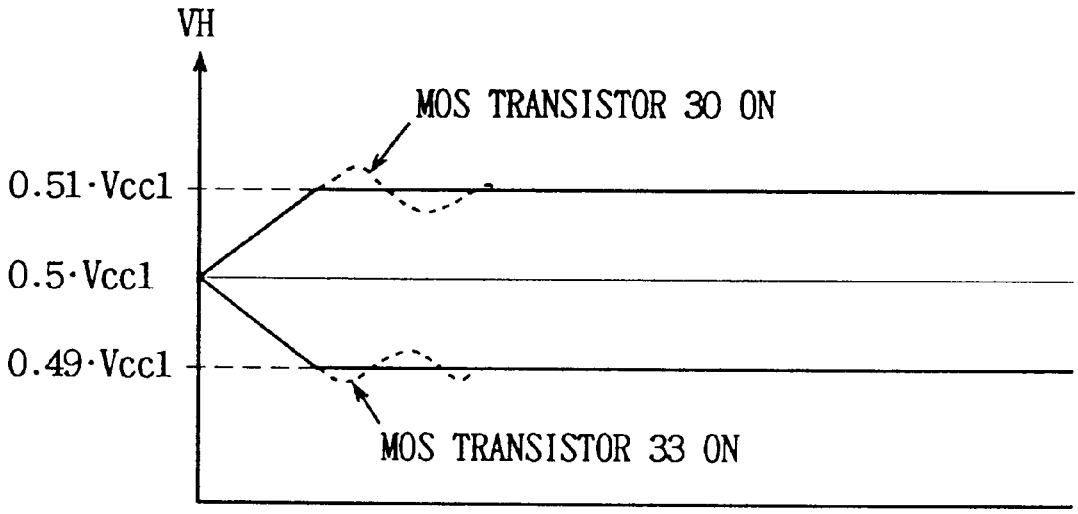
FIG. 20 is a signal waveform diagram showing operation of the circuit shown in FIG. 19.

Vcc/2 generating circuit 2 further includes an n channel MOS transistor 33 connected between external power supply node EXV and output node G3 and receiving the voltage of node G1 at its gate, and a p channel MOS transistor 30 provided between node G3 and ground node Vss and receiving the voltage of node G2 at its gate. The threshold voltage of p channel MOS transistor 30 is Vthp, and the threshold voltage of n channel MOS transistor 33 is Vthn. Operation of Vcc/2 generating circuit 2 shown in FIG. 19 will now be described with reference to FIG. 20, which is the operation explanation diagram.

The potentials on nodes G1 and G2 are 0.49·Vcc1+Vthn and 0.51·Vcc1−|Vthp|, respectively. When a potential VH using ground voltage Vss of node G3 as a reference (hereinafter simply referred to as a "voltage") is 0.51·Vcc1 or more, the gate-source voltage Vgs of MOS transistor 30 is:

$$Vgs \leqq -|Vthp| = Vthp$$

and MOS transistor 30 is turned on. The gate-source voltage of MOS transistor 33 is Vthn−0.02·Vcc1 or less, and MOS transistor 33 is turned off. Therefore, node G3 is discharged through MOS transistor 33 and the voltage VH is reduced.

When the voltage VH of node G3 is 0.49·Vcc1 or less, the gate-source voltage of MOS transistor 33 becomes the threshold voltage Vthn or more, and MOS transistor 33 is turned on. On the other hand, MOS transistor 30 maintains an off state with the gate-source voltage attaining at least the threshold voltage Vthp. Therefore, node G3 is supplied with current from external power supply node EXV through MOS transistor 33, and the potential of node G3 increases.

When the voltage VH is between 0.49·Vcc1 and 0.51·Vcc1, MOS transistors 30 and 33 are both in an off state. This region is a "non-sensitive band" because both MOS transistors 30 and 33 are in an off state. Generally, a semiconductor memory device has a tendency for intermediate voltage VH either to increase or decrease due to the manufacturing parameter. Therefore, in an actual semiconductor memory device, intermediate voltage VH does not fluctuate between 0.51·Vcc1 and 0.49·Vcc1, but changes in the vicinity of 0.51·Vcc1 or in the vicinity of 0.49·Vcc1. The offset of intermediate voltage VH from Vcc1/2, that is, the offset approximately 0.01·Vcc1 is not such a serious problem in actual use.

The voltage of node G1 is 0.51·Vcc1+Vthn, and the voltage of node G2 is 0.49·Vcc1−|Vthp|. Therefore, when voltage VH is intermediate voltage Vcc1/2, it is ensured that MOS transistors 30 and 33 are turned off, making it possible to substantially reduce a current flow in MOS transistors 30 and 33. Therefore, it is not necessary to carry out the ion injection step for adjusting the threshold voltages of MOS transistors 30 and 33 to larger values, simplifying the manufacturing process of the intermediate voltage generating circuit (Vcc/2 generating circuit). Further, only one of MOS transistors 30 and 33 is turned on. These transistors are never turned on simultaneously. As a result, generation of through current flowing form external power supply node EXV to ground node Vss can be prevented, implementing low current consumption.

Further, current is supplied to node G3 from external power supply node EXV. Therefore, even if leakage current is generated in the capacitor electrode (cell plate) of a memory cell, for example, the leakage current is supplied from external power supply node EXV. The internal power supply voltage generating circuit does not have to compensate for the leakage current. The current drivability at the time of stand-by of internal power supply voltage can be made smaller, and low power consumption of the internal power supply voltage generating circuit can be implemented accordingly. In this case, the internal power supply voltage generating circuit has only to supply small current flowing in resistors 25–27, and MOS transistors 28–32.

Further, MOS transistors 28 and 31 generating the voltage of node G1 are connected between internal high voltage node Vpp and node N3, and MOS transistors 29 and 32 generating the voltage of node G22 is connected between node N2 and negative voltage node Vbb. Therefore, if the following conditions:

$$Vpp > 0.49 \cdot Vcc1 + Vthn,$$

$$Vbb < 0.51 \cdot Vcc1 - |Vthp|$$

are satisfied, Vcc/2 generating circuit 2 operates. Even if internal power supply voltage Vcc1 is reduced for low power consumption, intermediate voltage VH can be generated stably. For example, when the above-mentioned internal high voltage generating circuit and negative voltage generating circuit are used, the following expressions hold:

$$Vpp = Vcc1 + 2 \cdot |Vthp|,$$

$$Vbb = -2 \cdot Vthn$$

The above conditions required for internal high voltage Vpp and negative voltage Vbb are sufficiently satisfied. Therefore, by using the above described internal high voltage generating circuit and negative voltage generating circuit and this intermediate voltage generating circuit in combination, a semiconductor memory device which operates under low voltage with low power consumption can be implemented.

Figure 21:
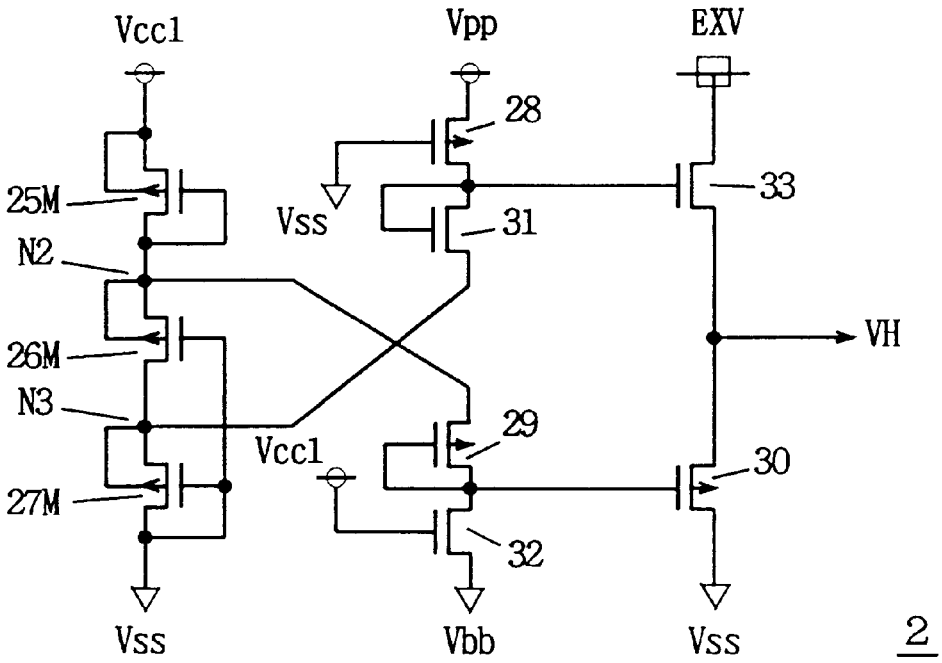
FIG. 21 is a diagram showing another structure of the intermediate voltage generating circuit according to the present invention.

B: Intermediate voltage generating circuit 2:

FIG. 21 is a diagram showing a structure of a second embodiment of the intermediate voltage generating circuit according to the present invention. Vcc/2 generating circuit (intermediate voltage generating circuit) 2 shown in FIG. 21 includes p channel MOS transistors 25M, 26M, and 27M connected in series between internal power supply node Vcc1 and ground node Vss. MOS transistor 25M has its source and substrate region (backgate) connected to internal power supply node Vcc1, and its gate connected to node N2. MOS transistor 26M has its source and substrate region connected to node N2, and its gate connected to ground node Vss. MOS transistor 27M has its source and substrate region connected to node N3, and its gate connected to ground node Vss.

MOS transistors 25M and 27M have the same size. MOS transistors 25M and 27M have their gates and drains connected, and operate in a resistance mode. MOS transistor 26M has its gate connected to ground node Vss, and operates as a resistance element. MOS transistors 25M, 26M, and 27M are the same in potential of source and substrate region. As a result, the substrate effect does not occur in MOS transistors 25M–27M, and a prescribed resistance value can be reliably implemented in MOS transistors 25M–27M. Other than that, the structure shown in FIG. 21 is the same as that shown in FIG. 19, and the same or corresponding portions are labeled with the same reference characters. By setting resistance values (channel resistance) of MOS transistors 25M–27M to have a ratio of 49:2:49, the same operation as that of the circuit shown in FIG. 19 can be implemented.

Since an MOS transistor is used as voltage dividing means for dividing internal power supply voltage Vcc1 to generate a prescribed voltage in the Vcc/2 generating circuit shown in FIG. 21, a voltage dividing circuit generating a prescribed voltage stably with a small occupied area can be implemented.

Figure 22:
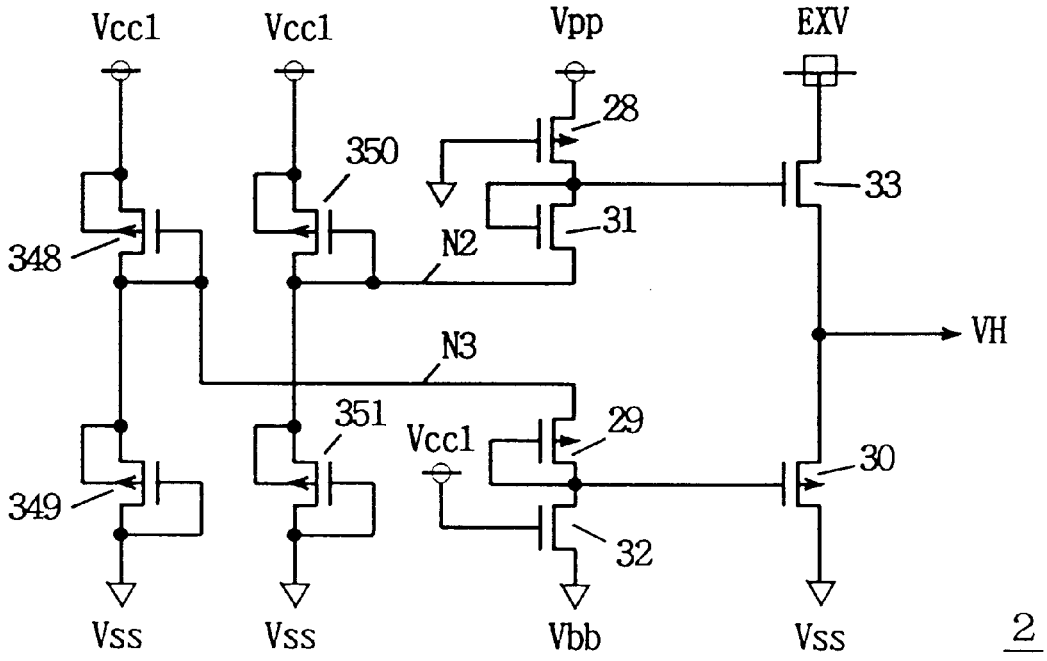
FIG. 22 is a diagram showing still another structure of the intermediate voltage generating circuit according to the present invention.

C: Intermediate voltage generating circuit 3:

FIG. 22 is a diagram showing a structure of a third embodiment of the internal intermediate voltage generating circuit according to the present invention. In Vcc/2 generating circuit 2 shown in FIG. 22, voltage dividing circuits transmitting prescribed voltages to nodes N2 and N3, respectively, are provided separately between internal power supply node Vcc1 and ground node Vss. More specifically, to node N2, a voltage at a prescribed level is transmitted by P channel MOS transistors 350 and 351 connected in series between internal power supply node Vcc1 and ground node Vss, and to node N3, a prescribed voltage is transmitted by p channel MOS transistors 348 and 349 connected in series between internal power supply node Vcc1 and ground node Vss.

MOS transistor 350 has its substrate region and source connected to internal power supply node Vcc1, and its gate and drain connected to node N2. MOS transistor 351 has its source and substrate region connected to node N2, and its gate and drain connected to ground node Vss. MOS transistor 348 has its substrate region and source connected to internal power supply node Vcc1, and its gate and drain connected to node N3. MOS transistors 349 has its source and substrate region connected to node N3, and its gate and drain connected to ground node Vss. MOS transistors 348–351 all operate in a resistance mode. The ratio of resistance values of MOS transistors 348 and 349 is set to 0.49:0.51. The voltage of 0.51·Vcc1 is transmitted onto node N3. The ratio of resistance values of MOS transistors 350 and 351 is set to 0.51:0.49 and the voltage of 0.49·Vcc1 is transmitted onto node N2.

Output transistors 30 and 33 for supplying intermediate voltage VH, and MOS transistors 28–32 controlling operation of output transistors 30 and 33 are the same as those in FIGS. 19 and 21, and the same or corresponding portions are labeled with the same reference characters. Even with the structure shown in FIG. 22, an intermediate voltage generating circuit can be obtained similarly which operates with low current consumption stably and reliably even when internal power supply voltage is reduced.

When the MOS transistor has its gate and drain interconnected, it is determined by the relation of the amount of current flowing in the MOS transistor and the amount of current caused to flow by the MOS transistor whether the MOS transistor operates in a resistance mode or a diode mode. When there is a current flow sufficiently smaller than the current drivability of the MOS transistor, the MOS transistor operates in a diode mode. When there is a current flow substantially satisfying the current drivability flows in the MOS transistor, the MOS transistor operates in a resistance mode.

As described above, in the intermediate voltage generating circuit according to the present invention, internal power supply voltage is divided to generate prescribed voltages. These prescribed voltages are level-shifted to generate a control voltage controlling the output MOS transistor. At the same time, the output transistor is provided between external power supply voltage and ground voltage. Therefore, an intermediate voltage generating circuit which operates under low power supply voltage stably with low current consumption can be obtained without requiring additional manufacturing process. By generating a voltage to be applied to the cell plate of the memory cell capacitor and a precharge voltage of a bit line with the intermediate voltage generating circuit used in a semiconductor memory device, a semiconductor memory device with low current consumption can be implemented.

[Internal Power Supply Voltage Generating Circuit]

Figure 23:
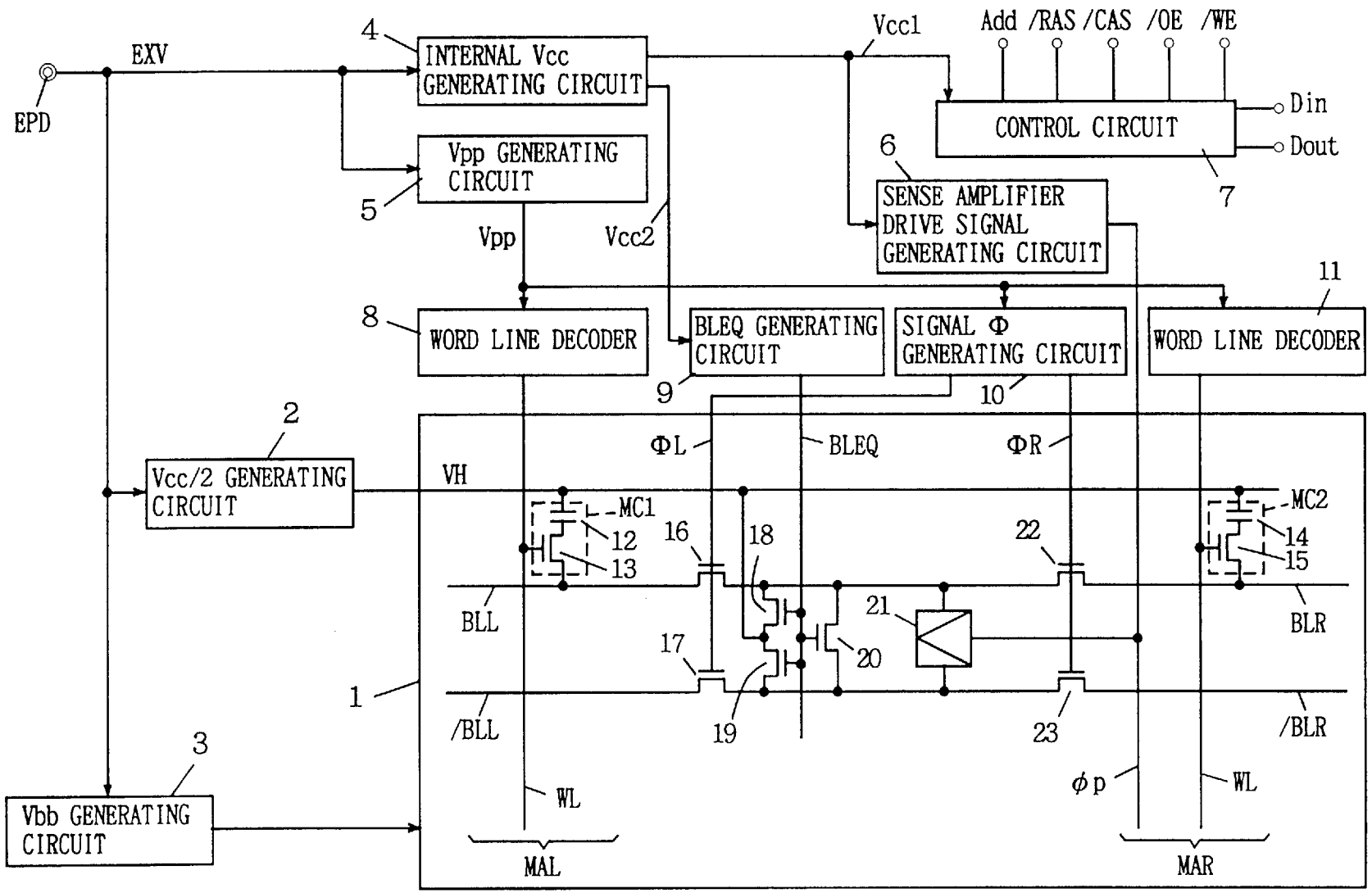
FIG. 23 is a diagram showing the entire structure of a semiconductor memory device according to the present invention and a manner of distribution of internal power supply voltage.

FIG. 23 is a diagram showing the entire structure of a semiconductor memory device according to the present invention. In the structure of the semiconductor memory device shown in FIG. 23, external power supply voltage EXV applied to an external power supply pard EPD is applied to internal Vcc generating circuit 4 generating internal power supply voltage, Vpp generating circuit 5 generating internal high voltage Vpp, Vcc/2 generating circuit 2 generating internal high voltage Vpp, Vcc/2 generating circuit 2 generating intermediate voltage VH, and Vbb generating circuit 3 generating negative voltage Vbb. Internal Vcc generating circuit 4 generates, to be described in detail later, first internal power supply voltage Vcc1, and second internal power supply voltage Vcc2 higher than first internal power supply voltage Vcc1. Vcc/2 generating circuit 2 uses first internal power supply voltage Vcc1 for charging the bit line potential of memory cell array 1 to the internal power supply voltage Vcc1 level. Although negative voltage Vbb is set to −2·Vthn, Vbb generating circuit 3 uses external power supply voltage. Therefore, Vbb generating circuit 3 may use either first internal power supply voltage Vcc1 or second internal power supply voltage Vcc2. Vpp generating circuit 5 sets internal high voltage Vpp to the Vcc+2·Vthn level. Therefore, in Vpp generating circuit 5, either first internal power supply voltage Vcc1 or second internal power supply voltage Vcc2 may be used as internal power supply voltage Vcc in addition to external power supply voltage EXV according to the required voltage level.

First internal power supply voltage Vcc1 from internal Vcc generating circuit 4 is applied to control circuit 7 receiving external signals Add, /RAS, /CAS, /OE, and /WE to generate various internal control signals and to carry out input/output of data, and sense amplifier drive signal generating circuit 6 generating sense amplifier drive signal ϕp for activating sense amplifier 21. Second internal power supply voltage Vcc2 is applied to BLEQ generating circuit 9 generating bit line equalize signal BLEQ. Internal high voltage Vpp from Vpp generating circuit 5 is applied to word line decoders 8 and 11 provided corresponding to array blocks MAL and MAR for selecting word lines WL in corresponding array blocks. Internal high voltage Vpp from Vpp generating circuit 5 is applied to signal Φ generating circuit 10 generating block select signals ΦL and ΦR connecting sense amplifier 21 and a selected array block. The structure of sense amplifier drive signal generating circuit 6, control circuit 7, word line decoders 8 and 11, and signal Φ generating circuit 10 is the same as the conventional case. The structure of BLEQ generating circuit 9 will be described in detail later. Description will now be given of the advantages of generation of two kinds of internal power supply voltages Vcc1 and Vcc2 from internal Vcc generating circuit 4.

Figure 24:
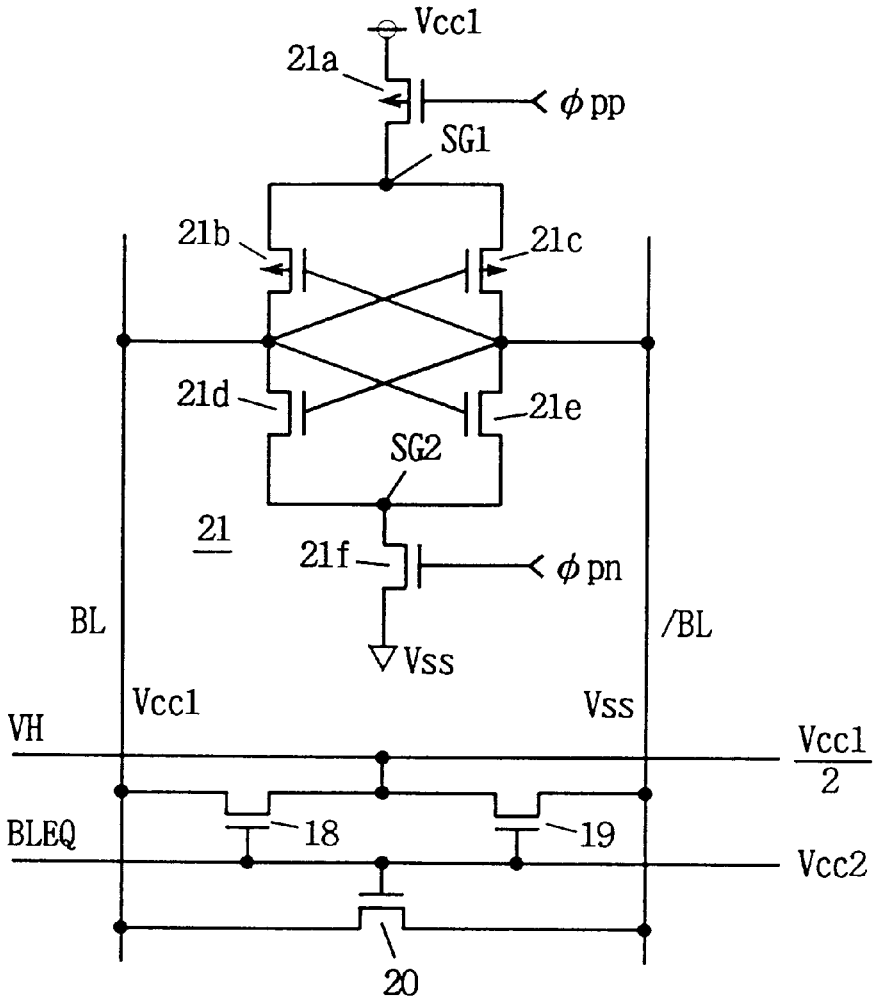
FIG. 24 is a diagram for explaining the effect brought about by distribution of internal power supply voltage shown in FIG. 23.

FIG. 24 is a diagram showing a structure of a sense amplifier and equalize/precharge portion. Referring to FIG. 24, sense amplifier 21 includes p channel MOS transistors 21b and 21c having their gates and drains cross-coupled, n channel MOS transistors 21d and 21e having their gates and drains cross-coupled, a p channel MOS transistor 21a rendered conductive in response to a sense amplifier activation signal φpp for transmitting first internal power supply voltage Vcc1 applied to internal power supply node Vcc1 to a node SG1, and an n channel MOS transistor 21f rendered conductive in response to a sense amplifier activation signal φpn for discharging a node SG2 to the ground voltage Vss level. Both sense amplifier activation signals φpp and φpn are generated from sense amplifier drive signal generating circuit 6 as sense amplifier drive signal φp. Sense amplifier activation signal φpp is at "L" at the ground voltage Vss level at the time of activation, and sense amplifier activation signal φpn is at "H" at the first internal power supply voltage Vcc1 level at the time of activation. Instead of the structure shown in FIG. 23, a structure may be used in which sense amplifier drive signal φp at the first internal power supply voltage Vcc1 level is applied to node SG1 from sense amplifier drive signal generating circuit 6.

The drains of MOS transistors 21b and 21d are connected to bit line BL, and the drains of MOS transistors 21c and 21e are connected to bit line /BL. At the time of operation, one of bit line pairs BLL, /BLL and BLR, /BLR shown in FIG. 23 is connected to sense amplifier 21. Therefore, these bit lines are shown as bit lines BL and /BL in FIG. 24.

Between bit lines BL and /BL, connected in series are n channel MOS transistors 18 and 19 rendered conductive in response to bit line equalize signal BLEQ for transmitting intermediate voltage VH to bit lines BL and /BL. Further, provided is n channel MOS transistor 20 rendered conductive in response to bit line equalize signal BLEQ for connecting bit lines BL and /BL electrically. Operation will now be described.

The operation per se of sense amplifier 21 is the same as that of a conventional sense amplifier. More specifically, when sense amplifier activation signal φpp is activated to bring p channel MOS transistor 21a to an on state, the voltage level of node SG1 attains the first internal power supply voltage Vcc1 level. As a result, a sense amplifier portion configured of p channel MOS transistors 21b and 21c is activated, thereby increasing a higher one of the potentials of bit lines BL and /BL (assuming bit line BL) to the first internal power supply voltage Vcc1 level. When the potential of bit line BL is increased to the first internal power supply voltage Vcc1 level, p channel MOS transistor 21c is turned off. On the other hand, when sense amplifier activation signal φpn attains the "H" level, node SG2 attains the ground voltage Vss level. As a result, a sense amplifier portion configured of MOS transistors 21d and 21e is activated, thereby discharging the bit line on the low potential side (/BL) to the ground voltage Vss level. When the potential of bit line /BL attains the ground voltage Vss level, MOS transistor 21d is in an off state. MOS transistors 21b and 21e are respectively in an on state, keeping bit lines BL and /BL at the first internal power supply voltage Vcc1 level and the ground voltage Vss level, respectively.

When a memory cycle is complete, and sense amplifier activation signals φpp and φpn attain the "H" and "L" levels in a non-active state, MOS transistors 21a and 21f are turned off, isolating nodes SG1 and SG2 from internal power supply node Vcc1 and ground node Vss.

Figure 25:
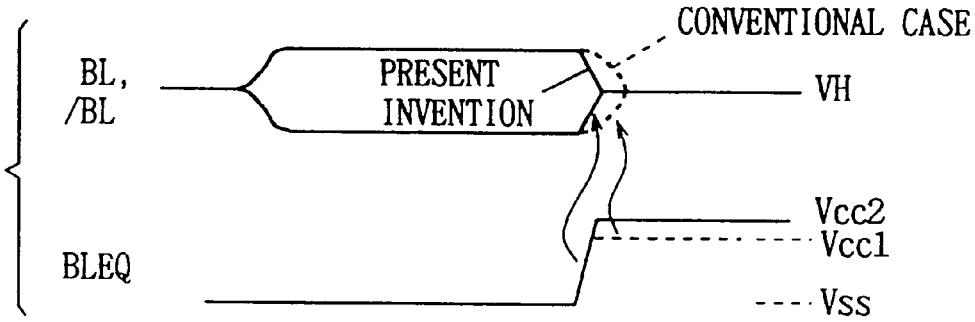
FIG. 25 is a signal waveform diagram showing operation of the structure shown in FIG. 23.

Then, as shown in FIG. 25, bit line equalize signal BLEQ increases to the voltage level of second internal power supply voltage Vcc2. Intermediate voltage VH always holds a constant voltage level of Vcc1/2. MOS transistors 18–20 each have their conductance made larger than the case where they receive first internal power supply voltage Vcc1 at their gates. MOS transistors 18–20 charge/discharge bit lines BL and /BL at a high speed, setting the bit lines to the intermediate voltage VH level. More specifically, in MOS transistor 18, the source potential is intermediate voltage VH (=Vcc1/2 ), the gate potential is Vcc2 (>Vcc1), and the gate-source voltage is Vcc2−VH (>Vcc1/2 ), resulting in a large current flow. In MOS transistors 19 and 20, the source potential is ground voltage Vss (=0), and the gate potential is second internal power supply voltage Vcc2, resulting in a large current flow similarly. Therefore, as shown in FIG. 25, even if the voltage level of first internal power supply voltage Vcc1 is reduced for low power consumption, bit lines BL and /BL can be precharged to intermediate voltage VH at a high speed after completion of a memory cycle, making it possible to implement a semiconductor memory device operating at a high speed even at the time of operation under low power supply voltage.

Figure 26:
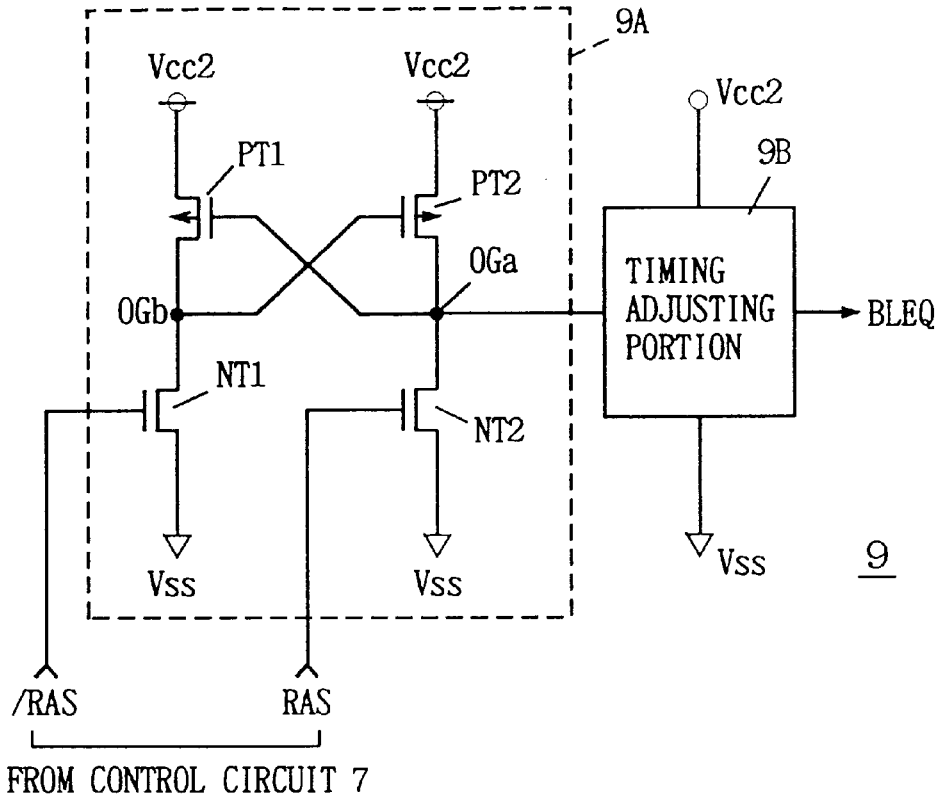
FIG. 26 is a diagram showing a structure example of a BLEQ generating circuit shown in FIG. 23.

FIG. 26 is a diagram schematically showing a structure of BLEQ generating circuit 9 shown in FIG. 23. Control circuit 7 receives first internal power supply voltage Vcc1 from internal Vcc generating circuit 4 as shown in FIG. 23. Therefore, the "H" level of an output signal from control circuit 7 is the first internal power supply voltage Vcc1 level. BLEQ generating circuit 9 operates with second internal power supply voltage Vcc2 as one operation power supply voltage, and generates signal BLEQ of "H" at the second internal power supply voltage Vcc 2 level. Therefore, a function of converting the "H" level of an output signal from control circuit 7 into the second power supply voltage Vcc2 level is required for BLEQ generating circuit 9.

Referring to FIG. 26, BLEQ generating circuit 9 includes a level converting portion 9A generating from an output node OGa an internal control signal having an amplitude at the second internal power supply voltage Vcc2 level in response to internal row address strobe signals RAS and /RAS applied from control circuit 7, and a timing adjusting portion 9B adjusting a timing in response to an output signal from level converting portion 9A for activating/deactivating bit line equalize signal BLEQ at a prescribed timing. Level converting portion 9A includes an n channel MOS transistor NT1 discharging a node OGb to the ground voltage Vss level in response to internal control signal /RAS from control circuit 7, an n channel MOS transistor NT2 discharging output node OGa to the ground voltage Vss level in response to internal control signal RAS from control circuit 7, a p channel MOS transistor PT1 rendered conductive in response to the potential of output node OGa for charging node OGb to the second internal power supply voltage Vcc2 level, and a p channel MOS transistor PT2 charging node OGa to the second power supply voltage Vcc2 level in response to the potential on node OGb. Timing adjusting portion 9B operates with second internal power supply voltage Vcc2 and ground voltage Vss as its operation power supply voltages. Timing adjusting portion 9B is configured of buffers of inverters of an even number of stages, for example. Operation will now be described briefly.

Signal RAS and signal /RAS are complementary to each other. When signal RAS is at "H" at the first internal power supply voltage Vcc1 level, MOS transistor NT2 is turned on, and MOS transistor NT1 is turned off. Output node OGa is discharged by MOS transistor NT2 to attain the ground voltage Vss level. When output node OGa is at the ground voltage Vss level, MOS transistor PT1 is turned on, node OGb is charged to the second internal power supply voltage Vcc2 level, and MOS transistor PT2 is turned off.

When signal RAS is at the ground voltage Vss level, MOS transistor NT2 is turned off, and MOS transistor NT1 is turned on. Node OGb is discharged to the ground voltage Vss level, MOS transistor PT2 is turned on, and output node OGa is charged to the second internal power supply voltage Vcc2 level. Accordingly, MOS transistor PT1 is turned off. Timing adjusting portion 9B provides bit line equalize signal BLEQ according to the signal potential on node OGa.

[Specific Structure of Internal Power Supply Voltage Generating Circuit]

Figure 27:
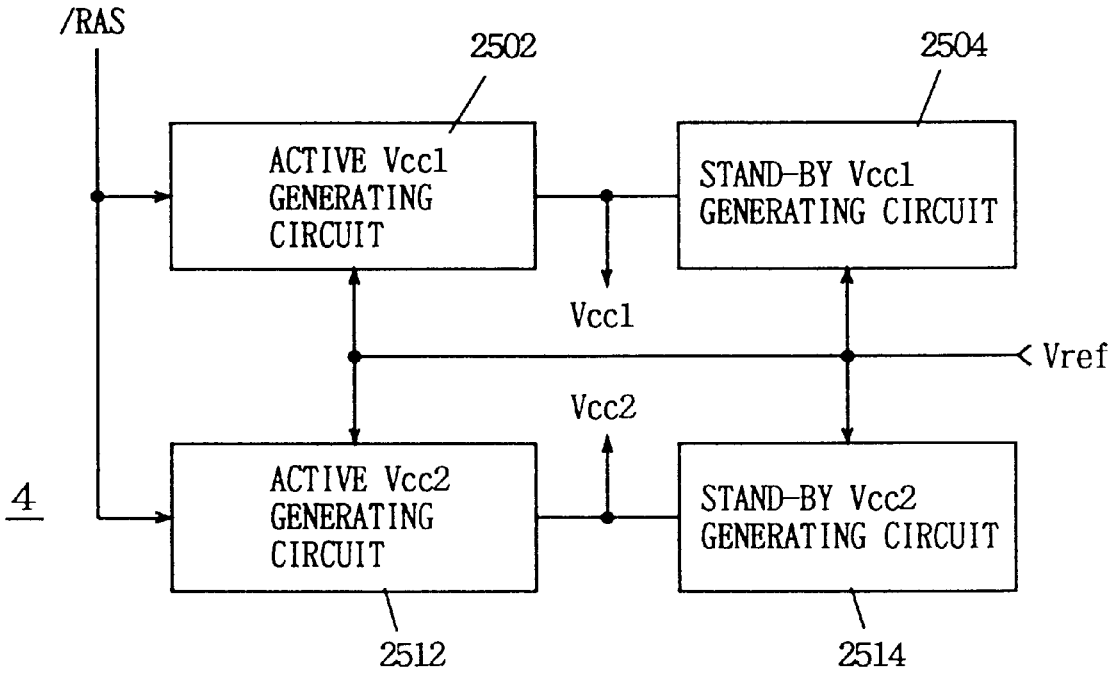
FIG. 27 is a block diagram schematically showing a structure of an internal Vcc generating circuit shown in FIG. 23.

FIG. 27 is a diagram schematically showing a structure of the internal Vcc generating circuit shown in FIG. 23. Referring to FIG. 27, internal Vcc generating circuit 4 includes an active Vcc1 generating circuit 2502 activated at the time of activation of internal row address strobe signal /RAS for generating first internal power supply voltage Vcc1 according to reference voltage Vref, a stand-by Vcc1 generating circuit 2504 operating with low current consumption for providing first internal power supply voltage Vcc1 according to reference voltage Vref, an active Vcc2 generating circuit 2512 activated at the time of activation of internal row address strobe signal /RAS for generating second internal power supply voltage Vcc2 based on reference voltage Vref, and a stand-by Vcc2 generating circuit 2514 always operating with low power consumption for generating second internal power supply voltage Vcc2 based on reference voltage Vref.

At the time of activation of signal /RAS, that is, in a cycle where memory selecting operation and data writing/reading operation of a semiconductor memory device are carried out, internal power supply voltages Vcc1 and Vcc2 are used. Therefore, by bringing active Vcc1 generating circuit 2502 and active Vcc2 generating circuit 2512 having large current drivability to an operative state, internal power supply voltages Vcc1 and Vcc2 are stabilized. At the time of stand-by of a semiconductor memory device, internal power supply voltages Vcc1 and Vcc2 are not used. The voltage level is only changed by leakage current or the like. Only stand-by Vcc1 generating circuit 2504 and stand-by Vcc2 generating circuit 2514 consuming small power are operated to generate internal power supply voltages Vcc1 and Vcc2. As a result, current consumption at the time of stand-by is reduced.

Figure 28:
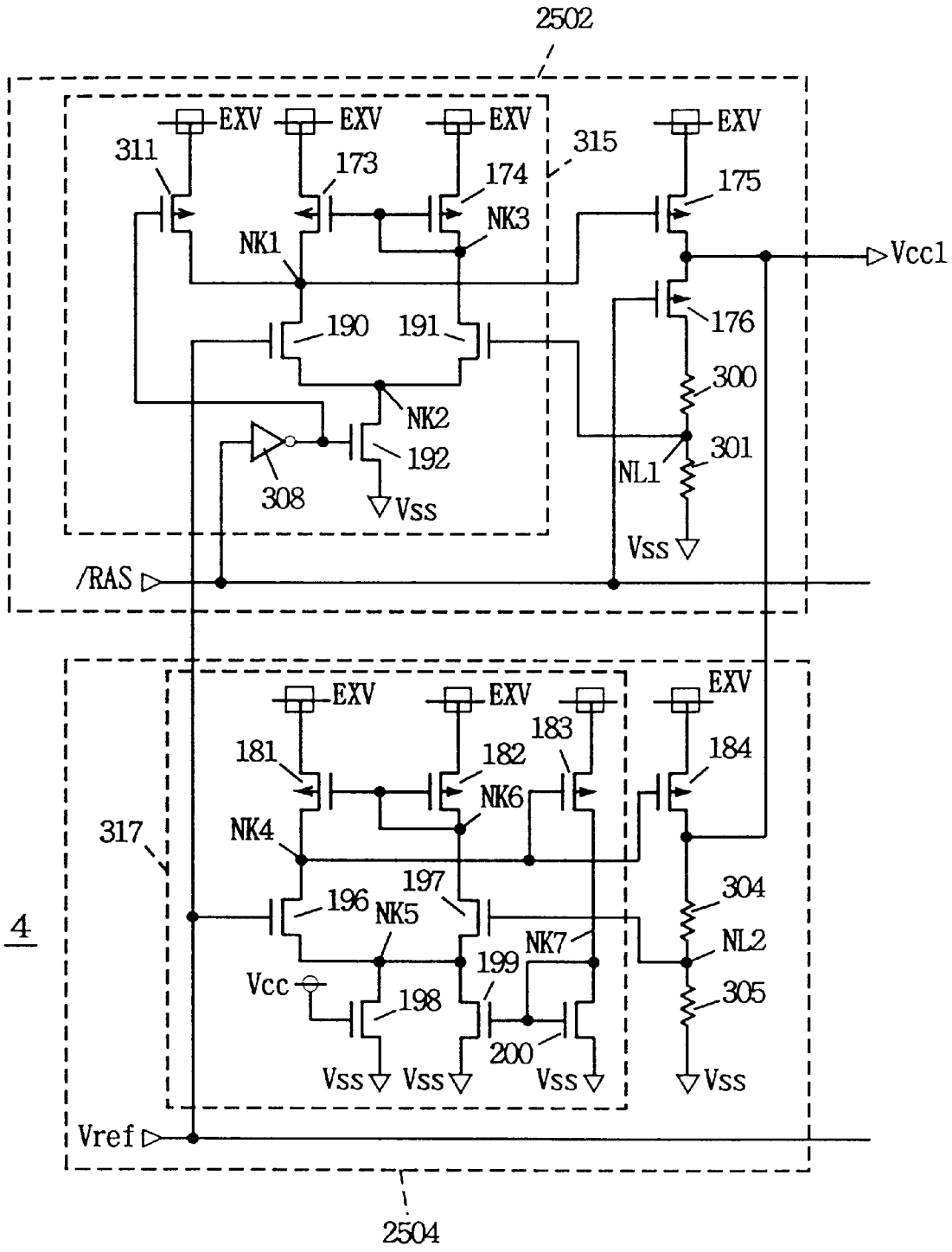
FIG. 28 is a diagram showing a specific configuration of an active Vcc1 generating circuit and a stand-by Vcc1 generating circuit shown in FIG. 27.

FIG. 28 is a diagram showing a specific structure of active Vcc1 generating circuit 2502 and stand-by Vcc1 generating circuit 2504 shown in FIG. 27. Referring to FIG. 28, active Vcc1 generating circuit 2502 includes a current mirror type amplifying circuit 315 activated at the time of activate of internal row address strobe signal /RAS, a p channel MOS transistor 175 supplying current form external power supply node EXV to output node (internal power supply node) Vcc1 in response to an output signal from current mirror type amplifying circuit 315, and a p channel MOS transistor 176 and resistors 300 and 301 connected in series between output node Vcc1 and ground node Vss. p channel MOS transistor 176 receives signal /RAS at its gate. The ratio of the resistance values of resistors 300 and 301 is set to 2:3. Actual resistance values of resistors 300 and 301 are determined by an allowable current value of the internal power supply voltage generating circuit. By level-converting (voltage-dividing) internal power supply voltage Vcc1 by resistors 300 and 301, current mirror type amplifying circuit 315 is operated in the MOS sensitive region.

Current mirror type amplifying circuit 315 includes an inverter 308 inverting signals /RAS, a p channel MOS transistor 311 rendered conductive in response to an output signal from inverter 308 for transmitting external power supply voltage EXV to the gate of MOS transistor 175 through a node NK1, a p channel MOS transistor 173 provided between node NK1 and external power supply node EXV and having its gate connected to a node NK3, a p channel MOS transistor 174 provided between external power supply node EXV and node NK3 and having its gate connected to node NK3, an n channel MOS transistor 190 provided between node NK1 and a node NK2 and receiving reference voltage Vref at its gate, an n channel MOS transistor 191 provided between node NK3 and node NK2 and receiving the voltage of a connection node NL1 between resistors 300 and 301 at its gate, and an n channel MOS transistor 192 rendered conductive in response to an output signal from inverter 308 for electrically connecting node NK2 to ground node Vss.

MOS transistors 173 and 174 configure a current mirror circuit, and MOS transistors 190 and 191 configure a comparing portion. Inverter 308 operates with external power supply voltage EXV as one operation power supply voltage, and provides a signal of "H" at the external power supply voltage EXV level when signal /RAS is at the "L" level. Signal/RAS is provided from control circuit 7 shown in FIG. 23. When signal /RAS has an amplitude at the internal power supply voltage Vcc1 level, a structure is used in which level conversion is carried out in inverter 308. Level conversion of signal /RAS may be carried out in the preceding stage (level conversion from the Vcc1 level to the external power supply voltage EXV level).

Stand-by Vcc1 generating circuit 2504 includes a current mirror type amplifying circuit 317, a p channel MOS transistor 184 supplying current from external power supply node EXV to internal power supply node Vcc1 in response to an output signal from current mirror type amplifying circuit 317, and resistors 304 and 305 connected in series between internal power supply node Vcc1 and ground node Vss. The ratio of the resistance values of resistors 304 and 305 is set to 2:3 similar to the case of resistors 300 and 301. The resistance values of resistors 304 and 305 are set to be large for reducing current consumption at the time of stand-by. The large resistance values of resistors 304 and 305 cause large RC delay together with a parasitic capacitance of internal power supply node Vcc1. Even when the potential of a node NL2 changes slowly, internal power supply voltage Vcc1 changes gently at the time of stand-by. Therefore, stand-by Vcc1 generating circuit 2504 can correspond to the change of internal power supply voltage Vcc1 sufficiently to return the changed internal power supply voltage Vcc1 to a prescribed voltage level.

Current mirror type amplifying circuit 317 includes an n channel MOS transistor 196 provided between a node NK4 and a node NK5 and receiving reference voltage Vref at its gate, an n channel MOS transistor 197 provided between a node NK6 and node NK5 and receiving the signal potential on node NL2 (connection node between resistors 304 and 305) at its gate, a p channel MOS transistor 181 connected between external power supply node EXV and node NK4 and receiving the signal potential of node NK6 at its gate, a p channel MOS transistor 182 provided between external power supply node EXV and node NK6 and having its gate connected to node NK6, an n channel MOS transistor 199 provided between node NK5 and ground node Vss and having its gate connected to a node NK7, an n channel MOS transistor 200 connected between node NK7 and ground node Vss and having its gate connected to node NK7, a p channel MOS transistor 183 provided between node NK7 and internal power supply node EXV and having its gate connected to node NK6, and an n channel MOS transistor 198 provided between node NK5 and ground node Vss and receiving internal power supply voltage Vcc at its gate.

MOS transistor 198 serves as a current source providing a current path for MOS transistors 196 and 197. Internal power supply voltage Vcc applied to the gate of MOS transistor 198 may be either first internal power supply voltage Vcc1 or second internal power supply voltage Vcc2. One of the internal power supply voltages is selected according to an allowable current value of MOS transistor 198. From the standpoint of low current consumption, first internal power supply voltage Vcc1 is preferably applied to the gate of MOS transistor 198.

MOS transistors 181 and 182 configure a current mirror circuit, and MOS transistors 199 and 200 configure a current mirror circuit. Operation will now be described.

Operation of active Vcc1 generating circuit 2502 will be first described. When signal /RAS is at the "H" level in a non-active state, an output signal from inverter 308 is at the "L" level, and MOS transistor 192 is turned off, whereby a current path of MOS transistors 173, 174, 190 and 191 is disconnected. MOS transistor 311 is rendered conductive in response to an output signal from inverter 308, and transmits external power supply voltage EXV to the gate of MOS transistor 175 through node NK1. Accordingly, MOS transistor 175 is turned off.

When signal /RAS is at the "H" level, signal /RAS is at the internal power supply voltage Vcc1 level or the external power supply voltage EXV level higher than the same (when level conversion is carried out), bringing MOS transistor 176 to an off state. As a result, a path through which current flows from internal power supply node Vcc1 to ground node Vss is disconnected. At the time of stand-by when signal /RAS is in a non-active state, operation of adjusting internal power supply voltage Vcc1 by active Vcc1 generating circuit 2502 is not carried out. In addition, there is no current flow in resistors 300 and 301. Therefore, current consumption of active Vcc1 generating circuit 2502 at stand-by can be reduced to approximately 0.

When signal /RAS attains the "L" level in an active state, an output signal from inverter 308 attains "H" at the external power supply voltage EXV level,. MOS transistor 311 is turned off, and MOS transistor 192 is turned on. A current path for MOS transistors 173, 174, 190, and 191 is formed, and current mirror type amplifying circuit 314 is brought to an operative state. MOS transistor 176 is turned on by signal /RAS at the "L" level, and the potential of node NL1 attains 3·Vcc1/5. When the potential of node NL1 is higher than reference voltage Vref, the conductance of MOS transistor 191 is higher than that of MOS transistor 190, so that a current flow through MOS transistor 191 becomes larger than that through MOS transistor 196. MOS transistors 173 and 174 configure a current mirror circuit. When MOS transistors 173 and 174 are the same in size, there is a current flow through MOS transistor 173 of the same magnitude as that through MOS transistor 174. Current flowing through MOS transistor 173 has the same magnitude as that through MOS transistor 191. Therefore, the potential of node NK1 increases, and the conductance of MOS transistor 175 is made smaller, thereby decreasing the amount of current supply. When the potential of node NK1 increases up to EXV−|Vthp|, MOS transistor 175 is turned off.

On the other hand, when the potential of node NL1 is lower than reference voltage Vref, the conductance of MOS transistor 190 is larger than that of MOS transistor 191, so that a current flow through MOS transistor 190 becomes larger than that through MOS transistor 191. By current mirror operation of MOS transistors 173 and 174, a current flow amount through MOS transistor 173 is smaller than the amount of current which MOS transistor 190 can drive. Therefore, the potential of node NK1 deceases. As a result, the conductance of MOS transistor 175 becomes larger, and current is supplied to internal power supply node Vcc1 from external power supply node EXV, thereby increasing internal power supply voltage Vcc1.

The above series of operation causes current mirror type amplifying circuit 310 to adjust the gate potential of MOS transistor 175 so that the potential of node NL1 is equal to reference voltage Vref. Since the potential of node NL1 is 3·Vcc1/5, internal power supply voltage Vcc1=5·Vref/3 is generated. When reference voltage Vref is 1.5 V, internal power supply voltage Vcc1 is 2.5 V.

With a structure in which a current flow through resistors 300 and 301 is disconnected using MOS transistor 176 at the time of stand-by, the resistance values of resistors 300 and 301 can be set smaller. Therefore, active Vcc1 generating circuit 2502 can change the potential of node NL1 at a high speed based on change of internal power supply voltage Vcc1 during operation, active Vcc1 generating circuit 2502 can adjust internal power supply voltage Vcc1 following change of internal power supply voltage Vcc1 at a high speed, and internal power supply voltage Vcc1 can be stabilized.

Description will now be given of operation of standby Vcc1 generating circuit 2504. Stand-by Vcc1 generating circuit 2504 always adjusts internal power supply voltage Vcc1. However, the resistance values of resistors 304 and 305 are set to relatively large values. Therefore, current consumption is lowered and the adjusting operation is relatively gently. MOS transistor 198 serving as a current source for a current mirror circuit (transistors 181 and 182) is always in an on state in reception of internal power supply voltage Vcc (Vcc1 or Vcc). However, the current drivability is made small, and the amount of current flowing through transistors 181, 182, 196, and 197 is made sufficiently small, thereby implementing low current consumption.

When the voltage level of internal power supply voltage Vcc1 increases, and the potential of node NL2 becomes higher than reference voltage Vref accordingly, the conductance of MOS transistor 197 becomes larger than that of MOS transistor 196, so that a value of current flowing through MOS transistor 197 becomes larger than a value of current flowing through MOS transistor 196. The current flow through MOS transistor 197 is supplied through MOS transistor 182. The current through MOS transistor 182 is reflected in the current through MOS transistor 181 by current mirror operation. Therefore, the potential of node NK4 increases, the gate potentials of MOS transistors 183 and 184 increase, and the conductances of these transistors are made small. When the potential of node NK4 attains EXV−|Vthp|, MOS transistors 183 and 184 are turned off. The current flowing from external power supply node EXV through MOS transistor 183 is applied to MOS transistor 200. Since MOS transistors 199 and 200 configure a current mirror circuit, the current flow through MOS transistor 199 is made smaller accordingly.

When the potential of node NL2 is lower than reference voltage Vref, the conductance of MOS transistor 196 is larger than that of MOS transistor 197, so that a value of current flowing through MOS transistor 196 becomes larger than a value of current flowing through MOS transistor 197. Mirror current of the current flowing through MOS transistor 197 is generated by MOS transistor 181 to be applied to MOS transistor 196. Therefore, the potential of node NK4 decreases, causing the conductances of MOS transistors 183 and 184 to increase. MOS transistor 184 supplies current from external power supply node EXV to internal power supply node Vcc1, thereby increasing the decreased internal power supply voltage Vcc1.

Since there is a larger current flow through MOS transistor 183 at the time, there is a larger current flow through MOS transistor 200. MOS transistor 191 is supplied with mirror current of the current flowing through MOS transistor 200. Therefore, there is a larger current flow from node NK5 to ground node Vss, making it possible to decrease the potential of node NK4 through MOS transistor 196 at a high speed. More specifically, by providing a p channel MOS transistor 183 receiving the potential of node NK4 at its gate, current mirror type amplifying circuit 317 is operated at a high speed with the increased operation current when internal power supply voltage Vcc1 is decreased. When internal power supply voltage Vcc1 is at a prescribed level or more, the operation current of current mirror type amplifying circuit 317 is applied only by MOS transistor 198 having a small current drivability, making it possible to reduce current consumption of stand-by Vcc1 generating circuit 2504.

As described above, active Vcc1 generating circuit 2502 having a large current drivability is operated at the time of operation of a semiconductor memory device, only stand-by Vcc1 generating circuit 2504 with a small current drivability and low current consumption is operated at the time of stand-by, and a current path of resistance elements for level conversion of active Vcc1 generating circuit 2502 is disconnected at the time of stand-by. As a result, a power supply voltage generating circuit operating stably with low current consumption can be implemented.

Figure 29:
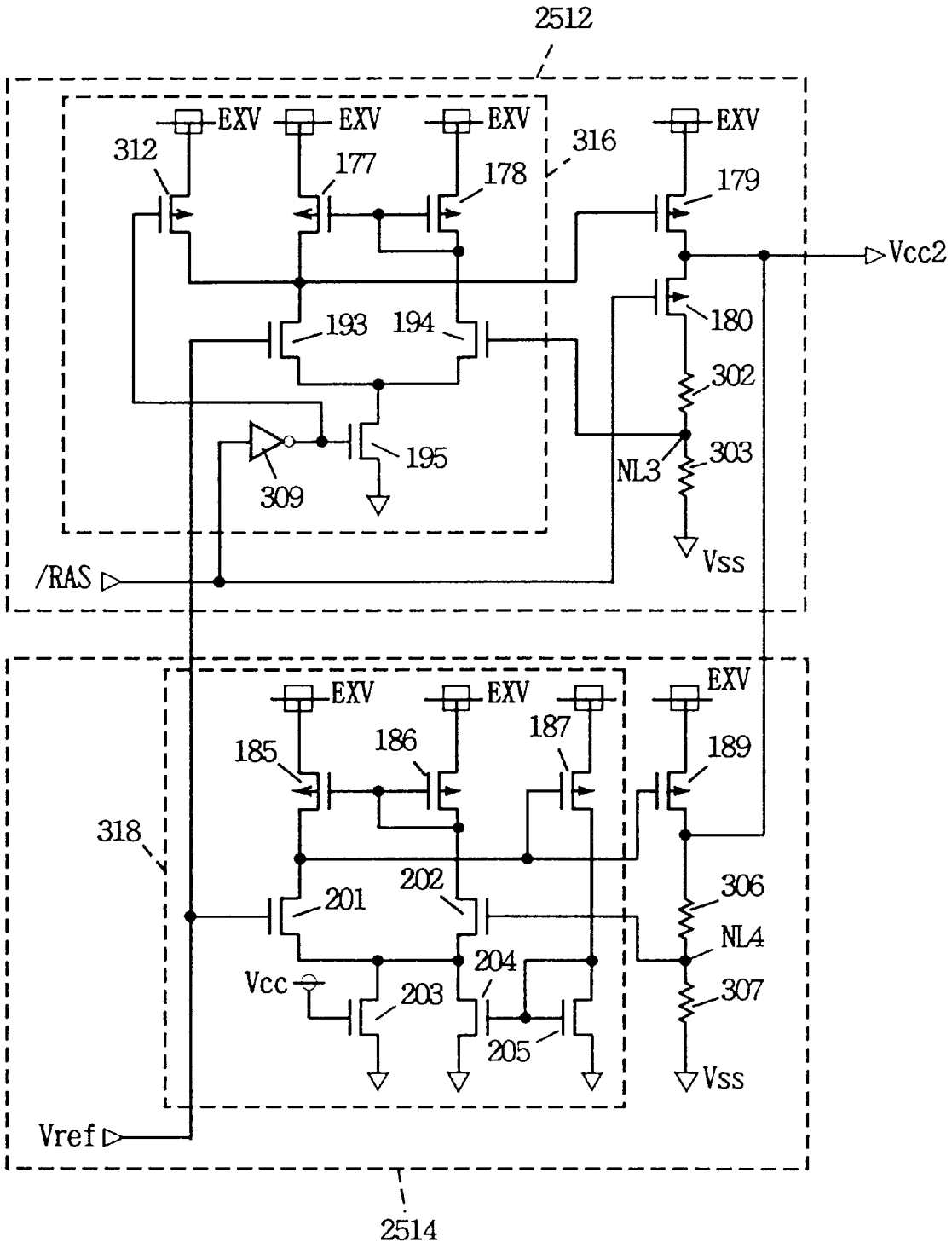
FIG. 29 is a diagram showing a specific configuration of an active Vcc2 generating circuit and a stand-by Vcc2 generating circuit shown in FIG. 27.

FIG. 29 is a diagram showing a structure of active Vcc2 generating circuit 2512 and stand-by Vcc2 generating circuit 2514 shown in FIG. 27. Referring to FIG. 29, active Vcc2 generating circuit 2512 includes a current mirror type amplifying circuit 316 activated at the time of activation of signal /RAS, a p channel MOS transistor 179 supplying current from external power supply node EXV to internal power supply node Vcc2 in response to an output signal from current mirror type amplifying circuit 316, and a p channel MOS transistor 180 and resistors 302 and 303 connected in series between internal power supply node Vcc2 and ground node Vss. Signal /RAS is applied to the gate of MOS transistor 180. The ratio of the resistance values of resistors 302 and 303 is set to 1:1. More specifically, the voltage of Vcc2/2 is transmitted to node NL3 when MOS transistor 180 is rendered conductive. The resistance values of resistors 302 and 303 are determined according to the permissible current value of the internal power supply voltage generating circuit.

Current mirror type amplifying circuit 316 includes p channel MOS transistors 177 and 178 configuring a current mirror circuit, comparators 193 and 194 comparing reference voltage Vref and the potential of node NL3, an n channel MOS transistor 195 forming a current path for transistors 177, 178, 193 and 194, a p channel MOS transistor 312 rendered conductive at the time of deactivation of current mirror type amplifying circuit 316 for setting the gate potential of MOS transistor 179 to external power supply voltage EXV, and an inverter 309 inverting signal /RAS for bringing MOS transistors 312 and 195 to an on/off state in a complementary manner. The structure of active Vcc2 generating circuit 2512 is the same as that of active Vcc1 generating circuit 2502 shown in FIG. 28 except that the ratio of the resistance values of resistors 302 and 303 is 1:1.

Stand-by Vcc2 generating circuit 2514 includes a current mirror type amplifying circuit 318, a p channel MOS transistor 189 adjusting the voltage level of internal power supply voltage Vcc2 in response to an output signal from current mirror type amplifying circuit 318, and resistors 306 and 307 connected in series between internal supply power node Vcc2 and ground node Vss. Resistors 306 and 307 have their resistance values set to relatively large values, and the ratio of the resistance values is set to 1:1.

Current mirror type amplifying circuit 318 includes p channel MOS transistors 185 and 187 configuring a current mirror circuit, n channel MOS transistors 201 and 202 supplied with current from external power supply node EXV through these transistors 185 and 187 for configuring a comparison stage comparing reference voltage Vref and the potential of node NL4, an n channel MOS transistor 203 providing a current path for MOS transistors 185, 187, 201 and 202, and n channel MOS transistor 204 provided in parallel with MOS transistor 203, an n channel MOS transistor 205 configuring a current mirror current together with MOS transistor 204, and a p channel MOS transistor 188 supplying current from external power supply node EXV to MOS transistor 205 according to the gate potential of MOS transistor 189. The current drivability of MOS transistor 203 is made sufficiently small. The structure of stand-by Vcc2 generating circuit 2514 is similar to that of the stand-by Vcc1 generating circuit shown in FIG. 28 except that the ratio of the resistance values of resistors 306 and 307 is 1:1.

Operation of active Vcc2 generating circuit 2512 is the same as that of active Vcc2 generating circuit 2502 shown in FIG. 28. When signal /RAS is at the "H" level, MOS transistor 312 causes the gate potential of MOS transistor 179 to be set to external power supply voltage EXV. MOS transistor 179 is turned off. Similarly, MOS transistor 180 is turned off, disconnecting a path of current flowing from internal power supply node Vcc2 ground node Vss through resistors 302 and 303. Accordingly, current consumption of active Vcc2 generating circuit 2512 at the time of stand-by is made approximately 0. When signal /RAS attains the "L" level, an output signal from inverter 309 rises to the internal power supply voltage EXV level. As a result, the conductance of MOS transistor 179 is adjusted by current mirror type amplifying circuit 316 according to the relation between the potential of node NL3 (Vcc2/2) and reference voltage Vref, and internal power supply voltage Vcc2 is set to a constant value. When reference voltage Vref is 1.5 V, internal power supply voltage Vcc2 is 3.0 V, which corresponds to 2·Vref.

Operation of stand-by Vcc2 generating circuit 2514 is the same as that of stand-by VCC1 generating circuit 2504 shown in FIG. 28. More specifically, when the potential of node NL4 is higher than reference voltage Vref, the gate potentials of MOS transistors 188 and 189 increase, thereby suppressing current supply from external power supply node EXV to internal power supply node Vcc2. At the time, a current flow through MOS transistor 204 is made small by a current mirror circuit configured of MOS transistors 204 and 205, so that current consumption of stand-by Vcc2 generating circuit 2512 is reduced. When the potential of node NL4 is lower than reference voltage Vref, more current flows through MOS transistor 201 than through MOS transistor 202, the gate potentials of MOS transistors 188 and 189 decrease, and internal power supply node Vcc2 is supplied with current through MOS transistor 189, with the potential recovered to the original potential level. At the time, current supplied to MOS transistor 205 by MOS transistor 188 also increases similarly, resulting in increase of a current flow through MOS transistor 204. Therefore, operation current of current mirror type amplifying circuit 318 determined by MOS transistor 203 and 204 increases, making it possible to carry out correction operation flowing change of internal power supply voltage Vcc2 at a high speed. By operating a current mirror type amplifying circuit at a high speed with its operation current increased only when required, reduction of current consumption of stand-by Vcc2 generating circuit 2514 is attempted.

By generating second internal power supply voltage Vcc2 higher than first internal power supply voltage Vcc1 using internal Vcc2 generating circuits 2512 and 2514 shown in FIG. 29, to apply the generated voltage to BLEQ generating circuit 9, the following advantage is obtained. Internal high voltage Vbb is higher than internal power supply voltage Vcc1 in voltage level. A circuit generating internal high voltage Vpp uses charge pump operation of a capacitor. In general, when an internal high voltage is generated using charge pump operation of a capacitor, the internal high voltage is not generated using all generated electric charge. The conversion efficiency (coefficient $\eta$) is smaller than 1. Consider the case where the conversion efficiency of a charge pump circuit is 50%, for example. When internal high voltage Vpp uses 1 mA, external power supply voltage EXV must be used by 2 mA in order to compensate for 1 mA used by the internal high voltage. More specifically, when an internal voltage higher than first internal power supply voltage Vcc1 is generated, an internal voltage at a desired voltage level can be generated with lower power consumption by using the internal Vcc2 generating circuit shown in FIG. 29. Therefore, by generating bit line equalize signal BLEQ not with the internal high voltage from the Vpp generating circuit but with second internal power supply voltage Vcc2 from the Vcc2 generating circuit shown in FIG. 29, bit line equalize signal BLEQ at a prescribed voltage level can be generated with low power consumption. As a result, a semiconductor memory device operating at a high speed with low power consumption can be implemented.

Figure 30:
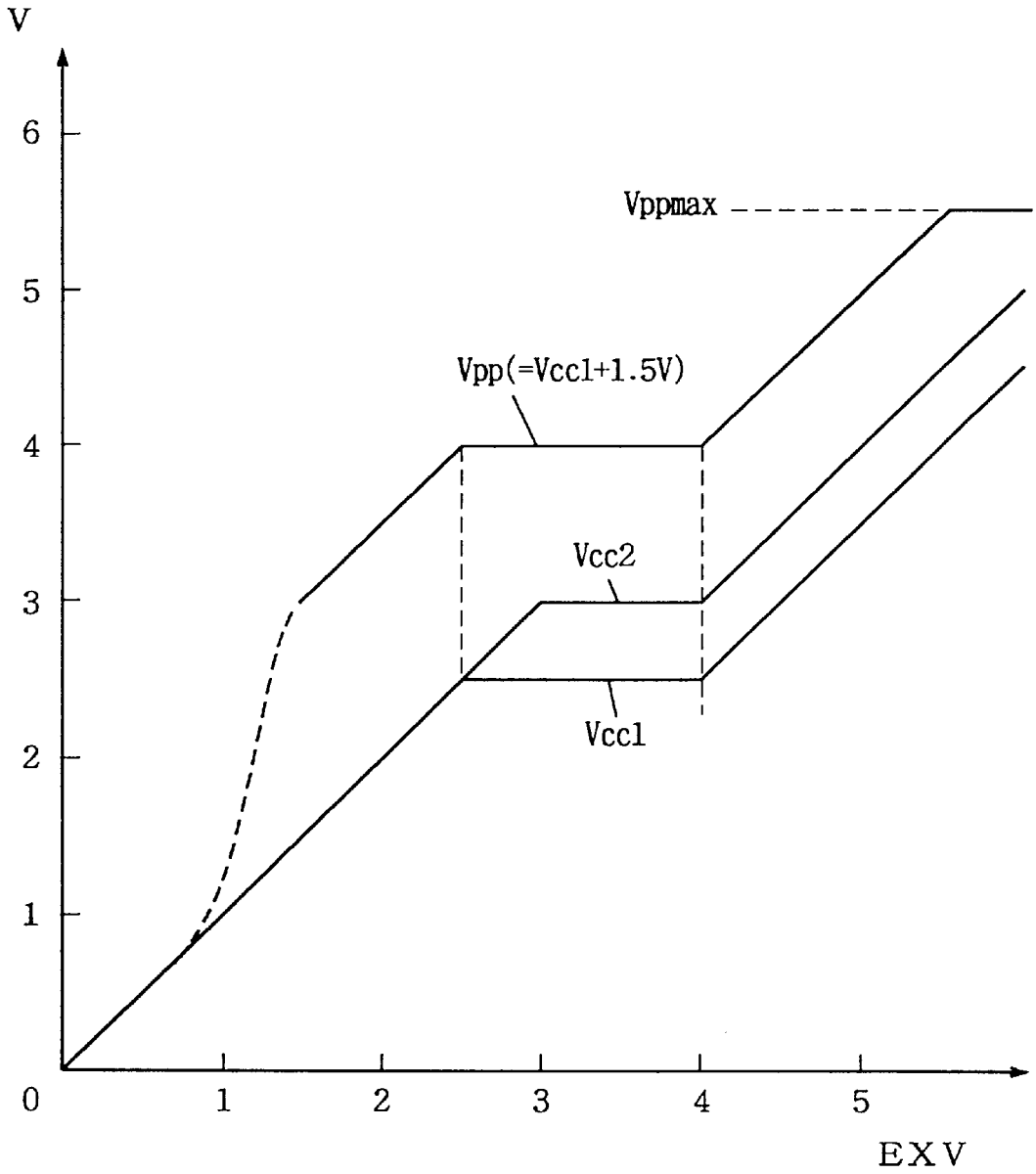
FIG. 30 is a diagram showing an internal voltage generated in the semiconductor memory device shown in FIG. 23.

FIG. 30 shows the relationship between internal power supply voltage Vcc1 and Vcc2 and internal high voltage Vpp. In FIG. 30, the horizontal axis represents external power supply voltage EXV and the longitudinal axis represents a voltage value. As external power supply voltage EXV rises from 0 V, reference voltage Vref rises accordingly (the structure of which will be described later). According to the rise of reference voltage Vref, the voltage levels of internal power supply voltages Vcc1 and Vcc2 also increase. Internal high voltage Vpp increases at a high speed with the rise of the voltage level of external power supply voltage EXV, because internal high voltage Vpp is generated by Charge pumping operation independently of reference voltage Vref. As shown by a broken line in FIG. 30, internal power supply voltage Vpp rapidly increases at the time when external power supply voltage EXV exceeds 1 V. This is because operation of an internal circuit is not stable, in internal node of the pump circuit does not have an amplitude of a sufficient magnitude, charge pumping operation is not carried out practically, and, when external power supply voltage EXV increases to a value larger than the threshold voltage |Vthp|, p channel MOS transistors configuring the circuit reliably turn on/off to stabilize internal pumping operation. When reference voltage Vref takes a constant value stably, first internal power supply voltage Vcc1 holds an approximately constant value. Even when reference voltage Vref is stable, second internal power supply voltage Vcc2 must rise to a voltage level two times the level of reference voltage Vref (in the case of the structure shown in FIG. 29), causing the stabilization to be delayed. When first internal power supply voltage Vcc1 takes a constant value, internal high voltage Vpp also takes a constant value.

These voltages Vpp, Vcc1, and Vcc2 increase when external power supply voltage EXV exceeds approximately 4.0 V. This is because a function (not shown) changing internal power supply voltage according to external power supply voltage EXV operates at the time of a burn-in mode operation, for example. In this case, it is structured such that internal high voltage Vpp does not exceed its maximum value Vppmax (the structure of which is not shown either).

Figure 31:
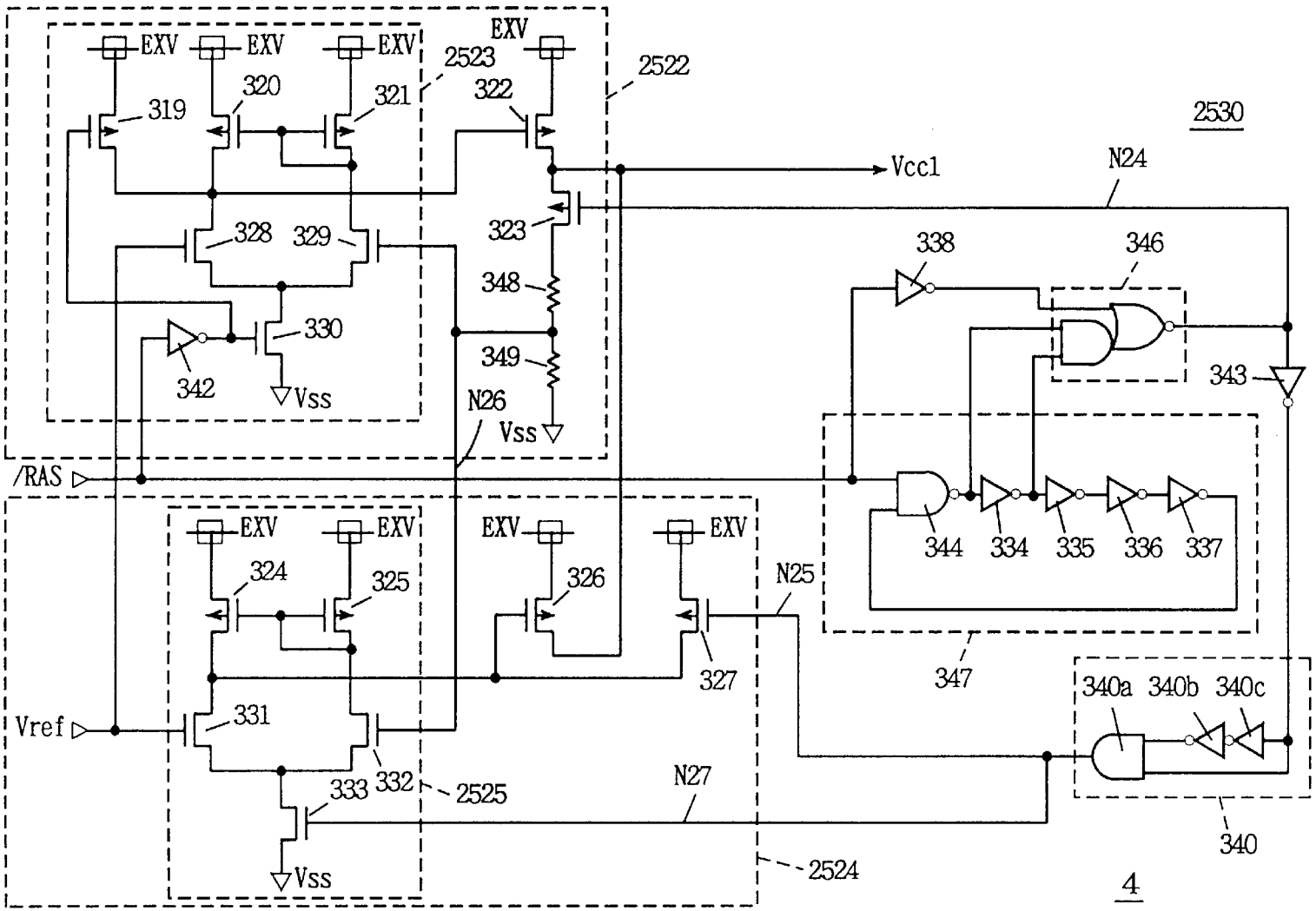
FIG. 31 is a diagram showing a further structure of an internal power supply voltage generating circuit according to the present invention.

B: Internal power supply voltage generating circuit 2:

FIG. 31 is a diagram showing a structure of a second embodiment of the internal power supply voltage generating circuit according to the present invention. In FIG. 31, a structure of a portion generating first internal power supply voltage Vcc1 is shown. A circuit generating second internal power supply voltage Vcc2 can be implemented using a similar structure.

Referring to FIG. 31, the internal power supply voltage generating circuit includes an active Vcc1 generating circuit 2522 activated at the time of activation of signal /RAS, a stand-by Vcc1 generating circuit 2524 activated intermittently in a prescribe period at the time of stand-by, and a control portion 2530 controlling activation/deactivation of stand-by Vcc1 generating circuit 2524. Control portion 2530 includes a structure in which conduction/non-conduction of a current path between internal power supply node Vcc1 and ground node Vss is controlled according to signal /RAS.

Active Vcc1 generating circuit 2522 includes a current mirror type amplifying circuit 2523 activated at the time of activation of signal /RAS, a p channel MOS transistor 322 supplying current from external power supply node EXV to internal power supply node Vcc1 in response to an output signal from current mirror type amplifying circuit 2523, and a p channel MOS transistor 320 and resistors 348 and 349 connected in series between internal power supply node Vcc1 and ground node Vss. P channel MOS transistor 323 is controlled on/off in response to a signal transmitted from control portion 2530 to a node N24. The ratio of the resistance values of resistors 348 and 349 is set to 2:3.

Current mirror type amplifying circuit 2523 includes an inverter 342 inverting signal /RAS, a p channel MOS transistor 319 transmitting external power supply voltage EXV to the gate of MOS transistor 322 in response to an output signal from inverter 342, p channel MOS transistors 320 and 321 configuring a current mirror circuit supplying current from external power supply node EXV, n channel MOS transistors 328 and 329 configuring a comparing portion comparing reference voltage Vref and the voltage on a node N26, and an n channel MOS transistor 330 forming a current path for transistors 320, 321, 328 and 329 in response to an output signal from inverter 342. The connection form of current mirror type amplifying circuit 2523 is the same as the case described with reference to FIGS. 28 and 29. Inverter 342 operates with external power supply voltage EXV as one operation power supply voltage. Inverter 342 includes a function of converting the "H" level of signal /RAS into the external power supply voltage EXV level (cf. the level converting circuit of FIG. 26 and the inverter of FIG. 4).

Stand-by Vcc1 generating circuit 2524 includes a current mirror type amplifying circuit 2525 activated intermittently in response to the signal potential on a node N27 for comparing reference voltage Vref and the signal voltage on node N26 at the time of activation, a p channel MOS transistor 326 supplying current from external power supply node EXV to internal power supply node Vcc1 in response to an output signal from current mirror type amplifying circuit 2525, and a p channel MOS transistor 327 transmitting external power supply voltage EXV from external power supply node EXV to the gate of MOS transistor 326 in response to the signal potential of a node N25 of control portion 2530.

Current mirror type amplifying circuit 2525 includes p channel MOS transistors 324 and 325 configuring a current mirror circuit supplying current from external power supply node EXV, n channel, MOS transistors 331 and 332 configuring a comparing portion comparing reference voltage Vref and the voltage on node N26, and an n channel MOS transistor 333 rendered conductive in response to the signal voltage on node N27 and forming a current path for MOS transistors 324, 325, 331, and 332. Stand-by Vcc1 generating circuit 2524 and active Vcc1 generating circuit 2522 share MOS transistor 323 and resistors 348 and 349 for generating a voltage to be compared. Accordingly, an area occupied by stand-by Vcc1 generating circuit 2524 is reduced.

Control portion 2530 includes a ring oscillator 347 carrying out oscillating operation when signal /RAS is deactivated at the "H" level, an inverter 338 inverting signal /RAS, an AND/NOR composite gate 346 receiving an output signal from inverter 338 and an input signal and an output signal from inverter 334 included in ring oscillator 347, an inverter 343 inverting an output signal from AND/NOR composite gate 346, and a pulse generating circuit 340 delaying the rising of an output signal from inverter 343 for output. A signal controlling on/off of MOS transistor 323 is provided from AND/NOR composite gate 346. A signal controlling activation/deactivation of stand-by Vcc1 generating circuit 2524 is provided from pulse generating circuit 340.

Figure 32:
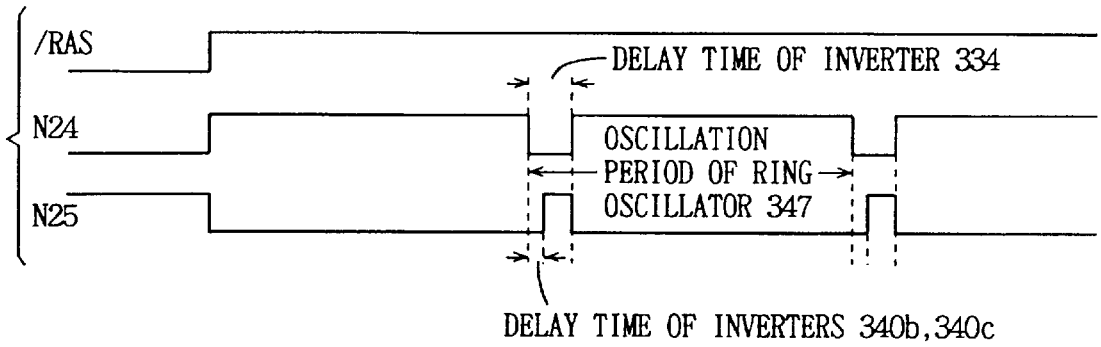
FIG. 32 is a signal waveform diagram showing operation of the circuit shown in FIG. 31.

Ring oscillator 347 includes an NAND gate 344 receiving signal /RAS at one input, and four stages of cascade-connected inverters 334, 335, 336, and 337 receiving an output from NAND gate 344. An output signal from inverter 337 is applied to the other input of NAND gate 334. Pulse generating circuit 340 includes two stages of cascade-connected inverters 340b and 340c receiving an output signal from inverter 343, and an AND gate 340a receiving an output signal from inverter 340b and an output signal from inverter 343. Operation of the circuit shown in FIG. 31 will now be described with reference to FIG. 32, which is the operation waveform diagram.

When signal /RAS is activated at the "L" level, an output signal from inverter 338 attains the "H" level, a signal provided from AND/NOR composite gate 340 to node N24 attains the "L" level, MOS transistor 323 is turned on, there is a current flow from internal power supply node Vcc1 to ground node Vss through resistors 348 and 349, and the voltage of node N26 attains a voltage level (3·Vcc1/5) corresponding to internal power supply voltage Vcc1. Here, the ratio of the resistance values of resistors 348 and 349 is set to 2:3. Signal /RAS is at the "L" level, an output signal from inverter 342 attains "H" at the external power supply voltage EXV level, MOS transistor 319 is turned off, and MOS transistor 330 is turned on. As a result, current mirror type amplifying circuit 2523 is brought to an operative state, controlling the gate potential of MOS transistor 322 according to the relation of a magnitude between the voltage on node N26 and reference voltage Vref, and adjusting the voltage level of internal power supply voltage Vcc1.

On the other hand, the voltage level of node N24 is at the "L" level, an output signal from inverter 348 attains the "H" level, an output signal from inverter 340b also attains the "H" level after a prescribed time, and an output signal from AND gate 340a attains the "H" level. As a result, after signal /RAS falls to the "L" level, and the potential on node N26 is stabilized, stand-by Vcc1 generating circuit 2524 is activated. More specifically, MOS transistor 327 is turned off, MOS transistor 333 is turned on, and the gate potential of MOS transistor 326 is adjusted according to the relation of a magnitude between the voltage on a node N26 and reference voltage Vref. Control portion 2530 uses external power supply voltage EXV or internal power supply voltage Vcc1 or Vcc2 as one operation power supply voltage. The current drivability of MOS transistor 333 is smaller than that of MOS transistor 330. The operation current of current mirror type amplifying circuit 2525 included in stand-by Vcc1 generating circuit 2524 is made smaller than that of current mirror amplifying circuit 2523 included in active Vcc1 generating circuit 2522.

When signal /RAS rises to the "H" level in a non-active state, an output signal from inverter 342 attains the "L" level. MOS transistor 330 is turned off, and MOS transistor 319 is turned on. The amplifying operation of current mirror type amplifying circuit 2523 is inhibited, external power supply voltage EXV is transmitted to the gate of MOS transistor 332 through MOS transistor 319, and MOS transistor 332 is turned off.

On the other hand, in response to signal /RAS at the "H" level, NAND circuit 344 functions as an inverter, and ring oscillator 347 carries out oscillating operation. Since an output signal from inverter 338 is at the "L" level, AND/NOR composite gate 346 provides a signal at "L" only when both an input signal and an output signal to and from inverter 334 included in ring oscillator 347 are at the "H" level (the duration period of which is determined to be a delay time of inverter 334). Other than that, an output signal from AND/NOR composite gate 346 is at the "H" level, and the signal potential on node N24 is at the "H" level. Therefore, MOS transistor 323 is turned off, and there is no current flow through resistors 348 and 349.

On the other hand, an output signal from inverter 343 attains the "L" level when the voltage on node N24 is at the "H" level, and an output signal from AND gate 340a attains the "L" level. In this state, MOS transistor 327 is turned on, MOS transistor 333 is turned off, current mirror type amplifying circuit 2525 included in stand-by Vcc1 generating circuit 2524 is brought to a non-active state, external power supply voltage EXV is transmitted to the gate of MOS transistor 326 through MOS transistor 327, and MOS transistor 326 is turned off.

When a period of ring oscillator 347 passes, and both an input signal and an output signal of inverter 334 attains the "H" level, an output signal from AND/NOR composite gate 346 attains the "L" level. As a result, MOS transistor 323 is turned on, there is a current flow from internal power supply node Vcc1 to ground node Vss through resistors 348 and 349, and the potential of node N26 changes according to the voltage level of internal power supply voltage vcc1.

On the other hand, an output signal from inverter 343 rises to the "H" level at the time, an output signal from pulse generating circuit 340 attains the "H" level after a prescribed time, MOS transistor 327 is turned off, and MOS transistor 333 is turned on. As a result, stand-by Vcc1 generating circuit 2524 is activated, the gate potential of MOS transistor 326 is adjusted according to the relation of a magnitude between the signal potential on node N26 and reference voltage Vref, and adjustment of current supply from external power supply node EXV to internal power supply node Vcc1 through MOS transistor 326 is carried out. If an input signal and an output signal of inverter 334 are complementary to each other in logic, an output signal from AND/NOR gate 346 attains the "H" level, and MOS transistor 323 is turned off. At the time, an output signal from inverter 343 attains the "L" level, an output signal from pulse generating circuit 340 attains the "L" level, and stand-by Vcc1 generating circuit 2524 is brought to a non-active state.

A period required for the potential on node N26 to stabilize after MOS transistor 323 is rendered conductive is determined by the resistance values of resistors 348 and 349 and the capacitance associated with node N26 (the gate capacitance of MOS transistors 329 and 332). This period is compensated for by a delay time provided by inverters 340b and 340c in pulse generating circuit 340. After the voltage of node N26 stabilizes, stand-by Vcc1 generating circuit 2524 is activated.

The potential of node N24 attains the "L" level depending on a period of ring oscillator 347 in the stand-by state. By ring oscillator 347 intermittently bringing stand-by Vcc1 generating circuit 2524 to an active state, current consumption of the stand-by Vcc1 generating circuit can be reduced, making it possible to implement a stand-by Vcc1 generating circuit with low current consumption. There is only intermittent current flow from internal power supply Vcc1 and ground node Vss. Therefore, current consumption at the time of stand-by can be reduced, resulting in an internal power supply voltage generating circuit with low power consumption.

When the structure shown in FIG. 31 is used for generating second internal power supply voltage Vcc2, the ratio of the resistance values of resistors 348 and 349 has only to be set to 1:1. At the time, control portion 2530 can be shared by the first internal power supply voltage Vcc1 generating circuit and the second internal power supply voltage Vcc2 generating circuit.

Figure 33:
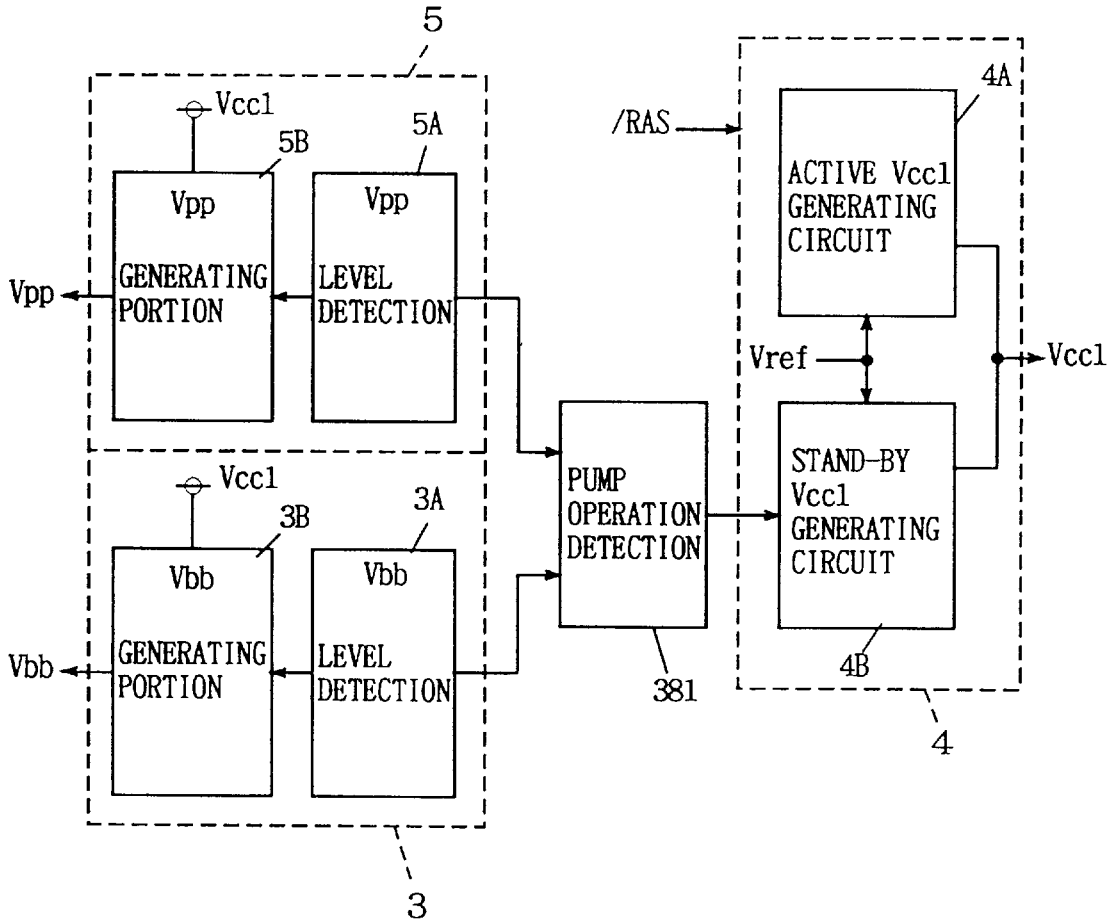
FIG. 33 is a diagram schematically showing a further structure of the internal power supply voltage generating circuit according to the present invention.

C: Internal power supply voltage generating circuit 3:

FIG. 33 is a diagram showing a structure of a third embodiment of the internal power supply voltage generating circuit according to the present invention. In FIG. 33, a structure of the internal power supply voltage generating circuit is shown in the case where a pump portion of an internal high voltage Vpp and/or negative voltage Vbb generating circuit operates using first internal power supply voltage Vcc1. When the Vpp generating circuit and Vbb generating circuit generate internal high voltage Vpp and negative voltage Vbb from second internal power supply voltage Vcc2 by charge pumping operation, respectively, the structure is shown in FIG. 33 is applied to an internal power supply voltage generating portion generating second internal power supply voltage Vcc2.

Referring to FIG. 33, Vpp generating circuit 5 generating internal high voltage Vpp includes a Vpp level detecting circuit 5A detecting the level of internal high voltage Vpp, and a Vpp generating portion 5B generating internal high voltage Vpp by charge pumping operation in response to an output signal from Vpp level detecting circuit 5A. Vpp generating portion 5B operates with internal power supply voltage Vcc1 as one operation power supply voltage. When Vpp level detecting circuit 5A indicates that internal high voltage Vpp is at a prescribed level or less, Vpp generating portion 5B has its charge pumping operation activated.

Vbb generating circuit 3 generating negative voltage Vbb includes a Vbb level detecting circuit 3A detecting the level of negative voltage Vbb, and a Vbb generating portion 3B generating negative voltage Vbb by charge pumping operation in response to an output signal from Vbb level detecting circuit 3A. Vbb generating portion 3B operates with internal power supply voltage Vcc1 as one operation power supply voltage, and generates negative voltage Vbb from first internal power supply voltage Vcc1 by charge pumping operation, When Vbb level detecting circuit 3A indicates that negative voltage Vbb is at a level higher than a prescribed level, Vbb generating portion 3B has its charge pumping operation activated.

A pump operation detecting circuit 381 detects at least one of Vpp generating portion 5B and Vbb generating portion 3B operating in response to output signals from Vpp level detecting circuit 5A and Vbb level detecting circuit 3A.

Internal power supply voltage generating circuit 4 includes an active Vcc1 generating circuit 4A activated in response to row address strobe signal /RAS for generating internal power supply voltage Vcc1 at a prescribed voltage level, and a stand-by Vcc1 generating circuit 4B for generating internal power supply voltage Vcc1 with its operation current adjusted according to an output signal from pump operation detecting circuit 381. Stand-by Vcc1 generating circuit 4B has its operation current increased when pump operation detecting circuit 381 detects at least one of Vpp generating portion 5B and Vbb generating portion 3B operating. At the time of stand-by, the operation current of stand-by Vcc1 generating circuit 4B is increased only in a period when internal power supply voltage Vcc1 is used, thereby suppressing change of internal power supply voltage Vcc1. When neither Vpp generating portion 5B nor Vbb generating portion 3B operates at the time of stand-by, the operation current of stand-by Vcc1 generating circuit 4B is made small. Accordingly, it is intended to reduce current consumption at the time of stand-by as an average value. The specific circuit configuration will now be described.

Figure 34:
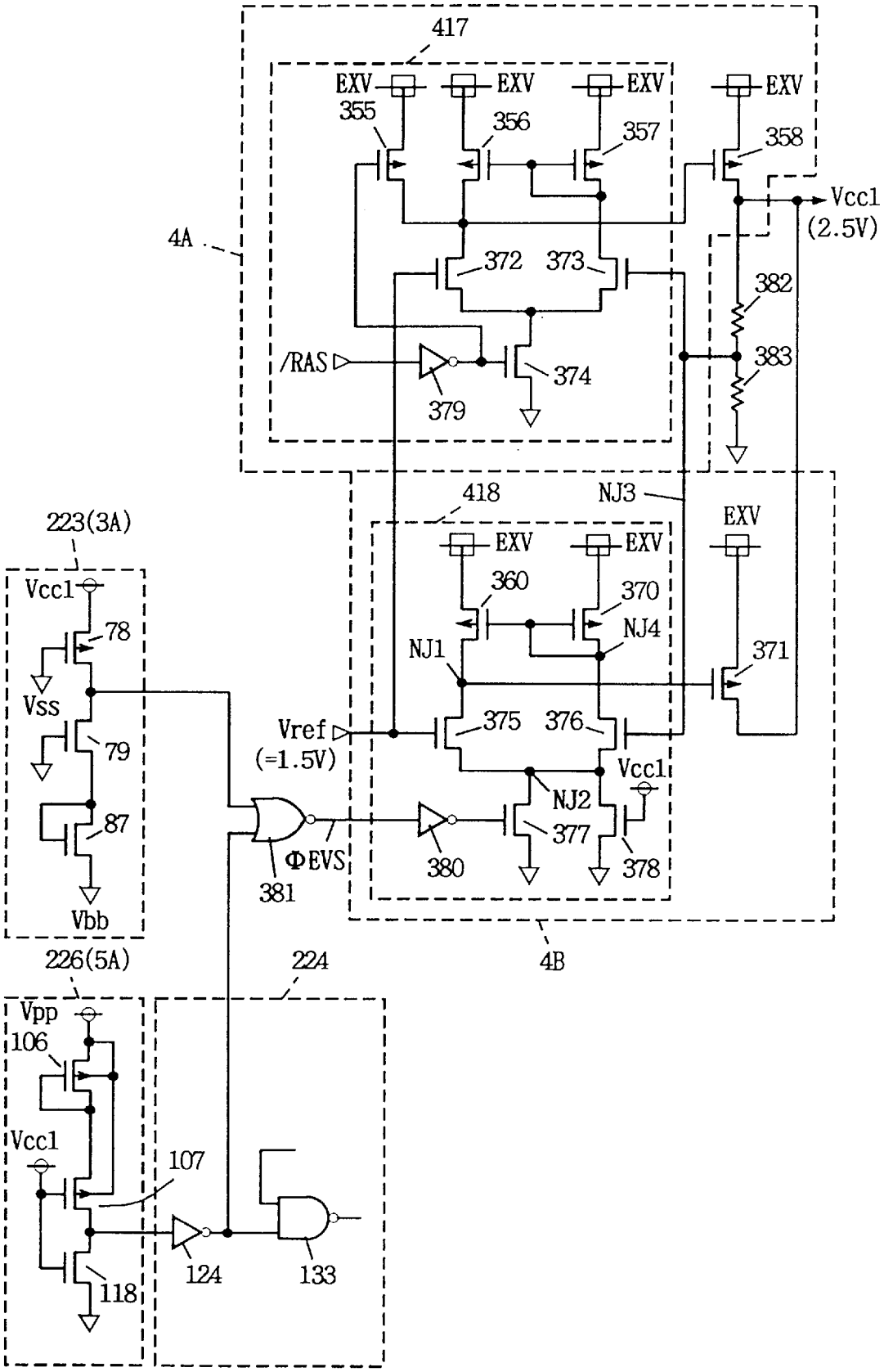
FIG. 34 is a diagram showing a specific configuration of the internal power supply voltage generating circuit shown in FIG. 33.

FIG. 34 is a diagram showing the specific structure of internal power supply voltage generating circuit 4 shown in FIG. 33. Referring to FIG. 34, Vbb level detecting circuit 223 (3A) includes p channel MOS transistor 78 and n channel MOS transistors 79 and 87 connected in series between an internal power supply node Vcc1 and negative voltage node Vbb. P channel MOS transistor 78 serves as a high resistance element with its gate connected to ground voltage node Vss. N channel MOS transistor 79 serves as a level detecting element with its gate connected to ground node Vss. MOS transistor 87 has its gate and drain interconnected, and operates as a diode element causing voltage drop of the threshold voltage Vthn when rendered conductive. Vbb level detecting circuit 223 provides a signal at the "L" level when negative voltage Vbb attains −2·Vthn or less, and provides a signal at the "H" level otherwise.

Vpp level detecting circuit 226 (5A) detecting the level of internal high voltage Vpp includes p channel MOS transistors 106 and 107 and n channel MOS transistor 118 connected in series between internal power supply node Vpp and ground node Vss. P channel MOS transistor 106 has its gate and drain interconnected and serves as a diode element causing voltage drop of |Vthp| when rendered conductive. P channel MOS transistor 107 receives internal power supply voltage Vcc1 at its gate, and serves as a switching element turning on/off according to the source potential. N channel MOS transistor 118 receives internal power supply voltage Vcc1 at its gate, and serves as a high resistance element. Vpp level detecting circuit 226 provides a signal at the "H" level when internal high voltage Vpp attains Vcc1+2|Vthp| or more, and provides a signal at the "L" level otherwise. Pump operation detecting circuit 381 provides a signal ΦEVS indicating the presence or absence of pumping operation in response to an output signal from Vbb level detecting circuit 223 and an output signal from Vpp level detecting circuit 226. In FIG. 34, the case is shown as one example where pump operation detecting circuit 381 is formed of a two-input NOR gate receiving an inverted signal of an output signal from Vbb level detecting circuit 223 and an output signal of Vpp level detecting circuit 226 for matching of an input signal logic. To two-input NOR gate (pump operation detecting circuit) 381, applied is an output signal from inverter 124 included in pump drive signal generating circuit 224 generating a pump drive signal in response to an output signal from Vpp level detecting circuit 226.

Active Vcc1 generating circuit 4A includes a current mirror type amplifying circuit 417 activated at the time of activation of row address strobe signal /RAS, and a p channel MOS transistor 358 supplying current from external power supply node EXV to internal power supply node Vcc1 in response to an output signal from current mirror type amplifying circuit 417 and generating internal power supply voltage Vcc1 at a prescribed voltage level.

Current mirror type amplifying circuit 417 includes an inverter 379 inverting signal /RAS, a p channel MOS transistor 355 transmitting external power supply voltage EXV to the gate of MOS transistor 358 in response to an output signal from inverter 379, p channel MOS transistors 356 and 357 connected to external power supply node EXV and configuring a current mirror circuit, n channel MOS transistors 372 and 373 configuring an output stage, and an n channel MOS transistor 374 forming a current path for MOS transistors 356, 357, 372, and 373 in response to an output signal from inverter 379. Reference voltage Vref (for example, 1.5 V) is applied to the gate of MOS transistor 372. A voltage which appears at a connection node between resistors 382 and 383 is applied to the gate of MOS transistors 373. Resistors 382 and 383 are connected in series between internal power supply node Vcc1 and ground node Vss. The ratio of the resistance values is set to 2:3. As a result, a voltage of 3·Vcc1/5 is applied to the gate of MOS transistor 373.

Operation of this active Vcc1 generating circuit is the same as operation of the active Vcc1 generating circuit included in the internal power supply voltage generating circuit described before. More specifically, activation of signal /RAS at the "L" level causes a signal of "H" at the external power supply voltage EXV level to be provided from inverter 379, MOS transistor 355 to be turned off, MOS transistor 374 to be turned on, and current mirror type amplifying circuit 417 to be brought to an active state. When internal power supply voltage Vcc1 is higher than a prescribed voltage level (5·Vref/3), the conductance of MOS transistor 373 is larger than the conductance of MOS transistor 372. MOS transistors 356 and 357 configuring a current mirror circuit cause the gate potential of MOS transistor 358 to be increased, and current supply from external power supply node EXV to internal power supply node Vcc1 to be reduced or stopped. When internal power supply voltage Vcc1 is lower than a prescribed voltage level, the voltage level of an output signal from current mirror type amplifying circuit 417 is decreased, and the amount of current MOS transistor 358 supplies to internal power supply node Vcc1 from external power supply node EXV is increased.

When signal /RAS attains the "H" level, MOS transistor 355 is turned on, MOS transistor 374 is turned off, current mirror type amplifying circuit 417 is brought to a non-active state, and the gate of MOS transistor 358 is set to external power supply voltage EXV. More specifically, active Vcc1 generating circuit 4A carries out adjusting operation of internal power supply voltage Vcc1 only at the time of activation of signal /RAS.

Stand-by Vcc1 generating circuit 4B includes a current mirror type amplifying circuit 418 having its operation current increased in response to output signal ΦEVS from pump operation detecting circuit 381, and a p channel MOS transistor 371 supplying current from external power supply node EXV to internal power supply node Vcc1 in response to an output signal from current mirror type amplifying circuit 418. Current mirror type amplifying circuit 418 includes a p channel MOS transistor 360 connected between external power supply node EXV and a node NJ1 and having its gate connected to a node NJ4, a p channel MOS transistor 370 connected between external power supply node EXV and node NJ4 and having its gate connected to node NJ4, an n channel MOS transistor 375 connected between node NJ1 and a node NJ2 and receiving reference voltage Vref at its gate, an n channel MOS transistor 376 connected between node NJ4 and node NJ2 and having its gate connected to a connection node (node NJ3) between resistors 382 and 383, an inverter 380 inverting signal ΦEVS, an n channel MOS transistor 377 connected between node NJ2 and ground node Vss and receiving the output signal from inverter 380 at its gate, and an n channel MOS transistor 378 connected between node NJ2 and ground node Vss and receiving internal power supply voltage Vcc1 at its gate. MOS transistors 360 and 370 configure a current mirror circuit, and MOS transistors 375 and 376 configure a comparison stage. MOS transistors 378 serves as a resistance element having a small conductance. MOS transistor 378 always supplies small operation current for current mirror type amplifying circuit 418. The conductance or current drivability of MOS transistor 377 is made smaller than the conductance or current drivability of MOS transistor 374 supplying operation current of current mirror type amplifying circuit 417.

When both the Vpp generating circuit and the Vbb generating circuit stop charge pumping operation at the time of stand-by, an output signal from Vbb level detecting circuit 223 is at the "L" level, and an output signal from Vpp level detecting circuit 226 is at the "H" level. An output signal from Vpp level detecting circuit 226 is applied to an NOR gate 381 for detecting pumping operation through inverter 122. Therefore, both inputs of NOR gate 381 are at the "L" level, and signal ΦEVS attains the "H" level. Accordingly, an output signal from inverter 380 attains the "L" level, causing MOS transistor 377 to be turned off. MOS transistor 378 operates as a current source of current mirror type amplifying circuit 418. Current mirror type amplifying circuit 418 compares reference voltage Vref and the potential on node NJ3 (corresponding to internal power supply voltage Vcc1) with small current flowing through MOS transistor 378 as its operation current, and adjusts the gate potential of MOS transistor 371 according to the comparison result to adjust the voltage level of internal power supply voltage Vcc1. When pumping operation for generating internal high voltage Vpp and negative voltage Vbb is not carried out at all at the time of stand-by, internal power supply voltage Vcc is scarcely consumed in a semiconductor memory device (only stand-by current caused by leakage current is consumed). Therefore, internal power supply voltage Vcc1 changes little (decreases gently due to leakage current). It is intended to reduce current consumption of current mirror type amplifying circuit 418 by using only MOS transistor 378 having a small current supplying capability as a current source.

When pumping operation for generating internal high voltage Vpp or negative voltage Vbb is carried out, at least one input of NOR gate 381 attains the "H" level, and signal ΦEVS attains the "L" level. In this case, an output signal from inverter 380 attains the "H" level, MOS transistor 377 is turned on, and MOS transistors 377 and 378 operate as a current source of current mirror type amplifying circuit 418. In this case, the operation current of current mirror type amplifying circuit 418 increases. Therefore, the potential on node NJ1 changes at a high speed according to the relation of a magnitude between reference voltage Vref and the potential on node NJ3, thereby compensating for change (decrease) of internal power supply voltage Vcc1 caused by generation of internal high voltage Vpp and/or negative voltage Vbb at a high speed. By increasing the operation current of stand-by Vcc1 generating circuit 5B only when internal power supply voltage Vcc1 is used at the time of stand-by, average current consumption of the stand-by Vcc1 generating circuit at the time of stand-by can be made small. Accordingly, an internal power supply voltage generating circuit with low current consumption can be implemented.

Figure 35:
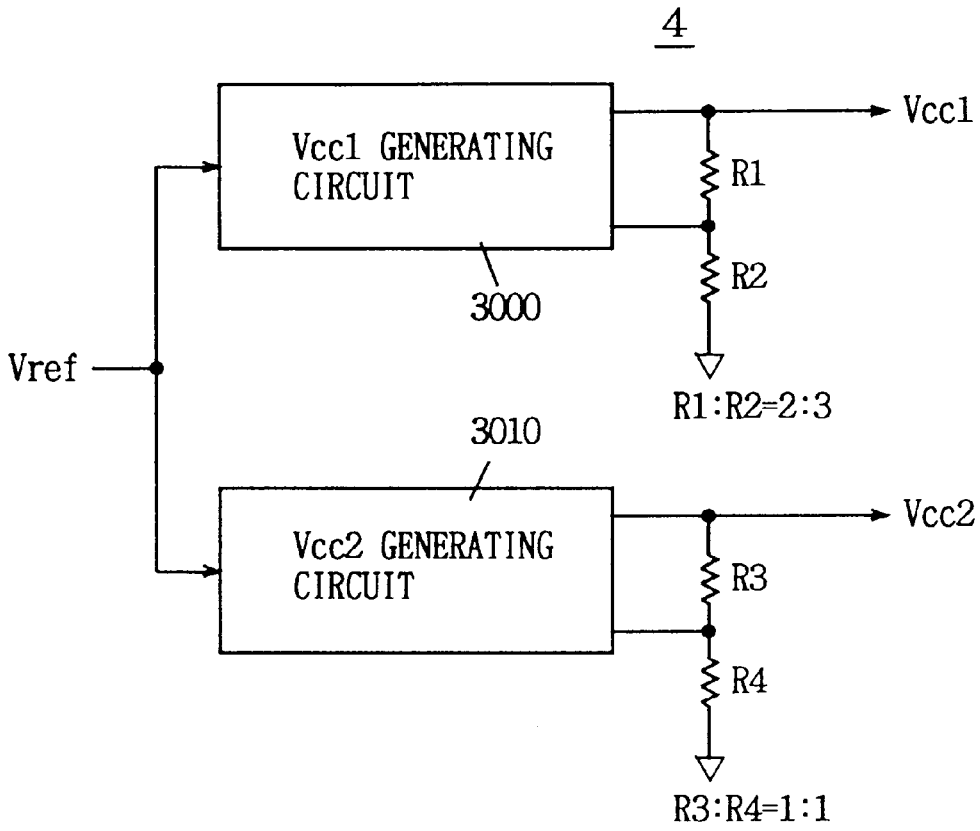
FIG. 35 is a diagram schematically showing the structure of the internal power supply voltage generating circuit according to the present invention.

In the structure of the internal power supply voltage generating circuit described above, two kinds of internal power supply voltages Vcc1 and Vcc2 are generated using the same reference voltage Vref, as shown in FIG. 35. More specifically, a Vcc1 generating circuit 3000 compares a voltage divided between resistors R1 and R2 and reference voltage Vref, and generates first internal power supply voltage Vcc1 according to the comparison result. A Vcc2 generating circuit 3010 divides second internal power supply voltage Vcc2 between resistors R3 and R4, compares the divided voltage with reference voltage, Vref, and adjusts the level of internal power supply voltage Vcc2 according to the comparison result. The ratio of the resistance values of resistors R1 and R2 is set to 2:3, and that of resistors R3 and R4 is set to 1:1. The structure for generation of reference voltage Vref will be described in detail later. Level adjustment of internal power supply voltages Vcc1 and Vcc2 may be carried out using two reference voltages Vref1 and Vref2 respectively corresponding to first and second internal power supply voltages Vcc1 and Vcc2, without using voltage division resistance. This structure will be described hereinafter.

Figure 36:
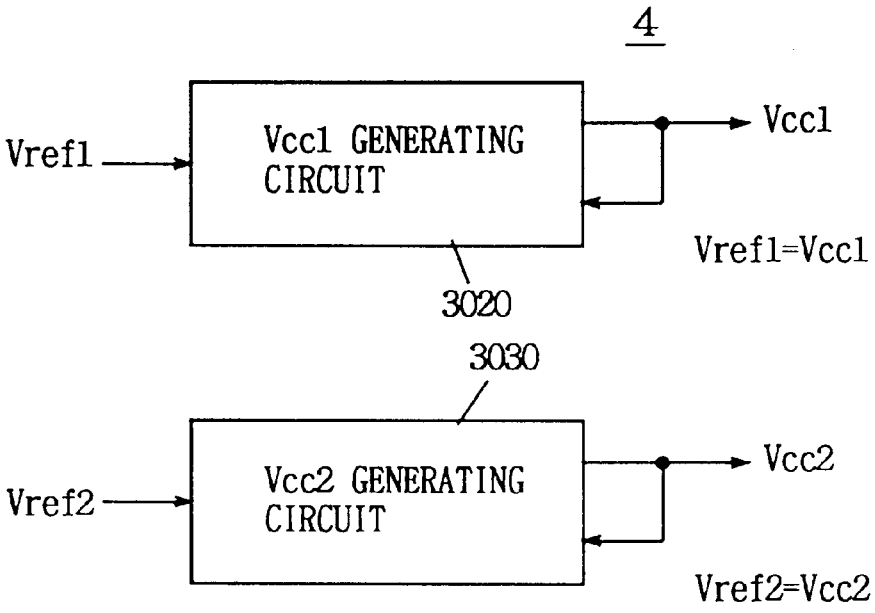
FIG. 36 is a diagram schematically showing a further structure of the internal power supply voltage generating circuit according to the present invention.

D: Internal power supply voltage generating circuit 4:

FIG. 36 is a diagram showing schematically a structure of a fourth embodiment of the internal power supply voltage generating circuit according to the present invention. In the structure shown in FIG. 36, a Vcc1 generating circuit 3020 compares first reference voltage Vref1 and first internal power supply voltage Vcc1, and adjusts the level of first internal power supply voltage Vcc1 according to the comparison result. A Vcc2 generating circuit 3030 compares second reference voltage Vref2 and second internal power supply voltage Vcc2, and adjusts the level of second internal power supply voltage Vcc2 according to the comparison result. In this case, Vref1=Vcc1, and Vref2=Vcc2.

Figure 37:
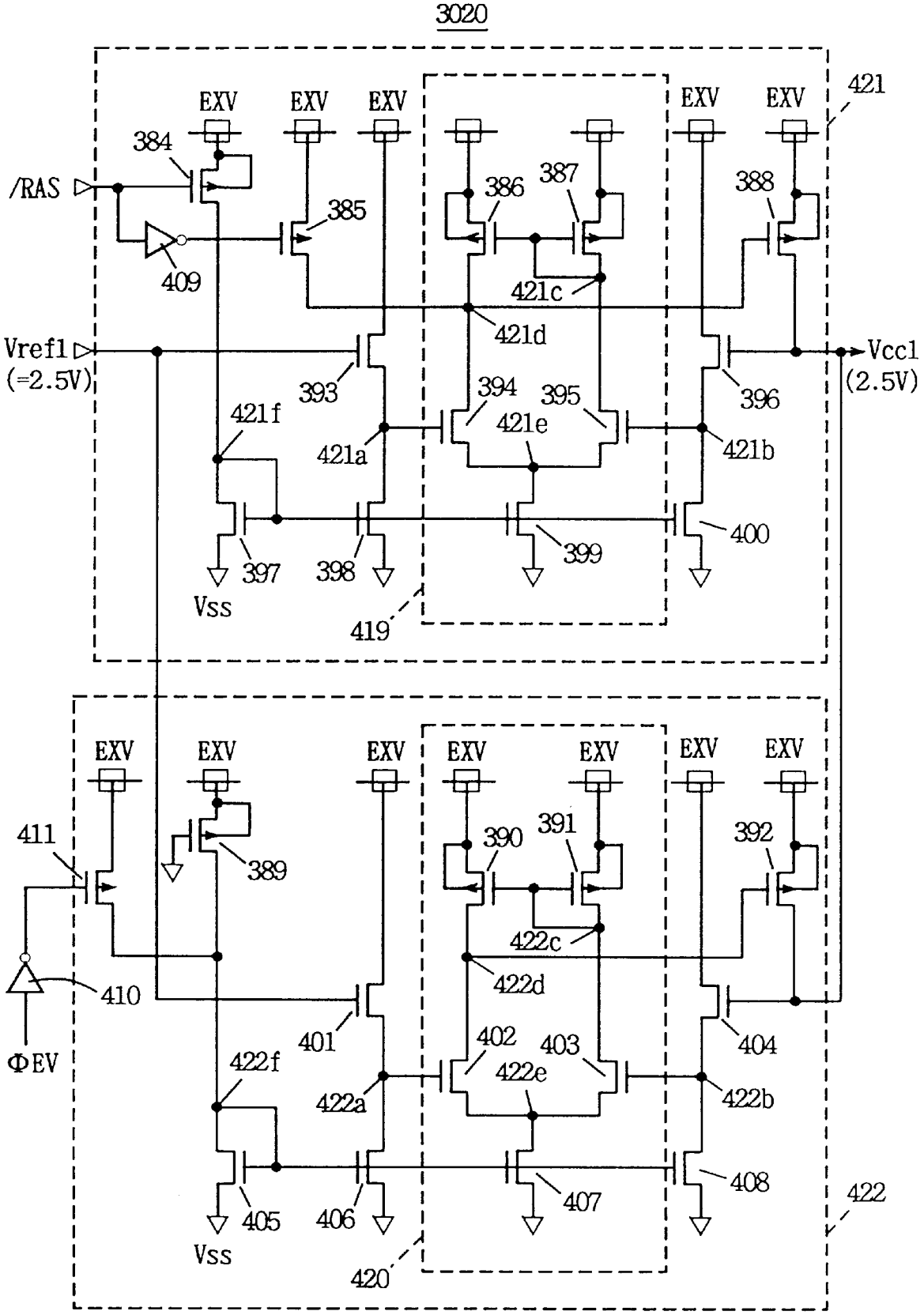
FIG. 37 is a diagram showing a specific structure of the Vcc1 generating circuit shown in FIG. 36.

FIG. 37 is a diagram showing a specific structure of the Vcc1 generating circuit shown in FIG. 36. In the structure shown in FIG. 37, Vcc2 generating circuit 3030 (cf. FIG. 36) can be implemented by changing first reference voltage Vref1 to second reference voltage Vref2.

Referring to FIG. 37, Vcc1 generating circuit 3020 includes an active Vcc1 generating circuit 421 activated at the time of activation of signal /RAS, and a stand-by Vcc1 generating circuit 222 adjusting first internal power supply voltage Vcc1 at the time of stand-by.

Active Vcc1 generating circuit 421 includes an inverter 409 inverting row address strobe signal /RAS, a p channel MOS transistor 384 rendered conductive at the time of activation of signal /RAS for supplying current from external power supply node EXV to a node 421f, a diode-connected n channel MOS transistor 397 discharging current supplied from MOS transistor 384 to ground node Vss, a p channel MOS transistor 385 applying external power supply voltage EXV to the gate of a p channel MOS transistor 388 for drive through a node 421d in response to an output signal from inverter 409, an n channel MOS transistor 393 receiving first reference voltage Vref1 at its gate for level-shifting first reference voltage Vref1 to transmit the same to a node 412a, an n channel MOS transistor 398 connected between node 421a and ground node Vss so as to configure a current mirror circuit together with MOS transistor 397, an n channel MOS transistor 396 level-shifting first internal power supply voltage Vcc1 on internal power supply node Vcc1 to transmit the same to a node 421b, an n channel MOS transistor 400 connected between node 421b and ground node Vss so as to configure a current mirror circuit together with MOS transistor 397, and a current mirror type amplifying circuit 419 comparing the voltage on nodes 421a and 421b for adjusting the gate potential of MOS transistor 388 according to the comparison result.

Current mirror type amplifying circuit 419 includes a p channel MOS transistor 386 provided between external power supply node EXV and a node 421c and having its gate connected to node 421c, a p channel MOS transistor 387 connected between external power supply node EXV and node 421c and having its gate connected to node 421c, an n channel MOS transistor 394 connected between a node 421d and node 421b and having its gate connected to node 421a, an n channel MOS transistor 395 connected between node 421c and a node 421e and having its gate connected to node 421b, and an n channel MOS transistor 399 connected between node 421e and ground node Vss and having its gate connected to node 421f.

MOS transistors 386 and 387 configure a current mirror circuit. There is a current flow through MOS transistor 386 of the same magnitude as that through MOS transistor 387 (when MOS transistors 386 and 387 are the same in size). MOS transistor 399 operates as a current source of current mirror type amplifying circuit 419. When MOS transistors 397, 398, 399 and 400 are the same in size, there is a current flow of the same magnitude through these transistors. Operation of the active Vcc1 generating circuit will now be described.

When signal /RAS is at the "H" level in a non-active state, an output signal from inverter 409 attains the "L" level. In this state, MOS transistor 384 is turned off (signal /RAS is at the level of external power supply voltage EXV), MOS transistor 397 is not supplied with current, and MOS transistors 397, 398, 399 and 400 are all turned off. On the other hand, MOS transistor 385 is turned on, and transmits external power supply voltage EXV to the gate of p channel MOS transistor 388 through node 421d, causing MOS transistor 388 to be turned off. More specifically, active Vcc1 generating circuit 421 does not carry out adjusting operation of first internal power supply voltage Vcc1 at the time of deactivation of signal /RAS.

When signal /RAS attains the "L" level in an active state, an output signal from inverter 409 attains the "H" level. Accordingly, MOS transistor 384 is turned on, and MOS transistor 385 is turned off. Current is supplied from external power supply node EXV to MOS transistor 397 through MOS transistor 384. MOS transistor 397 and MOS transistors 398, 399, and 400 configure a current mirror circuit. There is a current flow determined by the current through MOS transistor 397 through MOS transistors 398, 399, and 400. Since MOS transistors 398 and 400 are the same in size, there are current flows of the same magnitude through MOS transistors 398 and 400. More specifically, there are current flows of the same magnitude through MOS transistors 393 and 396. When threshold voltages Vthn of MOS transistors 393 and 396 are the same, the gate-source voltages Vqs of the same magnitude are generated because of the relation of $Ids=\beta\ (Vqs-Vthn)^2$. More specifically, MOS transistor 393 transmits the voltage of Vref1−Vsh to node 421a, and MOS transistor 396 transmits the voltage of Vcc1−Vsh to node 421b. Here, Vsh represents the gate-source voltages in MOS transistors 393 and 396.

Current mirror type amplifying circuit 419 operates with MOS transistor 399 as a current source, and compares the voltages of nodes 421a and 421b. When the voltage of node 421a is higher than the voltage of node 421b, the potential of node 421a decreases, and the conductance of MOS transistor 388 increases. When the voltage of node 421a is lower than the voltage of node 421b, the conductance of MOS transistor 388 is decreased. The gate-source voltages in MOS transistors 393 and 396 have the same value Vsh, and internal power supply voltage satisfying Vcc1=Vref1 is generated. The effect of level shift using MOS transistors 393 and 396 will be described in detail later.

More specifically, the active Vcc1 generating circuit is activated at the time of activation of signal /RAS, compensates for change of internal power supply voltage Vcc1 with a large current drivability at a high speed, and maintains internal power supply voltage Vcc1 at the constant voltage level Vref1.

Stand-by Vcc1 generating circuit 422 includes an inverter 410 inverting an active control signal ΦEV, a p channel MOS transistor 411 transmitting external power supply voltage EXV to node 422f in response to an output signal from inverter 410, a p channel MOS transistor 389 connected between external power supply node EXV and node 422f and receiving ground voltage Vss at its gate to serve as a resistance element, a diode-connected p channel MOS transistor 405 provided between node 422f and ground node Vss, an n channel MOS transistor 401 for level shift connected between external power supply node EXV and a node 422a and receiving reference voltage Vref1 at its gate, an n channel MOS transistor 406 connected between node 422a and ground node Vss and constituting a current mirror circuit together with MOS transistor 405, an n channel MOS transistor 404 connected between external power supply node EXV and a node 422b and receiving internal power supply voltage Vcc1 at its gate, an n channel MOS transistor 408 connected between node 422b and ground node Vss and configuring a current mirror circuit together with MOS transistor 405, a current mirror type amplifying circuit 420 comparing the voltages of nodes 422a and 422b at the time of activation for providing a signal according to the comparison result, and a p channel MOS transistor 392 supplying current from external power supply node EXV to internal power supply node Vcc1 in response to an output signal from current mirror type amplifying circuit 420.

The conductance or current drivability of MOS transistor 389 is made smaller than the conductance or current drivability of MOS transistor 384, and there is a smaller current flow through MOS transistor 405 than through MOS transistor 397 included in active Vcc1 generating circuit 421. Accordingly, reduction of current consumption at the time of stand-by is achieved.

Current mirror type amplifying circuit 420 includes a p channel MOS transistor 391 connected between external power supply node EXV and node 422c and having its gate connected to node 422c, a p channel MOS transistor 390 connected between external power supply node EXV and node 422d and having its gate connected to node 422c, an n channel MOS transistor 402 connected between node 422d and node 422e and having its gate connected to node 422a, an n channel MOS transistor 403 connected between node 422c and node 422e and having its gate connected to node 422b, and an n channel MOS transistor 407 connected between node 422b and ground node Vss and having its gate connected to node 422f. MOS transistors 390 and 391 configure a current mirror circuit, MOS transistors 402 and 403 configure a comparison stage comparing the voltages on nodes 422a and 422b, and MOS transistor 407 serves as a current source. MOS transistor 407 also configures a current mirror circuit together with MOS transistor 405.

Signal ΦEV is for bringing stand-by Vcc1 generating circuit 422 to an active/non-active state. Signal ΦEV may be the same as signal ΦEVS shown in FIG. 34 (in the case where the pump circuit uses internal power supply voltage), or an output signal (an inverted signal of a signal of node N25) from control portion 2530 shown in FIG. 31. MOS transistors 401 and 404 have the same size and the same threshold voltage Vthn. MOS transistors 406 and 408 have the same size, and configure a current mirror circuit together with MOS transistor 405. Therefore, there are current flows of the same magnitude through MOS transistors 406 and 408. Operation will now be described.

When signal ΦEV is at the "L" level, indicating that operation of the circuit using internal power supply voltage Vcc1 for example is stopped, an output signal from inverter 410 attains the "H" level (external power supply voltage EXV level), and MOS transistor 411 is turned off. Current is supplied to node 422f through MOS transistor 389. The conductance of MOS transistor 389 is small, and the amount of current supply is small. Current supplied from MOS transistor 389 flows through MOS transistor 405. Accordingly, MOS transistors 406, 407, and 408 are supplied with current corresponding to mirror current of the current through MOS transistor 405. MOS transistors 406 and 408 have current flows of the same magnitude. Therefore, the gate-source voltages of the same value are generated in MOS transistors 401 and 404, and reference voltage Vref1 and internal power supply voltage Vcc1 level-shifted by the same value are transmitted to nodes 422a and 422b, respectively.

Current mirror type amplifying circuit 420 compares the voltages of nodes 422a and 422b, and adjusts the gate potential of p channel MOS transistor 392 according to the comparison result. When internal power supply voltage Vcc1 is higher than reference voltage Vref1, the conductance of MOS transistor 392 is decreased. When internal power supply voltage Vcc1 is lower than reference voltage Vref1, the gate potential of MOS transistor 392 is decreased, current is supplied from external power supply node EXV to internal power supply node Vcc1, and the level of internal power supply voltage Vcc1 increases. At the time, there is a small current flow through MOS transistors 405, 406, 407, and 408. The voltage level of internal power supply voltage Vcc1 is adjusted following gentle change of internal power supply voltage Vcc1. At the time of stand-by, when internal power supply voltage Vcc1 is not used, internal power supply voltage Vcc1 is reduced only by leakage current. It is possible to maintain internal power supply voltage Vcc1 precisely at a constant voltage level even with small operation current.

When signal ΦEV attains the "H" level, indicating that internal power supply voltage Vcc1 is used for example, MOS transistor 411 is turned on, increasing a current flow through MOS transistor 405. Accordingly, there is an increased current flow through MOS transistors 406, 407, and 408, and current mirror type amplifying circuit 420 changes the potential of internal node 422d at a high speed according to the voltages of nodes 422a and 422b, thereby adjusting the gate potential of MOS transistor 392 for output. As a result, current mirror type amplifying circuit 420 operates at a high speed when internal power supply voltage Vcc1 is used at the time of stand-by to change, thereby maintaining internal power supply voltage Vcc1 at a constant value. When current through MOS transistors 406 and 408 increases, current through MOS transistors 401 and 404 also increases accordingly. However, when MOS transistors 401 and 404 have the same size and the same threshold voltage, MOS transistors 401 and 404 are supplied with current according to $\beta\ (Vqs-Vthn)^2$. Therefore, MOS transistors 401 and 404 have the same gate-source voltage generated. A larger amount of level shifting allows current mirror type amplifying circuit 420 to compare reference voltage Vref1 and internal power supply voltage Vcc1 in a high sensitive region.

The conductance of MOS transistor 389 is made sufficiently small, and the value of a current flow therethrough is made sufficiently small. When internal power supply voltage Vcc1 is not used at the time of stand-by, the change of internal power supply voltage Vcc1 is very small. Therefore, the change of internal power supply voltage Vcc1 can be sufficiently suppressed upon current consumption (stand-by current is generally on the order of $\mu$A). When internal power supply voltage Vcc1 is used at the time of stand-by (when the pump circuit operates for example), bringing MOS transistor 411 to an on state and increasing the value of a current flow through MOS transistors 405, 406, 407 and 408 increase the response speed of stand-by Vcc1 generating circuit 422 and adjust the voltage level of internal power supply voltage Vcc1. As a result, average current consumption of the stand-by Vcc1 generating circuit can be reduced. The reason why reference voltage Vref1 and internal power supply voltage Vcc1 are level-shifted by MOS transistors 393, 396, 401, and 404 will now be described.

Figure 38A:
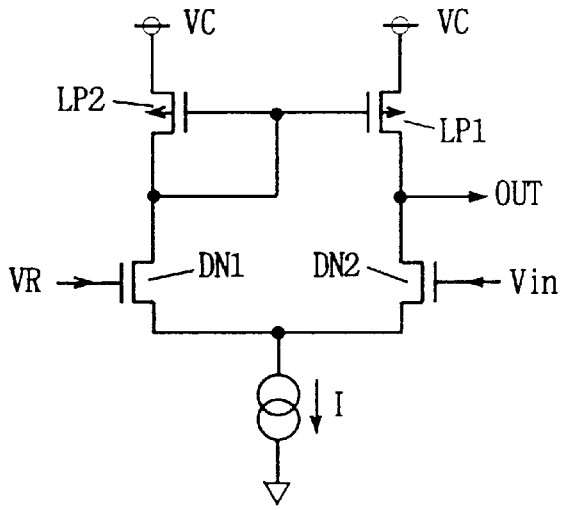
FIGS. 38A–38C are diagrams for explaining the effect brought about by the Vcc1 generating circuit shown in FIG. 37.

Now consider a current mirror type differentially amplifying circuit shown in FIG. 38A. The current mirror type amplifying circuit shown in FIG. 38A includes p channel MOS transistors LP1 and LP2 configuring a current mirror circuit, and n channel MOS transistors DN1 and DN2 configuring a comparison stage comparing an input signal Vin and reference voltage VR. MOS transistors LP1 and DN2 are connected in series, and MOS transistors LP2 and DN1 are connected in series. MOS transistor LP2 has its gate and drain interconnected. Constant operation current I is supplied due to a constant current source. In the current mirror type amplifying circuit, input signal Vin and an output signal are logically inverted with each other.

Figure 38B:
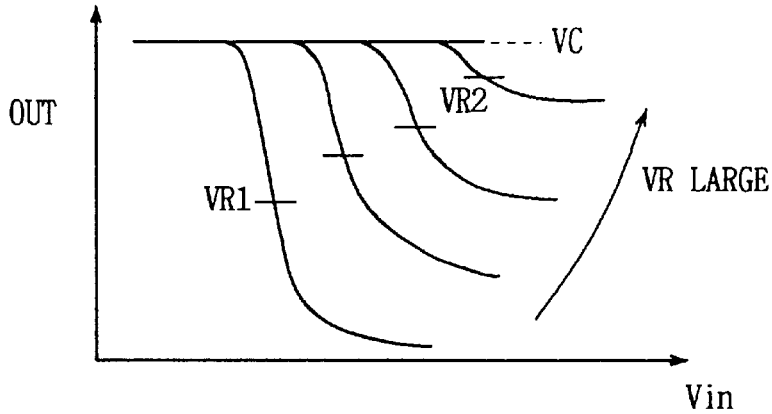

FIG. 38B shows input/output characteristics of the current mirror type amplifying circuit shown in FIG. 38A. When reference voltage VR becomes larger, the speed at which an output signal OUT changes becomes smaller. When reference voltage VR is VR1, the conductance of MOS transistor DN1 is small. MOS transistor DN1 is supplied with current from a power supply node VC through MOS transistor LP2. When input signal Vin is higher than reference voltage VR, the conductance of MOS transistor DN2 becomes larger than the conductance of MOS transistor DN1, causing a larger current flow. MOS transistor LP1 supplies mirror current of MOS transistor LP2 to MOS transistor DN2. At the time, when the conductance of MOS transistor DN1 is relatively low, the values of current flows through MOS transistors LP2 and LP1 are small. When current through MOS transistor DN2 increases, current through MOS transistor DN1 is limited due to a constant current source. Reduction of current through MOS transistor DN1 is fed back to MOS transistor LP1 through MOS transistor LP2, and the amount of current through MOS transistor DN2 is decreased. Therefore, output signal OUT falls to the "L" level at a high speed. Therefore, when reference voltage VR is relatively low, output signal OUT changes at a high speed.

On the other hand, consider the case where reference voltage VR is set to VR2 which is close to power supply voltage VC. At the time, the conductance of MOS transistor DN1 is relatively large. Consider the case where input signal Vin is higher than reference voltage VR2, and the conductance of MOS transistor DN2 is larger than the conductance of MOS transistor DN1. Since the value of reference voltage VR2 is relatively high, the conductance of MOS transistor DN1 is large in advance, causing a large current flow through MOS transistors LP2 and LP1. Therefore, the amount of a current flow through MOS transistor DN2 increases. Even if the amount of current MOS transistor DN1 supplies decreases, a relatively large current flow can be generated through MOS transistors LP1 and LP2. The ratio of the current changes is small. Therefore, in this case, output signal OUT does not change at a high speed. At the time, output signal OUT finally reaches the voltage level determined by the conductances of MOS transistors LP1 and DN2. More specifically, as the value of reference voltage VR approaches power supply voltage VC, the sensitivity of the current mirror type amplifying circuit decreases. In the current mirror type amplifying circuit shown in FIG. 38A, input signal Vin and output signal OUT are inverted logically. The current mirror type amplifying circuit shown in FIG. 38A is different from the current mirror type amplifying circuit described before in structure. However, these current mirror type amplifying circuits are the same in principle. As reference voltage Vref approaches power supply voltage, the sensitivity (the ratio of change of an output signal to change of an input signal) decreases.

Figure 38C:
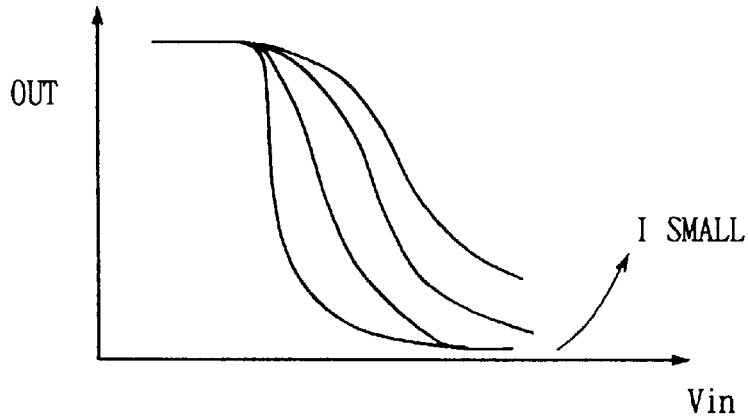

FIG. 38C shows the influence of current I flowing through a constant current source on the input/output characteristics. Assume that reference voltage VR is constant. Since smaller current I through the constant current source makes a current flow through MOS transistors LP1, LP2, DN1 and DN2 smaller, the speed at which a node providing output signal OUT is charged/discharged is decreased. Therefore, as current I supplied by the constant current source becomes smaller, the response characteristics of the current mirror type amplifying circuit deteriorate (the response speed decreases).

MOS transistors 393, 396, 401 and 404 for level shifting shown in FIG. 37 are provided so that current mirror type amplifying circuits 419 and 420 are operated in the most sensitive region even if reference voltage Vref1 is as high as 2.5 V. More specifically, if reference voltage Vref1 is reference voltage VR2 in FIG. 38B, reference voltage Vref1 is effectively reduced to reference voltage VR1 by MOS transistors 393, 396, 401, and 404 for level shifting. As a result, a sensitive current mirror type amplifying circuit is implemented which operates at a high speed even with high reference voltage.

Provision of MOS transistor 411 in parallel with MOS transistor 389 in the stand-by Vcc1 generating circuit increases operation current I when internal power supply voltage Vcc1 is used, and increases the amount of level shift of the comparison voltage. As a result, the response speed of current mirror type amplifying circuit 420 is increased, and thus the stand-by Vcc1 generating circuit can follow change of internal power supply voltage Vcc1 at a high speed, and generate constant internal power supply voltage Vcc1.

[Modification]

Figure 39:
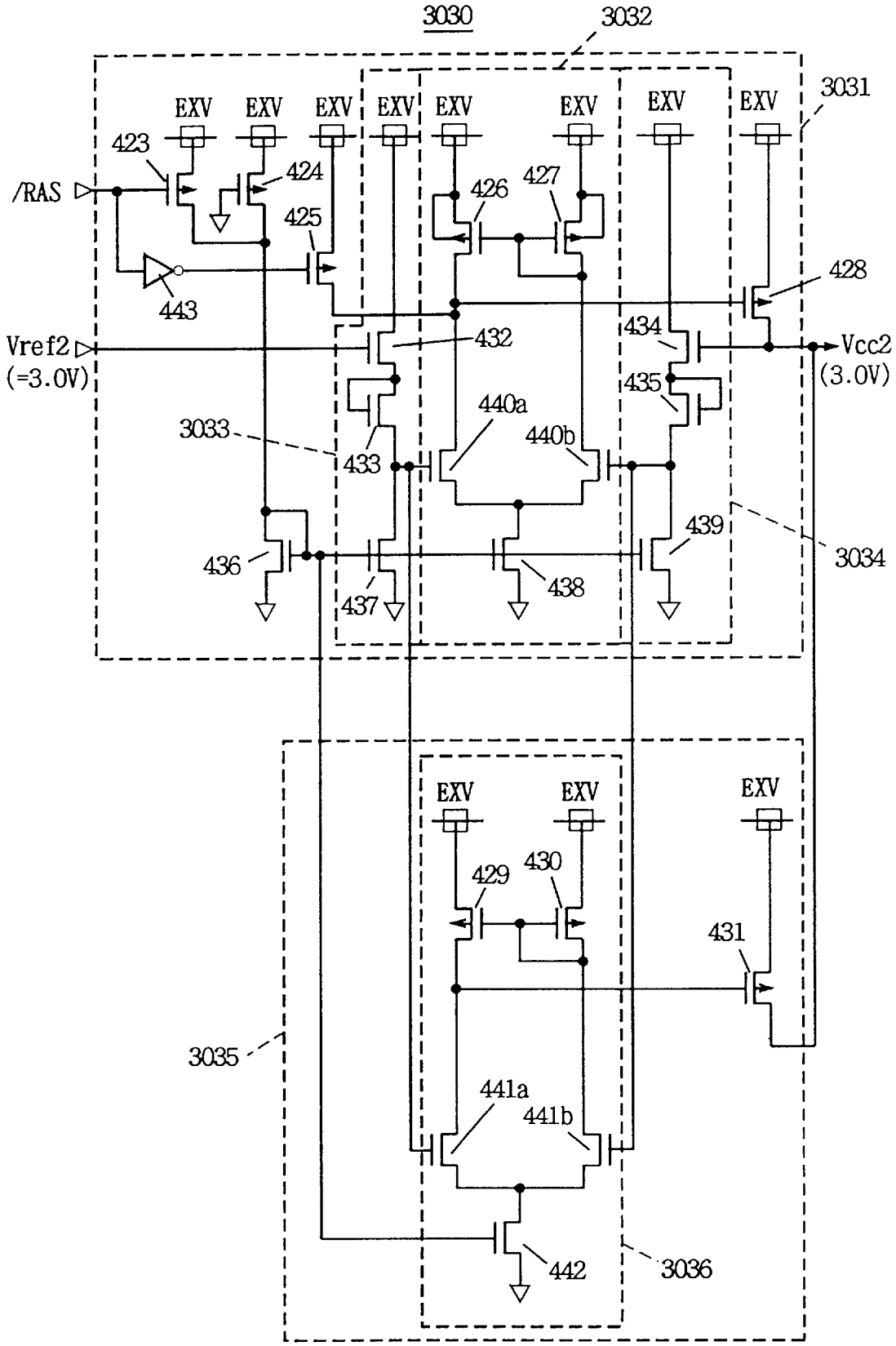
FIG. 39 is a diagram showing a further structure of the internal power supply voltage generating circuit according to the present invention.

FIG. 39 is a diagram showing a modification of the fourth embodiment of the internal power supply voltage generating circuit according to the present invention. In FIG. 39, a structure of Vcc2 generating circuit 3030 is shown. The similar structure can be applied to Vcc1 generating circuit 3020.

Referring to FIG. 39, Vcc2 generating circuit 3030 includes an active Vcc2 generating circuit 3031 activated at the time of activation of row address strobe signal /RAS for adjusting the voltage level of second internal power supply voltage Vcc2, and a stand-by Vcc2 generating circuit 3035 adjusting the voltage level of second internal power supply voltage Vcc2 at the time of stand-by. Stand-by Vcc2 generating circuit 3035 has its operation current decreased at the time of activation of signal /RAS, and its operation current increased at the time of stand-by when signal /RAS is deactivated (the structure of which will be described later).

Active Vcc2 generating circuit 3031 includes a p channel MOS transistor 423 supplying current to MOS transistor 436 at the time of activation of signal /RAS, a p channel MOS transistor 424 provided in parallel with MOS transistor 423 for receiving ground voltage Vss at its gate to serve as a resistance element and supplying current from external power supply node EXV to MOS transistor 436, an inverter 443 inverting signal /RAS, a p channel MOS transistor 425 transmitting external power supply voltage EXV to the gate of p channel MOS transistor 428 in response to an output signal from inverter 443, a level shift circuit 3033 level-shifting second reference voltage Vref2, a level shift circuit 3034 level-shifting second internal power supply voltage Vcc2, and a current mirror type amplifying circuit 3032 comparing outputs from level shift circuits 3033 and 3034 to adjust the gate potential of p channel MOS transistor 428 according to the comparison result.

Level shift circuit 3033 includes an n channel MOS transistor 432 supplied with current from external power supply node EXV for level-shifting second reference voltage Vref2, a diode-connected n channel MOS transistor 433 further decreasing the voltage level-shifted by MOS transistor 432 by the threshold voltage, and an n channel MOS transistor 437 determining the amount of current through MOS transistors 432 and 433. N channel MOS transistor 437 configures a current mirror circuit together with MOS transistor 436, generating mirror current corresponding to the current flow through MOS transistor 436.

Level shift circuit 3034 includes an n channel MOS transistor 434 supplied with current from external power supply nod EXV for level-shifting second internal power supply voltage Vcc2, a diode-connected n channel MOS transistor 235 further decreasing the voltage level-shifted by MOS transistor 434 by the threshold voltage, and an n channel MOS transistor 439 connected with MOS transistor 235 in a current mirror manner for determining the amount of current through MOS transistors 434 and 435. MOS transistors 437 and 439 are the same in size, supplying current of the same magnitude. MOS transistors 432 and 434 are the same in size, generating the same gate-source voltage. MOS transistors 433 and 435 have the same threshold voltage.

Current mirror type amplifying circuit 3032 includes p channel MOS transistors 426 and 427 connected to external power supply node EXV for configuring a current mirror circuit, n channel MOS transistors 440a and 440b configuring a comparison stage comparing the voltages applied from level shift circuits 3033 and 3034, and an n channel MOS transistor 438 generating a current path of MOS transistors 226, 227, 440a, and 440b. MOS transistor 438 configures a current mirror circuit together with MOS transistor 436. MOS transistor 427 has its gate and drain interconnected, causing current of the same magnitude as current through MOS transistor 427 to flow through MOS transistor 426.

Stand-by Vcc2 generating circuit 3035 includes a current mirror type amplifying circuit 3036 comparing the output voltages of level shift circuits 3033 and 3034 for adjusting the gate potential of p channel MOS transistor 321 according to the comparison result. MOS transistor 431 supplies current from external power supply node EXV to internal power supply node Vcc2 according to the gate potential.

Current mirror type amplifying circuit 3036 includes p channel MOS transistors 429 and 430 coupled to external power supply node EXV and configuring a current mirror circuit, p channel MOS transistors 441a and 441b receiving the output voltages of level shift circuits 3033 and 3034 at their gates, and a p channel MOS transistor 242 operating as a current source for MOS transistors 429, 430, 441a, and 441b. MOS transistors 441a is supplied with current from MOS transistor 429, and MOS transistor 441b is supplied with current from MOS transistor 430. MOS transistor 430 has its gate and drain interconnected. MOS transistor 442 configures a current mirror circuit together with MOS transistor 236.

Operation of the Vcc2 generating circuit shown in FIG. 39 is the same as that of the Vcc generating circuit shown in FIG. 37. Level shift circuits 3033 and 3034 are shared by active Vcc2 generating circuit 3031 and stand-by Vcc2 generating circuit 3035. As a result, an area occupied by the circuit is reduced. Level shift circuits 3033 and 3034 are provided with diode-connected n channel MOS transistors 433 and 435 because of the following reason.

Second reference voltage Vref2 and second internal power supply voltage Vcc2 are 3.0 V, which is higher than first reference voltage Vref1 and first internal power supply voltage Vcc1. Therefore, in order to operate current mirror type amplifying circuits 3032 and 3036 in the most sensitive region, the voltage level must be further decreased than in the case of the level shifting structure shown in FIG. 37 to be applied to current mirror type amplifying circuits 3032 and 3036. In order to implement the level shifting, diode-connected n channel MOS transistors 433 and 435 are provided.

Although operation of the circuit shown in FIG. 39 is substantially the same as that of the circuit shown in FIG. 37, the operation will be described hereinafter briefly.

When signal /RAS is at the "L" level in an active state, MOS transistor 423 is turned on, and MOS transistor 425 is turned off (inverter 443 operates with external power supply voltage EXV as one operation power supply voltage). Accordingly, current is supplied to MOS transistor 436 through MOS transistors 423 and 424, and the amount of current through MOS transistors 437, 438, and 439 increases. In level shift circuit 3033, second reference voltage Vref2 is level-shifted by MOS transistors 432 and 433. The amount of level-shifting is determined by the value of current through MOS transistor 437. Similarly, in level shift circuit 3034, second internal power supply voltage Vcc2 is level-shifted by MOS transistors 434 and 435. MOS transistors 437 and 439 have the same size, causing a current flow of the same magnitude. Therefore, the voltages are shifted in level shift circuits 3033 and 3034 by the same amount. Current mirror type amplifying circuit 3032 compares the output voltages of level shift circuits 3033 and 3034, and adjusts the gate potential of MOS transistor 228 according to the comparison result. As a result, second internal power supply Vcc2 is made equal to second reference voltage Vref2.

At the time of stand-by when signal /RAS is at the "H" level, MOS transistor 423 is turned off, and MOS transistor 425 is turned on. As a result, external power supply voltage EXV is applied to the gate of MOS transistor 428, causing MOS transistor 428 to be turned off. More specifically, adjusting operation of internal power supply voltage Vcc2 by the active Vcc2 generating circuit is inhibited.

MOS transistor 424 supplies small current to MOS transistor 436. MOS transistor 436 configures a current mirror circuit together with a current source transistor 442 included in stand-by Vcc2 generating circuit 3035. Therefore, MOS transistor 442 is supplied with mirror current corresponding to the current supplied by MOS transistor 424. With the mirror current through MOS transistor 442 as operation current, current mirror type amplifying circuit 3036 compares the output voltages of level shift circuits 3033 and 3034, and adjusts the gate potential of MOS transistor 431 according to the comparison result. At the time of stand-by, internal power supply voltage Vcc2 is adjusted only with small current determined by the conductance (or current drivability) of MOS transistor 424. Accordingly, current consumption at the time of stand-by is reduced. At the time of stand-by, change of second internal power supply voltage Vcc1 is small and gentle. Therefore, internal power supply voltage Vcc2 can be maintained stably at a constant level sufficiently with small operation current of stand-by Vcc2 generating circuit 3035.

As described above, with the structure shown in FIG. 39, an area occupied by the circuit can be reduced, and a circuit generating internal power supply voltage stably with low power consumption can be implemented.

Further, it is not necessary to set the ratio of resistance values of resistance elements to a prescribed value. Only a level shift function of MOS transistors is used. Therefore, a signal at a desired level can be applied to a current mirror type amplifying circuit precisely with a small occupied area, and the current mirror type amplifying circuit can be operated in the most sensitive region. As a result, an internal power supply voltage generating circuit superior in response characteristics can be implemented.

[Modification 2]

Figure 40:
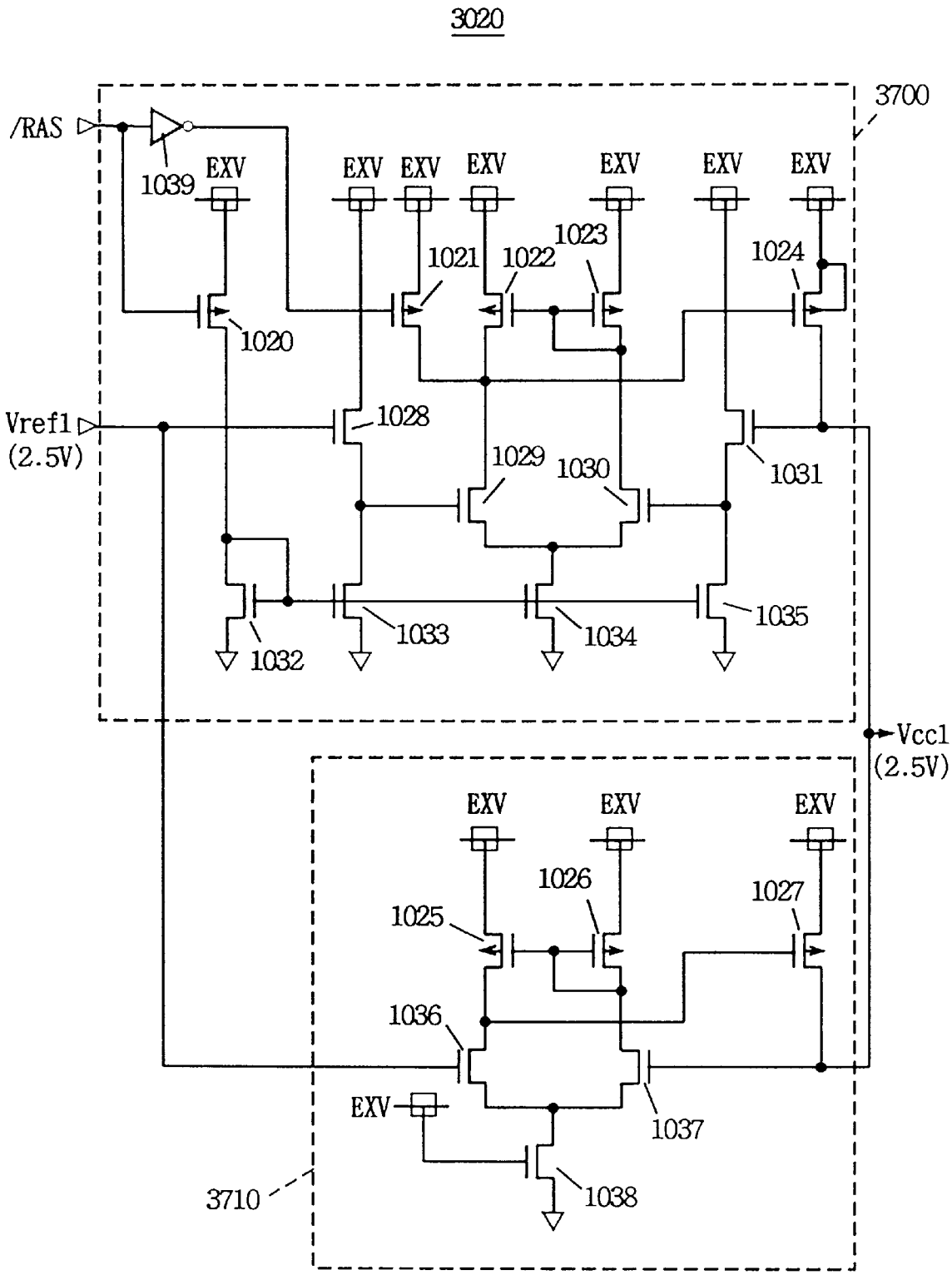
FIG. 40 is a diagram showing a further structure of the internal power supply voltage generating circuit according to the present invention.

FIG. 40 is a diagram showing a structure of a second modification of the fourth embodiment of the internal power supply voltage generating circuit according to the present invention. In FIG. 40, a structure for generating first internal power supply voltage Vcc1 is shown. A structure similar to the structure shown in FIG. 40 can be also applied to a structure for generating second internal power supply voltage Vcc2.

Referring to FIG. 40, Vcc1 generating circuit 3020 includes an active Vcc1 generating circuit 3700 activated at the time of activation of signal /RAS for adjusting the level of internal power supply voltage Vcc1, and a stand-by Vcc1 generating circuit 3510 adjusting the voltage level of internal power supply voltage Vcc1 primarily at the time of stand-by. Active Vcc1 generating circuit 3700 includes a p channel MOS transistor 1020 rendered conductive at the time of activation of signal /RAS for supplying current from external power supply node EXV, a diode-connected p channel MOS transistor 1032 supplied with current from MOS transistor 1020, a p channel MOS transistor 1028 having one conduction terminal connected to external power supply node EXV for level-shifting reference voltage Vref1 to transmit the same to the other conduction terminal, an n channel MOS transistor 1033 connected in series with MOS transistor 1028 for controlling the amount of level shift of the voltage in MOS transistor 1028, an n channel MOS transistor 1031 having one conduction terminal connected to external power supply node EXV for level-shifting internal power supply voltage Vcc1 to transmit the same to the other conduction terminal, and an n channel MOS transistor 1035 supplying current determining the amount of level shift in MOS transistor 1031. MOS transistors 1033 and 1035 configure a current mirror circuit together with MOS transistor 1032. MOS transistors 1028 and 1031 have the same size. More specifically, there are current flows of the same magnitude through MOS transistors 1033 and 1035, and accordingly, the gate-source voltages of the same value are generated in MOS transistors 1028 and 1031.

Active Vcc1 generating circuit 3700 further includes an n channel MOS transistor 1029 receiving the level-shifted reference voltage applied from MOS transistor 1028 at its gate, an n channel MOS transistor 1030 receiving the voltage transmitted from n channel MOS transistor 1031 at its gate, a p channel MOS transistor 1022 connected between external power supply node EXV and MOS transistor 1029, a p channel MOS transistor 1023 connected between external power supply node EXV and MOS transistor 1030, a p channel MOS transistor 1034 connected between MOS transistors 1029 and 1030 and the ground node, and a p channel MOS transistor 1024 connected between external power supply node EXV and internal power supply node Vcc1 for supplying current to internal power supply node Vcc1.

The gate of MOS transistor 1022 is connected to the gate and drain of MOS transistor 1023. MOS transistors 1029 and 1030 have their sources connected together, and connected to the drain of MOS transistor 1034. MOS transistor 1034 configures a current mirror circuit together with MOS transistor 1032. A connection node between MOS transistors 1022 and 1029 is connected to the gate of MOS transistor 1020. External power supply voltage EXV is applied to the gate of MOS transistor 1024 through p channel MOS transistor 1021 rendered conductive in response to an output from inverter 1039 inverting signal /RAS.

Stand-by Vcc1 generating circuit 3710 includes an n channel MOS transistor 1036 receiving reference voltage Vref1 at its gate, an n channel MOS transistor 1037 receiving internal power supply voltage Vcc1 at its gate, an n channel MOS transistor 1038 connected between the sources of MOS transistors 1036 and 1037 connected together and the ground node for receiving external power supply voltage EXV at its gate, a p channel MOS transistor 1025 connected between MOS transistor 1036 and external power supply node EXV, a p channel MOS transistor 1026 connected between external power supply node EXV and MOS transistor 1037, and a p channel MOS transistor 1027 connected between external power supply node EXV and internal power supply node Vcc1 for supplying current from external power supply node EXV to internal power supply node Vcc1.

The gate and drain of MOS transistor 1026 are interconnected, and connected to the gate of MOS transistor 1025. More specifically, MOS transistors 1025 and 1026 configure a current mirror circuit. The feature of the circuit structure shown in FIG. 40 is that reference voltage Vref1 and internal power supply voltage Vcc1 are, without being level-shifted, directly applied to stand-by Vcc1 generating circuit 3710 at a comparison stage of the current mirror type amplifying circuit. Operation will now be described below.

When signal /RAS is in an active state of "L", MOS transistor 1020 is turned on, and supplies current to MOS transistor 1032. An output signal from inverter 1039 attains the "H" level, and MOS transistor 1021 is turned off. There is a mirror current flow of the current through MOS transistor 1032 through MOS transistors 1033, 1034, and 1035. MOS transistors 1028 and 1031 level-shift reference voltage Vref1 and internal power supply voltage Vcc1 to apply the level-shifted voltages to the gates of MOS transistors 1029 and 1030, respectively. The gate-source voltages in MOS transistors 1028 and 1031 are determined by the current flows through MOS transistors 1033 and 1035. MOS transistors 1033 and 1035 configure a current mirror circuit together with MOS transistor 1032. MOS transistors 1033 and 1035 generate current flows of the same magnitude, respectively. Therefore, the gate-source voltages of the same value are generated in MOS transistors 1028 and 1031. A current mirror type amplifying circuit configured of MOS transistors 1022, 1023, 1029, 1030, and 1034 operates in the most sensitive region, compares reference voltage Vref1 and internal power supply voltage Vcc1, and adjusts the gate potential of MOS transistor 1024 according to the comparison result.

At the time of stand-by when signal /RAS is at "H" at the external power supply voltage EXV level, MOS transistor 1020 is turned off, and MOS transistor 1021 is turned on according to an output signal from inverter 1039. As a result, external power supply voltage EXV is applied to the gate of MOS transistor 1024 through MOS transistor 1021 to bring MOS transistor 1024 to an off state. Since MOS transistor 1020 is in an off state, and does not supply current, there is no current flow through MOS transistor 1032, accordingly. Therefore, there is no current flow through MOS transistors 1033, 1034, and 1035, either. Therefore, at the time of stand-by, power consumption in active Vcc1 generating circuit 3700 is substantially 0.

On the other hand, stand-by Vcc1 generating circuit 3710 compares reference voltage Vref1 and internal power supply voltage Vcc1, and adjusts the gate potential of MOS transistor 1027 according to the comparison result. At the time of stand-by, the amount of change of internal power supply voltage Vcc1 is small. Therefore, even if the current mirror type amplifying circuit configured of MOS transistors 1025, 1026, 1036, 1037, and 1038 directly receives reference voltage Vref1 and internal power supply voltage Vcc1, and carries out comparing operation in a region of poor sensitivity, internal power supply voltage Vcc1 can be sufficiently maintained at a prescribed voltage level. At the time of stand-by, stand-by Vcc1 generating circuit 3710 consumes only operation current determined by MOS transistor 1038. Current for level-shifting reference voltage Vref1 and internal power supply voltage Vcc1 is not consumed at all. Therefore, it is possible to maintain internal power supply voltage Vcc1 stably at a prescribed level with low current consumption.

By using the structure shown in FIG. 40, current consumption at the time of stand-by can be substantially reduced, and an internal power supply voltage generating circuit with low power consumption can be implemented.

When the structure of Vcc1 generating circuit 3020 shown in FIG. 40 is applied to Vcc2 generating circuit 3030, second reference voltage Vref2 of 3.0 V may be used instead of reference voltage Vref1. Further, diode-connected MOS transistors may be additionally provided between MOS transistors 1028 and 1033, and between MOS transistors 1031 and 1035, respectively.

MOS transistors 1038 receives external power supply voltage EXV at its gate. The conductance of MOS transistor 1038 is increased so as to improve response characteristics of the current mirror type amplifying circuit configured of MOS transistors 1025, 1026, 1036, and 1037. However, MOS transistor 1038 may receive internal power supply voltage Vcc1 at its gate.

As described above, by generating two kinds of internal power supply voltages using two kinds of reference voltages, it is not necessary to use voltage division resistance for level shift. It is possible to maintain internal power supply voltage at a constant voltage level precisely with a small occupied area and low power consumption.

E: Internal power supply voltage generating circuit 5

Figure 41:
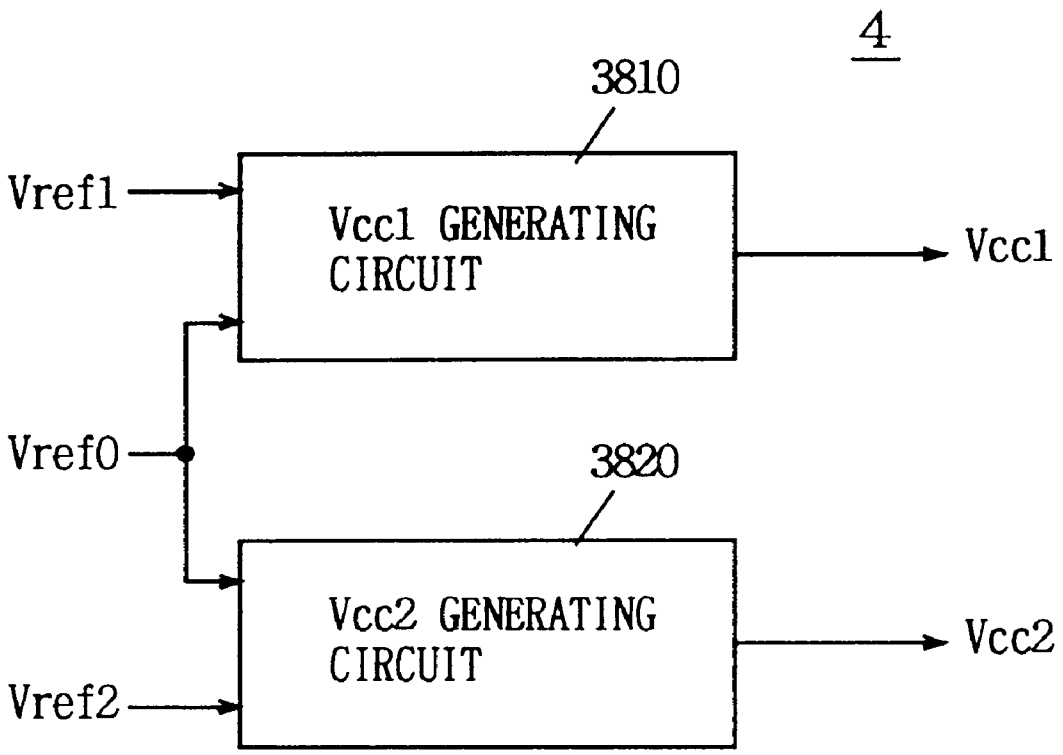
FIG. 41 is a block diagram schematically showing a further structure of the internal power supply voltage generating circuit according to the present invention.

FIG. 41 is a diagram showing a conceptual structure of a fifth embodiment of the internal power supply voltage generating circuit according to the present invention. Referring to FIG. 41, internal power supply voltage generating circuit 4 includes a Vcc1 generating circuit 3810 receiving reference voltage Vref0=(=1.5 V) and reference voltage Vref1=(=2.5 V) for generating first internal power supply voltage Vcc1 at the same level as that of reference voltage Vref1, and a Vcc2 generating circuit 3820 receiving reference voltage Vref0 and reference voltage Vref2 for generating second internal power supply voltage Vcc2 at the same level as that of reference voltage Vref2. The specific structure of these circuits will be described later. By using reference voltages Vref1 and Vref2 at the same levels as those of internal power supply voltages Vcc1 and Vcc2 to be generated, a current flow through a path for level conversion of the internal power supply voltage level for improving the sensitivity of a current mirror type amplifying circuit is suppressed at the time of stand-by, thereby reducing stand-by current.

Figure 42:
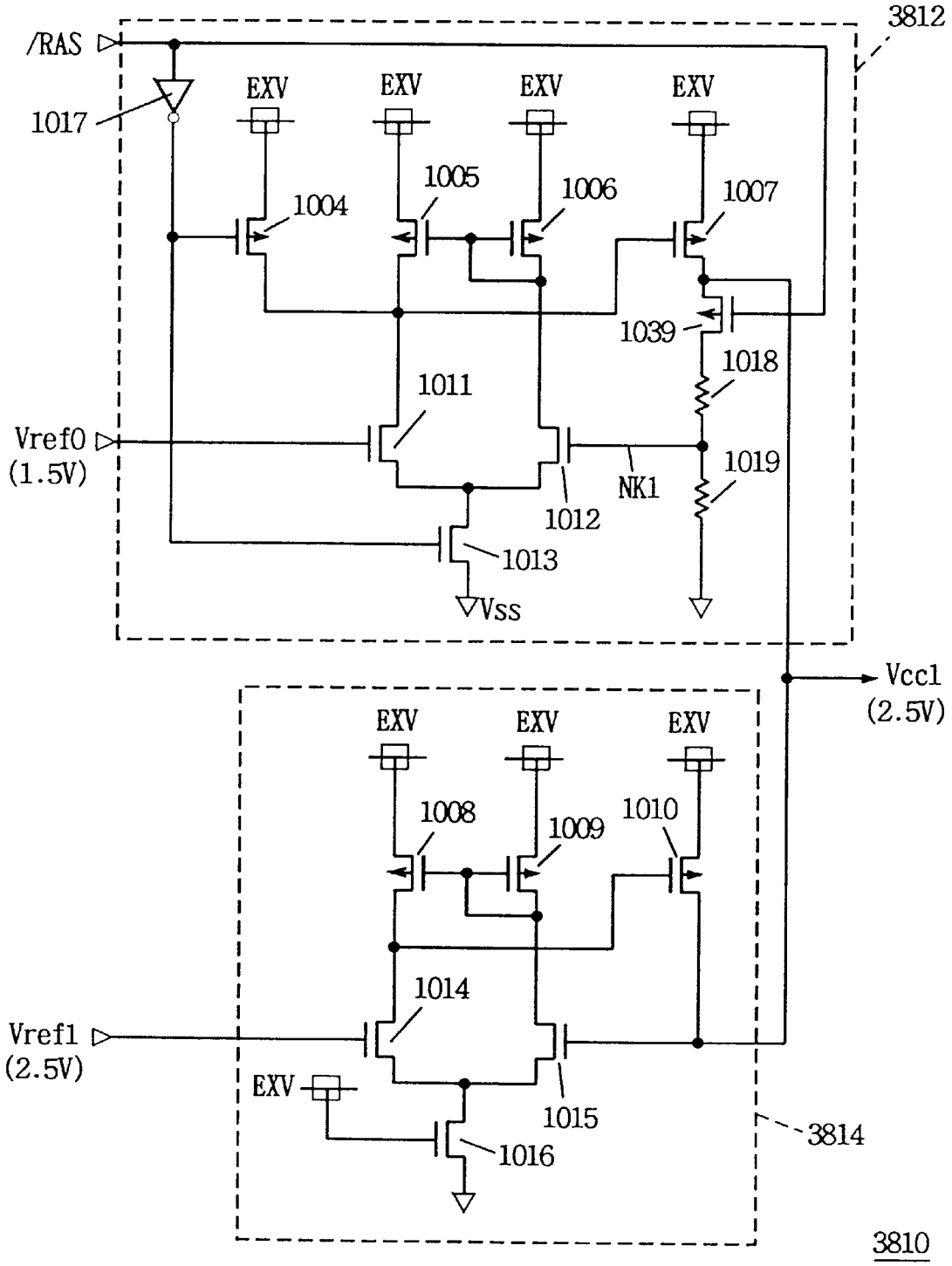
FIG. 42 is a diagram showing a specific structure of the Vcc1 generating circuit shown in FIG. 41.

FIG. 42 is a diagram showing the specific structure of Vcc1 generating circuit 3810 shown in FIG. 41. Referring to FIG. 42, Vcc1 generating circuit 3810 includes an active Vcc1 generating circuit 3812 activated at the time of activation of signal /RAS for generating internal power supply voltage Vcc1, and a stand-by Vcc1 generating circuit 3814 directly comparing the voltage levels of reference voltage Vref1 and internal power supply voltage Vcc1 for adjusting the voltage level of internal power supply voltage Vcc1 according to the comparison result.

Active Vcc1 generating circuit 3812 includes an inverter 1017 inverting signal /RAS, a p channel MOS transistor 1007 supplying current from external power supply node EXV to internal power supply node Vcc1, a p channel MOS transistor 1004 applying external power supply voltage EXV to the gate of MOS transistor 1007 in response to an output signal from inverter 1017, an n channel MOS transistor 1011 receiving reference voltage Vref0 at its gate, an n channel MOS transistor 1012 receiving the signal voltage on a node NK1 (a connection node between transistors 1018 and 1019) at its gate, a p channel MOS transistor 1005 connected between MOS transistor 1011 and external power supply node EXV, a p channel MOS transistor 1006 connected between MOS transistor 1012 and external power supply node EXV, and an n channel MOS transistor 1013 forming a current path for transistors 1005, 1006, 1011 and 1012 in response to an output signal from inverter 1017.

MOS transistor 1006 has its gate and drain interconnected and connected to the gate of MOS transistor 1005. More specifically, MOS transistors 1005 and 1006 configure a current mirror circuit. MOS transistors 1011 and 1012 are supplied with current from MOS transistors 1005 and 1006, respectively, and serve as a comparison stage for comparing reference voltage Vref0 and the signal voltage on node NK1. MOS transistor 1013 serves as a current source of the current mirror type amplifying circuit.

Active Vcc1 generating circuit 3812 further includes a p channel MOS transistor 1039 and resistors 1018 and 1019 connected in series between internal power supply node Vcc1 and ground node Vss. An output signal from inverter 1017 is applied to the gate of MOS transistor 1039. The ratio of the resistance values of resistors 1018 and 1019 is set to 2:3. The gate of MOS transistor 1007 is connected to a connection node between MOS transistors 1005 and 1011.

Stand-by Vcc1 generating circuit 3814 includes an n channel MOS transistor 1014 receiving reference voltage Vref1 at its gate, an n channel MOS transistor 1015 receiving internal power supply voltage Vcc1 at its gate, a p channel MOS transistor 1008 connected between MOS transistor 1014 and external power supply node EXV, a p channel MOS transistor 1009 connected between external power supply node EXV and MOS transistor 1015, an n channel MOS transistor 1016 having its gate connected to external power supply node EXV for providing a current path for MOS transistors 1008, 1009, 1014, and 1015, and a p channel MOS transistor 1010 having its gate connected to a connection node between MOS transistors 1008 and 1014 for supplying current from external power supply node EXV to internal power supply node Vcc1. The current drivability of MOS transistor 1016 is made sufficiently small. MOS transistor 1016 determines operation current of a current mirror type amplifying circuit configured of MOS transistors 1008, 1009, 1014, and 1015. The current drivability of MOS transistor 1016 is made small for reduction of current consumption at the time of stand-by. Operation will now be described.

When signal /RAS is at the "L" level, an output signal from inverter 1017 attains "H" at the external power supply voltage EXV level, MOS transistor 1004 is turned off, and MOS transistors 1013 and 1039 are turned on. As a result, a current mirror type amplifying circuit configured of MOS transistors 1005, 1006, 1011, and 1012 is activated. There is a current flow through resistors 1018 and 1019, and the voltage on node NK1 attains the voltage level of 3·Vcc1/5 obtained by level conversion of internal power supply voltage Vcc1. Reference voltage Vref0 and the voltage on node NK1 are compared by MOS transistors 1011 and 1012, and the voltage according to the comparison result is applied to the gate of p channel MOS transistor 1007. When the voltage on node NK1 is higher than reference voltage Vref0, the amount of current supply of MOS transistor 1007 is made small (or 0). When the voltage on node NK1 is lower than reference voltage Vref0, the amount of current supply of MOS transistor 1007 is increased. MOS transistor 1013 has a relatively large current drivability. Therefore, MOS transistor 1013 follows at a high speed large change of internal power supply voltage Vcc1 at the time of operation, and maintains internal power supply voltage Vcc1 at a prescribed voltage level.

At the time of stand-by when signal /RAS is at the "H" level, an output signal from inverter 1017 attains the "L" level, and MOS transistor 1013 is turned off. Signal /RAS is at least at the internal power supply voltage Vcc1 level, and MOS transistor 1039 is turned off. As a result, a path of current from resistors 1018 and 1019 to the ground node is disconnected. External power supply voltage EXV is applied to the gate of MOS transistor 1007 through MOS transistor 1004, causing MOS transistor 1007 to be turned off. As a result, at the time of stand-by, current consumption in active Vcc1 generating circuit 3812 becomes 0.

In stand-by Vcc1 generating circuit 3814, reference voltage Vref1 and internal power supply voltage Vcc1 are directly compared, and a signal at the voltage level according to the comparison result is applied to the gate of MOS transistor 1010. Operation current of stand-by Vcc1 generating circuit 3814 is determined by a current flow through MOS transistor 1016. Change of internal power supply voltage Vcc1 at the time of stand-by is small. Even if the current mirror amplifying circuit (transistors 1008, 1009, 1014, 1015) operates in a region of a poor sensitivity, the current mirror type amplifying circuit can sufficiently follow the change of internal power supply voltage Vcc1, and maintain internal power supply voltage Vcc1 at a constant value.

At the time of stand-by, only the operation current flows through MOS transistor 1016. No current flows through voltage division resistors 1018 and 1019. Therefore, current consumption at the time of stand-by can be reduced. At the time of operation (at the time of activation signal /RAS), comparison and amplification are carried out in the most sensitive region of the current mirror type amplifying circuit configured of MOS transistors 1005, 1006, 1011 and 1012 because of voltage division resistors 1018 and 1019. Therefore, even if internal power supply voltage Vcc1 changes greatly or abruptly, the current mirror type amplifying circuit can follow the change at a high speed, and return internal power supply voltage Vcc1 to a prescribed value. As a result, a Vcc1 generating circuit can be implemented capable of holding internal power supply voltage Vcc1 at a constant level stably with low current consumption.

When it is intended to implement Vcc2 generating circuit 3820, the reference voltage of 3.0 V is applied to the gate of MOS transistor 1014, and the ratio of the resistance values of resistors 1018 and 1019 is set to 1:1.

As described above, with the structure of the fifth embodiment, an internal power supply voltage generating circuit can be implemented capable of generating internal power supply voltage stably with low current consumption.

F: Internal power supply voltage generating circuit 6

Figure 43:
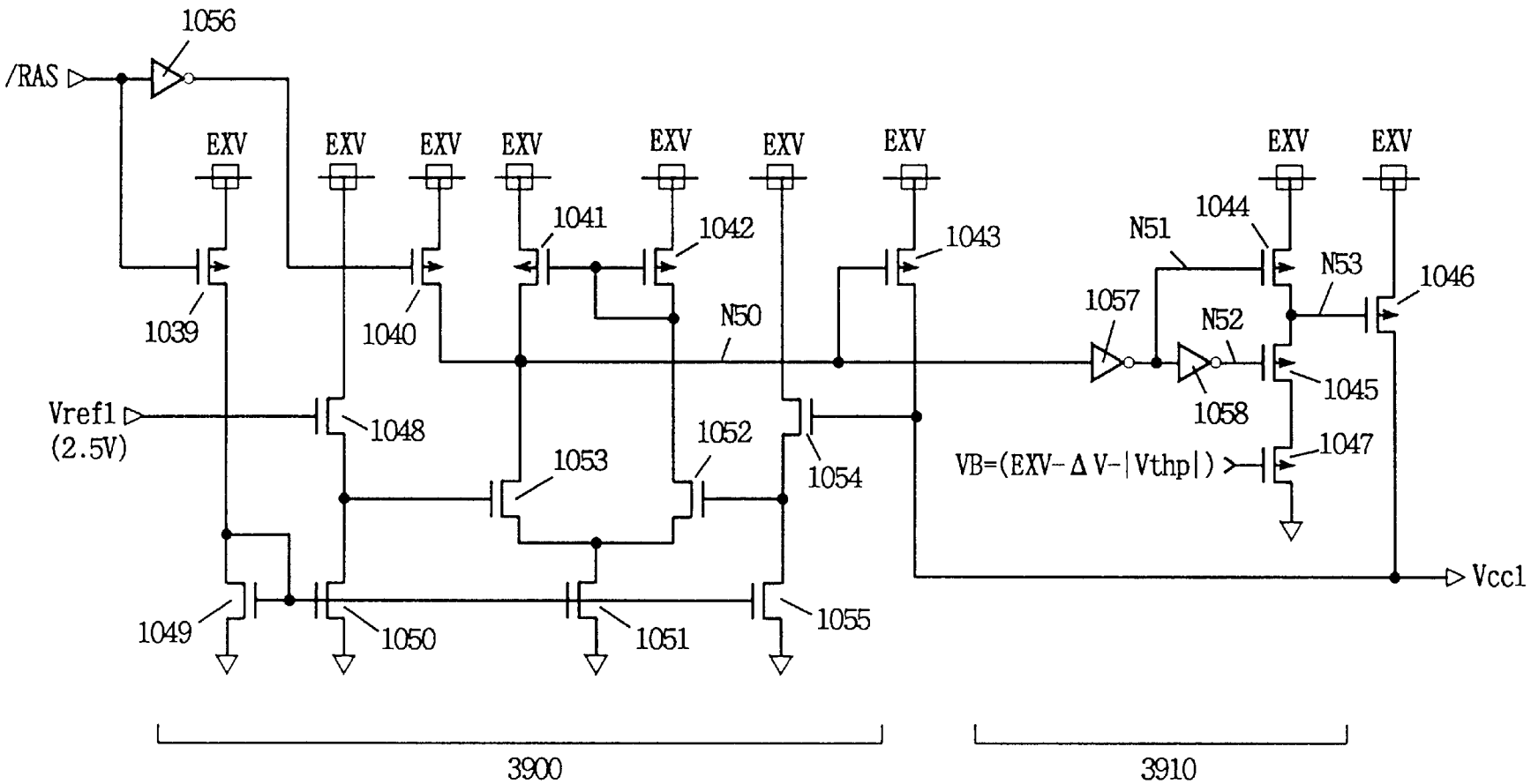
FIG. 43 is a diagram showing a further structure of the internal power supply voltage generating circuit according to the present invention.

FIG. 43 is a diagram showing a structure of a sixth embodiment of the internal power supply voltage generating circuit according to the present invention. In FIG. 43, a structure of an active Vcc1 generating circuit is shown. Any of the stand-by Vcc1 generating circuits according to the first to the fifth embodiments may be combined.

Referring to FIG. 43, the active Vcc1 generating circuit includes a first driving portion 3900 generating a first drive signal according to reference voltage Vref1 and internal power supply voltage Vcc1, a p channel MOS transistor 1043 supplying current from external power supply node EXV to internal power supply node Vcc1 in response to a drive signal from first driving portion 3900, a second driving portion 3910 generating a second drive signal in response to the first drive signal from first driving portion 3900, and a p channel MOS transistor 1046 supplying current from external power supply node EXV to internal power supply node Vcc1 in response to an output signal from second driving portion 3910. The gate width of MOS transistor 1043 is made smaller than that of MOS transistor 1046. Normally, a drive current of 100 mA is required as a specification value at the time of operation. MOS transistors 1043 and 1046 operate in parallel to supply the drive current of 100 mA. By providing the driving portion adjusting internal power supply voltage Vcc1 at the time of activation with two p channel MOS transistors 1043 and 1046, the gate width of the drive transistor is made smaller, and accordingly, the gate capacitance is made smaller than the case where one transistor is provided for supplying current to the internal power supply node. As a result, a current drivability required for the current mirror type amplifying circuit is made smaller.

First driving portion 3900 includes an inverter 1056 inverting signal /RAS, a p channel MOS transistor 1039 supplying current from external power supply node EXV in response to signal /RAS, a p channel MOS transistor 1040 transmitting external power supply voltage EXV to a node N50 in response to an output signal from inverter 1056, an n channel MOS transistor 1049 supplied with current from p channel MOS transistor 1039, an n channel MOS transistor 1048 having one conduction terminal connected to external power supply node EXV and receiving reference voltage Vref1 at its gate to level-shift the same and transmit the level-shifted voltage to the other conduction terminal, an n channel MOS transistor 1050 operating as a current source of MOS transistor 1048, a p channel MOS transistor 1041 connected between node N50 and external power supply node EXV, an n channel MOS transistor 1053 supplied with current from p channel MOS transistor 1041 and receiving the level-shifted reference voltage Vref1 from MOS transistor 1048 at its gate, an n channel MOS transistor 1054 for level shift having one conduction terminal connected to external power supply node EXV and receiving internal power supply voltage Vcc1 at its gate, a p channel MOS transistor 1042 connected with MOS transistor 1040 in a current mirror manner, an n channel MOS transistor 1052 supplied with current from MOS transistor 1042 and receiving the level-shifted internal power supply voltage Vcc1 from MOS transistor 1054 at its gate, an n channel MOS transistor 1051 connected between the sources of MOS transistors 1052 and 1053 connected together and the ground node Vss and having its gate connected to the gate of MOS transistor 1049, and an n channel MOS transistor 1055 connected between MOS transistor 1054 and the ground node Vss.

MOS transistor 1049 has its gate and drain interconnected. MOS transistor 1049 configures a current mirror circuit together with MOS transistors 1050, 1051, and 1055. There is a mirror current flow of current through MOS transistor 1049 through MOS transistors 1050, 1051 and 1055. MOS transistors 1050 and 1055 are the same in size, thereby generating current flows of the same magnitude. Therefore, in MOS transistors 1048 and 1054, the gate-source voltages of the same value are produced. This is the same as the level shifting operation of reference voltage and internal power supply voltage described above. MOS transistors 1042 and 1041 configure a current mirror circuit. There is a current flow through MOS transistor 1049 having the same magnitude as that through MOS transistor 1042.

Second driving portion 3910 includes a CMOS inverter 1057 receiving a signal from node N50, a CMOS inverter 1058 receiving an output signal from CMOS inverter 1057, a p channel MOS transistor 1044 connected between external power supply node EXV and a node N53 and receiving an output signal from CMOS inverter 1057 at its gate, a p channel MOS transistor 1045 connected in series with MOS transistor 1044 and receiving an output signal from CMOS inverter 1058 at its gate, a p channel MOS transistor 1047 connected between MOS transistor 1045 and the ground node and receiving a constant bias voltage VBB (=EXV−ΔV−|Vthp|) at its gate, and a p channel MOS transistor 1046 receiving the potential on node N53 (a connection node between MOS transistors 1044 and 1045) at its gate and supplying current from external power supply node EXV to internal power supply node Vcc1. Here, ΔV is a constant value determined appropriately, and Vthp is the threshold voltage of MOS transistor 1047.

MOS transistor 1047 clamps the drain voltage to the voltage level of EXV−ΔV upon application of current. At the time, MOS transistor 1045 is rendered conductive, and the source/drain voltage drop is 0. The voltage on node N53 becomes equal to the drain voltage of MOS transistor 1047. Operation will now be described.

Operation of first driving portion 3900 is the same as that of the active Vcc1 generating circuit described before. The gate width of p channel MOS transistor 1043 for drive is smaller than the case where transistors 1043 and 1046 are not used as drive transistors. When signal /RAS is at the "H" level, MOS transistor 1040 is in an on state, node N50 attains the voltage level on the node EXV of external power supply voltage EXV, and MOS transistor 1043 is turned off. At the time, the potential on node N51 attains "L" at the ground voltage Vss level, and MOS transistor 1044 is turned on. Further, an output signal from CMOS inverter 1058 attains "H" at the external power supply voltage EXV level, and MOS transistor 1045 is turned off. As a result, the potential of node N53 attains external power supply voltage EXV, and MOS transistor 1046 is turned off.

On the other hand, MOS transistor 1039 is in an off state, and there is no current flow through MOS transistor 1049. Therefore, at the time of stand-by when signal /RAS is at the "H" level, current is not consumed in first and second driving portions 3900 and 3910.

Signal /RAS attains the "L" level, causing an output signal from inverter 1056 to attain the "H" level, and MOS transistor 1040 to be turned off. Further, MOS transistor 1039 is turned on, there is a current flow through MOS transistor 1049, and MOS transistors 1050, 1051 and 1055 are supplied with mirror current, respectively. MOS transistors 1048 and 1054 level-shift reference voltage Vref1 and internal power supply voltage Vcc1 to apply the same to the gates of MOS transistors 1053 and 1052, respectively. When internal power supply voltage Vcc1 is higher than reference voltage Vref1, the potential of node N50 increases, causing MOS transistor 1043 to be turned off. When the potential of node N50 rises to the "H" level, output signals from CMOS inverters 1057 and 1058 attain "L" and "H", respectively. Accordingly, MOS transistor 1044 is turned on, and MOS transistor 1045 is turned off. The potential of node N53 attains external power supply voltage EXV, and MOS transistor 1046 is completely turned off.

At the time, in order for MOS transistor 1043 to be turned off, the potential of node N50 increases at least to the EXV−|Vthp| level. Therefore, in this state, a p channel MOS transistor included in CMOS inverter 1057 is also turned off, and there is no through current generated in CMOS inverter 1057. Similarly, an n channel MOS transistor in CMOS inverter 1058 is turned off, and there is no through current flow. Therefore, when at least MOS transistors 1043 and 1046 are turned off in a steady state, there is only a current flow in first driving portion 3900, and current consumption is reduced by the following reason.

Compared to the case where only one transistor is used as a drive transistor, the current mirror type amplifying circuit has only to drive p channel MOS transistor 1043 having a smaller current drivability and a smaller gate width. Only a small current drivability is required. The transistors can be decreased in size, and accordingly, the operation current is made smaller. At the time, there are current flows through MOS transistors 1048 and 1054 for level shift. However, these current flows are required for making the gate-source voltages constant. These current flows have only to cause voltage drop of the threshold voltages Vthn, for example. Therefore, the current flows through MOS transistors 1048 and 1054 can be made extremely small. Accordingly, current consumption in the stable state can be made sufficiently small.

When internal power supply voltage Vcc1 is smaller than reference voltage Vref1, the potential of node N50 decreases, p channel MOS transistor 1043 is rendered conductive, and current is supplied from external power supply node EXV to internal power supply node Vcc1. At the time, MOS transistor 1043 does not have such a large current drivability, and does not supply current excessively. Overshoot of internal power supply voltage Vcc1 is not caused by MOS transistor 1043. When the potential of node N50 decreases, and it is determined by CMOS inverter 1057 that the level of the potential is "L", an output signal from CMOS inverter 1057 attains "H" (external power supply voltage EXV level), and an output signal from CMOS inverter 1058 attains "L". As a result, MOS transistor 1044 is turned off, and MOS transistor 1045 is turned on. MOS transistor 1045 supplies small current to MOS transistor 1047. The gate-source voltage of MOS transistor 1047 is set to approximately −Vthp (because of supply of small current). Therefore, the potential of node N53 is set to EXP−ΔV. Therefore, the gate-source voltage of MOS transistor 1046 is kept constant at −ΔV even if external power supply voltage EXV becomes larger. MOS transistor 1046 supplies constant current to internal power supply node Vcc1. Therefore, overshoot can be suppressed at this time even if external power supply voltage EXV becomes larger.

First driving portion 3900 drives MOS transistor 1046 having a relatively larger current drivability through second driving portion 3910. Therefore, MOS transistors 1041, 1042, 1053 and 1052 configuring a current mirror circuit included in first driving portion 3900 are only required to charge capacitances of p channel MOS transistor 1043 having a relatively small current drivability and of an input portion of CMOS inverter 1057. In other words, these transistors 1041, 1042, 1053, and 1052 have only to cause a small current flow. Therefore, current consumption in first driving portion 3900 can be reduced. Even if overshoot of internal power supply voltage Vcc1 is caused at the time, MOS transistor 1046 having a large current drivability can be turned off at a high speed, and the degree of the overshoot can be reduced. Even if undershoot is caused, MOS transistor 1046 can be turned on at a high speed similarly. Accordingly, MOS transistors 1043 and 1046 can be on/off controlled according to change of internal power supply Vcc1 by first driving portion 3900 having a small current drivability, resulting in reduction of current consumption of a Vcc1 generating circuit.

Figure 44:
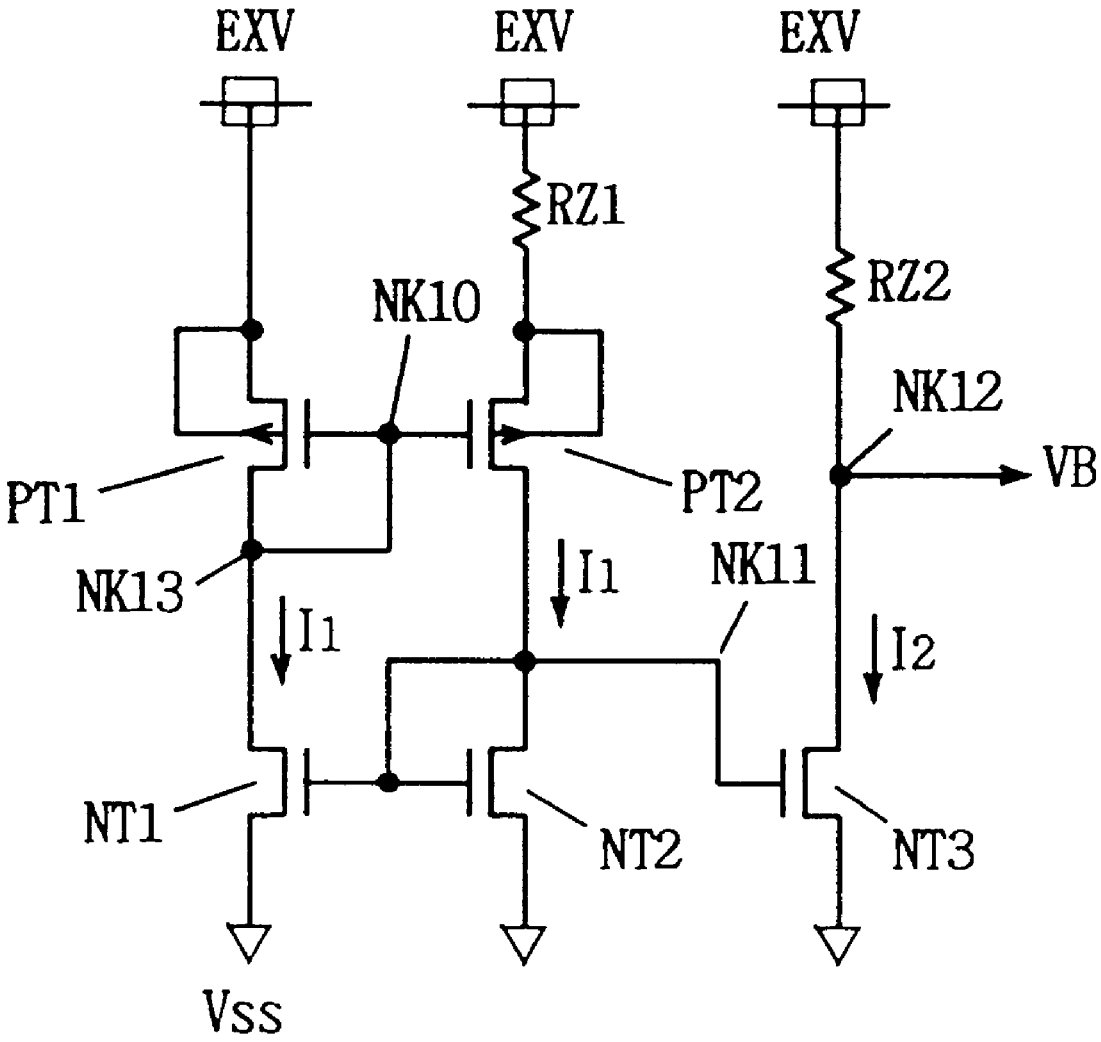
FIG. 44 is a diagram showing a circuit configuration for generating bias voltage VB shown in FIG. 43.

FIG. 44 is a diagram showing an external structure for generating bias voltage VB shown in FIG. 43. Referring to FIG. 44, a bias voltage generating circuit includes a p channel MOS transistor PT1 having its source connected to external power supply node EXV and its gate and drain connected to a node NK13, a p channel MOS transistor PT2 having its source connected to external power supply node EXV through a resistor RZ1, its gate connected to a node NK10 and its drain connected to a node NK11, an n channel MOS transistor NT1 having its drain connected to node NK13, its source connected to ground node Vss, and its gate connected to node NK11, an n channel MOS transistor NT2 having its gate and drain connected to node NK11 and its source connected to ground node Vss, a resistor RZ2 connected between external power supply node EXV and a node NK12, and an n channel MOS transistor NT3 having its drain connected to node NK12, its source connected to ground node Vss, and its gate connected to node NK11.

The channel length (gate length) L of MOS transistor PT1 is set longer than that of MOS transistor PT2, and the absolute value |Vthp1| of the threshold voltage of MOS transistor PT1 is set larger than the absolute value |Vthp2| of the threshold voltage of MOS transistor PT2. MOS transistors NT1 and NT2 configure a current mirror circuit. The current drivabilities of MOS transistors NT1 and NT2 are set sufficiently smaller than those of MOS transistors PT1 and PT2. As a result, in MOS transistor PT1, the source-gate voltage is |Vthp|, and in MOS transistor PT2, the gate-source voltage is −|Vthp2|. MOS transistors PT1 and PT2 have the same gate potential. Therefore, the following expression holds:

$$EXV-|Vthp1|=V-|Vthp2|$$

In the above expression, V is the source voltage of MOS transistor PT2. Therefore, the potential difference between both ends of resistor RZ1 is:

$$EXV-V=|Vthp1|-|Vthp2|$$

Therefore, a current flow I1 equalized by MOS transistors NT1 and NT2 through MOS transistors PT1 and PT2 is:

$$I1=(|Vthp1|-|Vthp2|)/RZ1$$

Since MOS transistor NT3 configures a current mirror circuit together with MOS transistor NT2, a current flow I2 through MOS transistor NT3 is equal to current flow I1. Therefore, bias voltage VB is:

$$VB=EXV-RZ2\cdot I1$$

Assume that the resistance value of resistor RZ2 is (ΔV+|Vthp|/I1), the following expression is given:

$$VB=EXV-\Delta V-|Vthp|$$

ΔV is given by the following expression:

$$\Delta V=I\cdot RZ2-|Vthp|=(|Vthp1|-|Vthp2|)\cdot RZ2/RZ1-|Vthp|$$

The voltage −ΔV applied to the gate-source of MOS transistor 1046 is a constant voltage independent of external power supply voltage EXV. By setting the resistance values of resistors RZ1 and RZ2 and the threshold voltages Vthp of MOS transistors PT1 and PT2 and MOS transistor 1047 shown in FIG. 44 to appropriate values, an optimal value for ΔV can be easily implemented.

[Modification]

Figure 45:
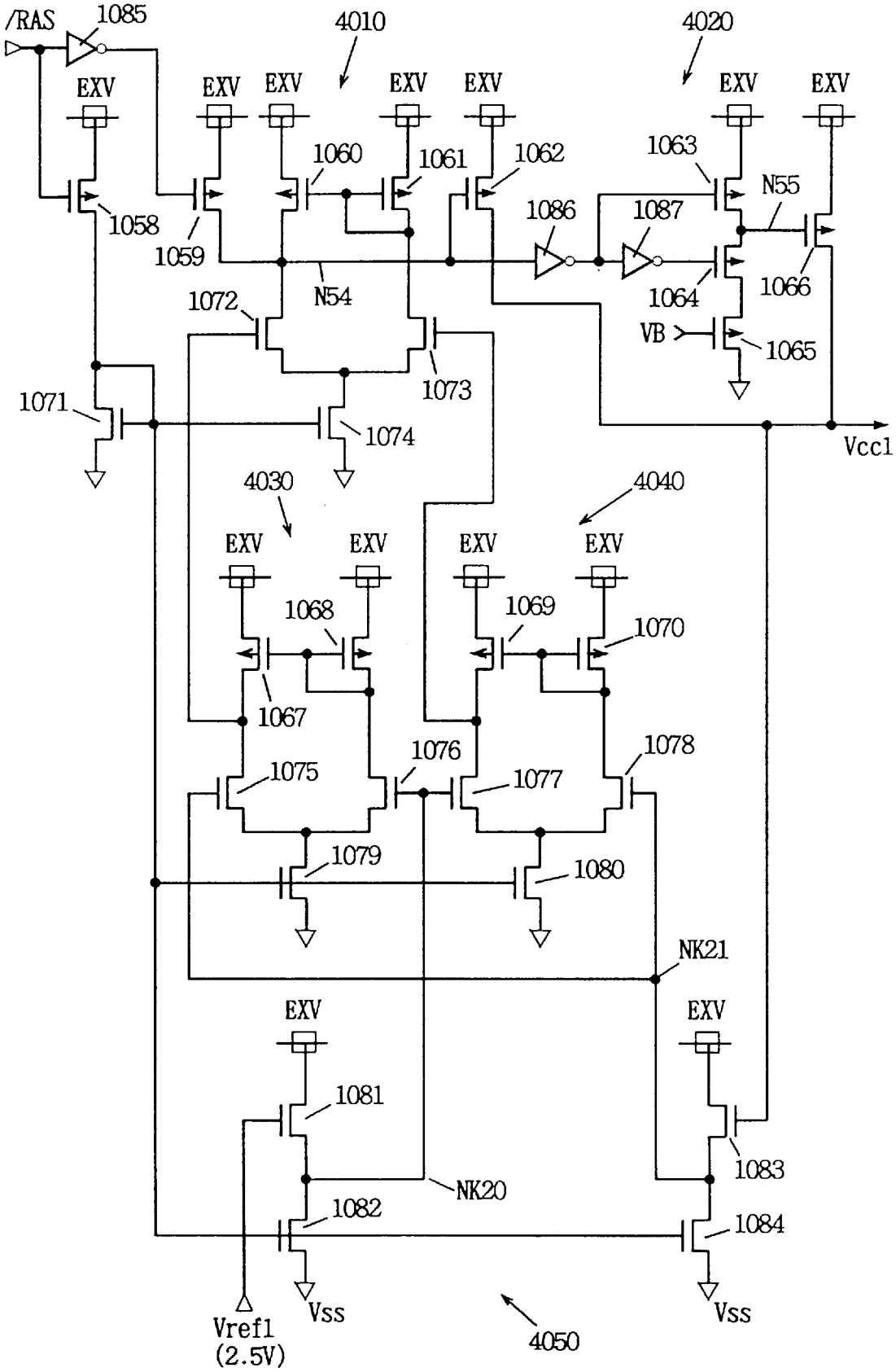
FIG. 45 is a diagram showing a further structure of the internal power supply voltage generating circuit according to the present invention.

FIG. 45 is a diagram showing a structure of a modification of the sixth embodiment of the internal power supply voltage generating circuit according to the present invention. In FIG. 45, shown is a structure of Vcc1 generating circuit generating first internal power supply voltage Vcc1 according to first reference voltage Vref1. In particular, a structure of an active Vcc1 generating circuit activated at the time of activation (at "L") of signal /RAS is shown. A stand-by Vcc1 generating circuit may be combined for stabilizing internal power supply voltage Vcc1 at the time of stand-by.

Referring to FIG. 45, the internal power supply voltage generating circuit includes a level shift circuit 4050 level-shifting reference voltage Vref1 and internal power supply voltage Vcc1 by a prescribed value for output, current mirror type differentially amplifying circuits 4030 and 4040 differentially amplifying the signal voltages which appear on output nodes NK20 and NK21 of level shift circuit 4050, a current mirror type amplifying circuit 4010 detecting the difference between output signals from current mirror type differentially amplifying circuits 4030 and 4040 for providing a signal corresponding to the difference, a p channel MOS transistor 1062 having a relatively small current drivability for supplying current from external power supply node EXV to internal power supply node Vcc1 in response to an output signal from current mirror type amplifying circuit 4010, and a driving portion 4020 supplying current to internal power supply node Vcc1 with a large current drivability in response to an output signal from current mirror type amplifying circuit 4010.

The internal power supply voltage generating circuit further includes an inverter 1085 inverting signal /RAS, a p channel MOS transistor 1058 supplying current from external power supply node EXV in response to signal /RAS, and a diode-connected n channel MOS transistor 1071 supplied with current from MOS transistor 1058.

Level shift circuit 4050 includes an n channel MOS transistor 1081 connected between external power supply node EXV and node NK20 and receiving reference voltage Vref1 at its gate, an n channel MOS transistor 1082 connected between node NK20 and ground node Vss and having its gate connected to the gate of MOS transistors 1071, an n channel MOS transistor 1083 connected between external power supply node EXV and node NK21 and receiving internal power supply voltage Vcc1 at its gate, and an n channel MOS transistor 1084 connected between node NK21 and ground node Vss and having its gate connected to the gate of MOS transistor 1071.

MOS transistor 1071 and MOS transistors 1082 and 1084 configure a current mirror circuit. At the time of operation, there are current flows of the same value through MOS transistors 1082 and 1084. Therefore, the gate-source voltages of the same magnitude are generated in MOS transistors 1081 and 1083. Reference voltage Vref1 and internal power supply voltage Vcc1 are, after both level-shifted by the same value, provided to nodes NK20 and NK21, respectively. At the time of stand-by when signal /RAS is at "H", MOS transistor 1058 is in an off state. There is no current flow through MOS transistors 1071, 1082, and 1084. Therefore, in level shift circuit 4050, there is no current flow, and level shifting operation is not carried out. At the time, nodes NK20 and NK21 are clamped to Vref1−Vthn and Vcc1−Vthn, respectively.

Current mirror type differentially amplifying circuit 4030 includes an n channel MOS transistor 1076 receiving the level-shifted reference voltage applied to node NK20 from level shift circuit 4050, an n channel MOS transistor 1075 receiving the level-shifted internal power supply voltage applied to node NK21 at its gate, a p channel MOS transistor 1067 connected between MOS transistor 1075 and external power supply node EXV, a p channel MOS transistor 1068 connected between MOS transistor 1076 and external power supply node EXV, and an n channel MOS transistor 1079 connected between the sources of MOS transistors 1075 and 1076 connected together and the ground node and having its gate connected to the gate of MOS transistor 1071. MOS transistor 1068 has its gate and drain interconnected. In current mirror type differentially amplifying circuit 4030, MOS transistor 1079 serving as a current source configures a current mirror circuit together with MOS transistor 1071. At the time of operation, current mirror type differential amplifying circuit 4030 amplifies the difference between the signal voltage on node NK20 and the signal voltage on node NK21, that is, (Vref1−Vcc1) for output.

Differentially amplifying circuit 4040 includes an n channel MOS transistor 1077 receiving a signal on node NK20 at its gate, an n channel MOS transistor 1078 receiving a signal on node NK21 at its gate, a p channel MOS transistor 1069 connected between MOS transistor 1074 and external power supply node EXV, a p channel MOS transistor 1070 connected between MOS transistor 1078 and external power supply node EXV, and an n channel MOS transistor 1080 connected between the sources of MOS transistors 1077 and 1078 connected together and the ground node. MOS transistor 1070 has its gate and drain interconnected. MOS transistor 1080 configures a current mirror circuit together with MOS transistor 1071. Differentially amplifying circuit 4040 amplifies the difference between the voltage on node NK21 and the voltage on node NK20, that is, (Vcc1−Vref1) for output at the time of operation.

Differentially amplifying circuits 4030 and 4040 have the same application factor. More specifically, their components are set equal in size, and transistors 1079 and 1080 serving as current sources generate the same operation current.

Current mirror type amplifying circuit 4010 includes an n channel MOS transistor 1072 receiving an output signal from differentially amplifying circuit 4030 at its gate, an n channel MOS transistor 1073 receiving an output signal from differentially amplifying circuit 4040 at its gate, a p channel MOS transistor 1060 connected between MOS transistor 1072 and external power supply node EXV, a p channel MOS transistor 1061 connected between MOS transistor 1073 and external power supply node EXV, and an n channel MOS transistor 1074 connected between the sources of MOS transistors 1072 and 1073 connected together and the ground node. MOS transistor 1061 has its gate and drain interconnected. MOS transistor 1074 configures a current mirror circuit together with MOS transistor 1071. Current mirror type amplifying circuit 4040 adjusts the potential of the gate (node N54) of p channel MOS transistor 1062 supplying current from external power supply node EXV to internal power supply node Vcc1. MOS transistor 1062 has a relatively small current drivability similar to the structure shown in FIG. 43.

Driving portion 4020 includes a CMOS inverter 1086 inverting and amplifying a signal on a node N54 of current mirror type amplifying circuit 4010, a CMOS inverter 1087 inverting and amplifying an output signal from inverter 1086, a p channel MOS transistor 1063 connected between external power supply node EXV and a node N55 for transmitting external power supply voltage EXV to node N55 in response to an output signal from inverter 1086, a p channel MOS transistor 1065 having one conduction terminal (drain) connected to the ground node and receiving bias voltage VB (=EXV−ΔV−|Vthp|) at its gate, and a p channel MOS transistor 1064 connected between the other conduction terminal of MOS transistor 1065 and node N55 and receiving an output signal from CMOS inverter 1087 at its gate. The signal voltage on node N55 is applied to the gate of p channel MOS transistor 1066 connected between external power supply node EXV and internal power supply node Vcc1. MOS transistor 1066 has a relatively large current drivability similar to the structure shown in FIG. 43. The structure and operation of driving portion 4020 are the same as those of the second driving portion shown in FIG. 43.

The internal power supply voltage generating circuit further includes an inverter 1085 inverting row address strobe signal /RAS, a p channel MOS transistor 1058 supplying current to p channel MOS transistor 1071 from external power supply node EXV in response to signal /RAS, and a p channel MOS transistor 1059 connected between external power supply node EXV and node N54 and receiving an output signal from inverter 1085 at its gate. Operation will now be described.

The operation of current mirror type amplifying circuit 4010 and driving portion 4020 is the same as that of first driving portion 3900 and second driving portion 3910 shown in FIG. 43. Only the difference will be described hereinafter.

At the time of stand-by when signal /RAS is at "H", MOS transistor 1058 is in an off state, and MOS transistor 1071 is not supplied with current. Therefore, MOS transistors 1082 and 1084 in level shift circuit 4050 are similarly in an off state, and current is not consumed in level shift circuit 4050. Also in current mirror type differentially amplifying circuits 4030 and 4040, MOS transistors 1071 and 1080 are in an off state. There is no current flow and no amplifying operation is carried out.

When signal /RAS attains "L", MOS transistor 1058 is turned on, there is a current flow through MOS transistor 1071, and level shift circuit 4050 and differentially amplifying circuits 4030 and 4040 are activated. Voltages obtained by level-shifting reference voltage Vref1 and internal power supply voltage Vcc1 by the same value are transmitted onto nodes NK20 and NK21, respectively. In differentially amplifying circuit 4030, when the voltage on node NK20 is higher than the voltage on node NK21, the conductance of MOS transistor 1076 is higher than the conductance of MOS transistor 1075. Therefore, there is a larger current flow through MOS transistor 1076. MOS transistor 1075 is supplied with current having the same magnitude as the current flow through MOS transistor 1076 through MOS transistor 1067 (MOS transistors 1067 and 1068 configure a current mirror circuit). More specifically, the sum of currents supplied from MOS transistors 1075 and 1076 is set to a constant value by the current drivability of MOS transistor 1079 serving as a current source. Therefore, when the conductance of MOS transistor 1075 decreases, and there is a smaller current flow through MOS transistor 1075, there is a current flow of the magnitude for compensating for the decreased current through MOS transistor 1076. Therefore, the amount of current flowing through MOS transistor 1076 increases, and the current mirror operation by MOS transistors 1067 and 1068 causes the amount of current supplied by MOS transistor 1067 to increase. As a result, the drain voltage of MOS transistor 1075 increases.

On the other hand, when the voltage on node NK21 is higher than the voltage on node NK20, the conductance of MOS transistor 1075 becomes higher than the conductance of MOS transistor 1076. There is a larger current flow through MOS transistor 1075 than through MOS transistor 1076. Accordingly, the amount of current flowing through MOS transistor 1076 decreases, and the amount of current supplied by MOS transistor 1067 decreases. As a result, the drain voltage of MOS transistor 1075 decreases. More specifically, differentially amplifying circuit 4030 amplifies the voltage of (Vref1−Vcc1) for output.

In differentially amplifying circuit 4040, when the voltage on node NK21 is higher than the voltage on node NK20, the conductance of MOS transistor 1078 becomes higher than the conductance of MOS transistor 1077, thereby increasing the amount of current flowing through MOS transistor 1078. The sources of MOS transistors 1077 and 1078 are connected together, and connected to MOS transistor 1080 serving as a current source. Therefore, when the amount of current flowing through MOS transistor 1078 increases, the amount of current flowing through MOS transistor 1077 decreases. MOS transistor 1077 is supplied with current having the same magnitude as the current flowing through MOS transistor 1078 through MOS transistor 1069 (when MOS transistors 1070 and 1069 are the same in size). Therefore, the drain voltage of MOS transistor 1077 increases. When the voltage node NK21 is lower than the voltage on node NK20, the drain voltage of MOS transistor 1077 decreases in differentially amplifying circuit 4040. More specifically, differentially amplifying circuit 4040 amplifies the voltage (Vcc1−Vref1) for output.

In current mirror type amplifying circuit 4010, MOS transistor 1072 receives an output signal from differentially amplifying circuit 4030 at its gate, and MOS transistor 1073 receives an output signal from differentially amplifying circuit 4040 at its gate. When the gate potential of MOS transistor 1073 is higher than the gate potential of MOS transistor 1072, the potential on node N52 increases. Otherwise, the potential on node N54 decreases. More specifically, current mirror type amplifying circuit 4010 further amplifies the voltage of K·(Vcc1−Vref1)−K·(Vref1−Vcc1) for output. Here, K denotes an amplification factor of differentially amplifying circuits 4030 and 4040. Therefore, the potential of node N54 changes at a high speed according to the difference between internal power supply voltage Vcc1 and reference voltage Vref1. The voltage on node N54 is applied to CMOS inverter 1086 at the first stage of driving portion 4020. Therefore, an input signal from CMOS inverter 1086 changes at a high speed, time during which there is a through current flow through the CMOS inverter is shortened, and current consumption in CMOS inverter 1086 is reduced. Similarly, since an output signal from CMOS inverter 1086 changes at a high speed, the amount of through current in CMOS inverter 1087 is also reduced. Therefore, the high speed response of driving portion 4020 is further improved, and power consumption in driving portion 4020 is reduced.

Figures 46A, 46B:
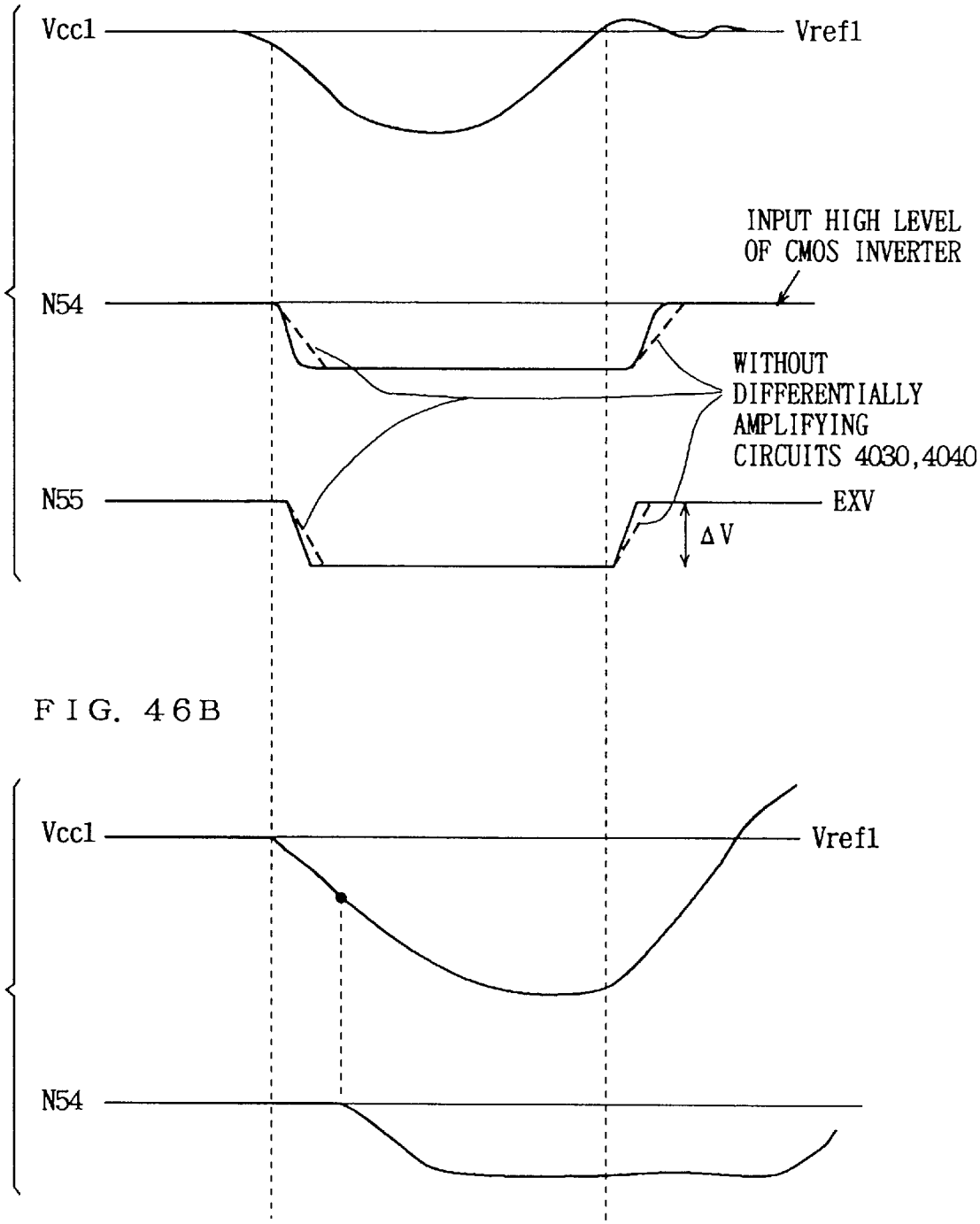
FIGS. 46A and 46B are signal waveform diagrams for explaining the effect brought about by the internal power supply voltage generating circuit shown in FIGS. 44 and 45.

FIG. 46 is a waveform diagram for explaining the effects brought about by the internal power supply voltage generating circuit according to the sixth embodiment. FIG. 46A shows changes of internal power supply voltage Vcc1, the voltage on node N54 and the voltage on node N55, when the difference between internal power supply voltage Vcc1 and reference voltage Vref1 is amplified and applied to the current mirror type amplifying circuit, and when the difference is applied to the current mirror type amplifying circuit without being amplified. FIG. 46B shows change of internal power supply voltage Vcc1 and change of the voltage on node N54 when neither the driving portion nor the differentially amplifying circuit is provided. In the structure where the signal waveforms of FIG. 46B are provided, the gate width of a p channel MOS transistor supplying current to internal power supply node Vcc1 is made sufficiently large (because current supplying capability for 100 mA is required). Therefore, the gate capacitance has a large value.

As shown in FIG. 46A, when internal power supply voltage Vcc1 is lower than reference voltage Vref1, the potential of node N54 decreases. If differentially amplifying circuits 4030 and 4040 are provided, the potential of node N54 decreases at a high speed. Further, the potential of node N55 decreases from external power supply voltage EXV by a prescribed value ΔV. If differentially amplifying circuits 4030 and 4040 are not provided, the potentials of nodes N55 and N54 gently change a little gently as shown by broken lines in FIG. 46A. Therefore, provision of differentially amplifying circuits 4030 and 4040 allows the potentials of nodes N54 and N55 to change at a high speed. A period during which both a p channel MOS transistor and an n channel MOS transistor in each of CMOS inverters 1086 and 1087 included in driving portion 4020 are turned on is substantially shortened, and current consumption is reduced. The response characteristics (high-frequency response characteristics) of the Vcc1 generating circuit are also improved because the potential of node N54 changes at a high speed.

When differentially amplifying circuits 4030 and 4040 and driving portion 4020 are not provided, the potential of node N54 changes gently as shown in FIG. 46B. This is because the large gate capacitance of an MOS transistor for generating internal power supply voltage Vcc1 causes delay in change of the potential on node N54 when the operation current of the current mirror type amplifying circuit driving the MOS transistor is small. Therefore, adjusting operation for internal power supply voltage Vcc1 is delayed, the change width of internal power supply voltage Vcc1 is made larger, and undershoot and overshoot are generated in internal power supply voltage Vcc1. Therefore, with such a structure as in the present invention in which differentially amplifying circuits and a driving portion are provided, and in which two p channel MOS transistors generate internal power supply voltage, an internal power supply voltage generating circuit having a high speed response with low current consumption can be implemented.

[Reference Voltage Generating Circuit]

Figure 47:
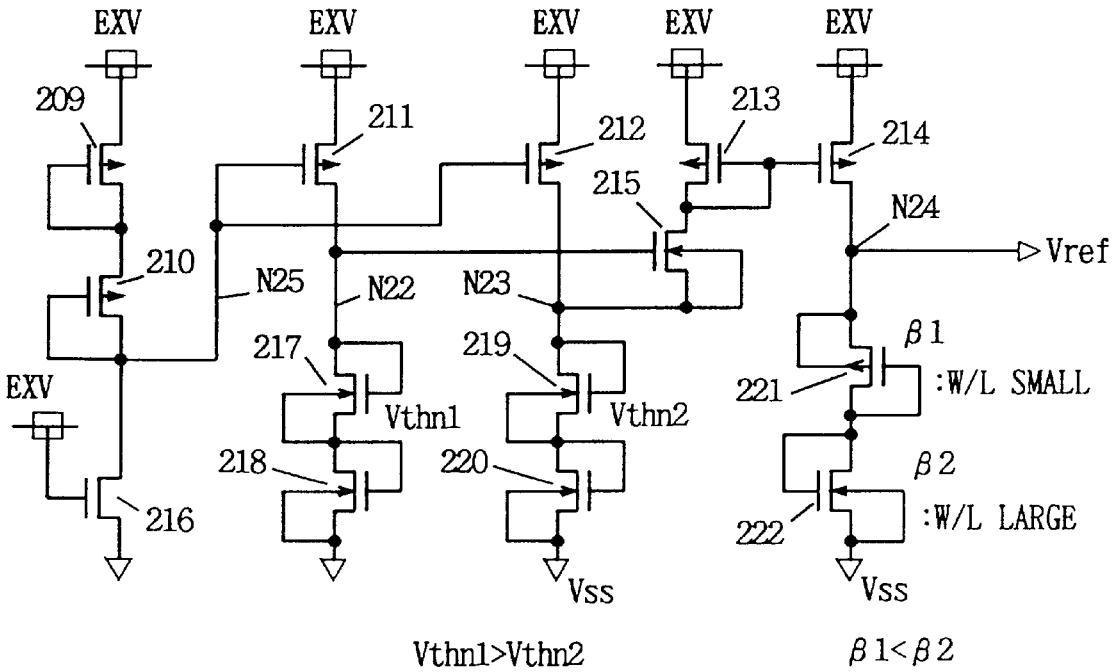
FIG. 47 is a diagram showing a specific configuration of a reference voltage generating circuit.

FIG. 47 is a diagram showing a structure of a reference voltage generating circuit according to the present invention. Referring to FIG. 47, the reference voltage generating circuit includes p channel MOS transistors 209 and 210 and an n channel MOS transistor 216 connected in series between external power supply node EXV and the ground node, a p channel MOS transistor 211 and n channel MOS transistors 217 and 218 connected in series between external power supply node EXV and ground node Vss, and a p channel MOS transistor 212 and n channel MOS transistor 219 and 220 connected in series between external power supply node EXV and ground node Vss. MOS transistors 209 and 210 each have the gate and drain interconnected and operate as a diode. MOS transistor 216 receives external power supply voltage EXV at its gate, and serves as a resistance element. More specifically, MOS transistors 209 and 210 each causes voltage drop of |Vthp|. Here, Vthp denotes the threshold voltage of p channel MOS transistors 209 and 210.

MOS transistor 211 receives the voltage on node N25 at its gate. MOS transistor 217 and 218 each have the gate and drain interconnected and the substrate region connected to the source. By connecting respective substrate regions to the sources in MOS transistors 217 and 218, the substrate effect is prevented, and the threshold voltages of MOS transistors 217 and 218 are held constant. The voltage of EXV−2|Vthp| is applied to the gate of MOS transistor 211. Therefore, the gate-source voltage of MOS transistor 211 attains −2|Vthp|. Irrespective of the value of external power supply voltage EXV, a constant gate-source voltage is provided (when MOS transistors 209 and 210 are in an on state). Therefore, MOS transistor 211 supplies constant small current stably. MOS transistors 217 and 218 has a larger current drivability (larger β) than MOS transistor 211. MOS transistors 218 and 218 cause voltage drop of Vthn1, respectively. More specifically, node N11 is set to the voltage level of 2·Vthn1.

MOS transistor 212 receives the voltage on node N25 at its gates, and MOS transistors 219 and 220 are diode-connected, respectively. Respective substrate regions of MOS transistors 219 and 220 are connected to their respective sources. MOS transistors 219 and 220 have the threshold voltage Vthn2 smaller than the threshold voltage Vthn1 of MOS transistors 217 and 218. Therefore, node N23 is set to a constant voltage of 2·Vthn2.

The reference voltage generating circuit further includes an n channel MOS transistor 215 receiving the voltage on node N22 at its gate and the voltage on node N23 at its source, a p channel MOS transistor 213 supplying current from external power supply node EXV to MOS transistor 215, a p channel MOS transistor 214 connected with MOS transistor 213 in a current mirror manner for supplying current from external power supply node EXV to node N24, and a p channel MOS transistor 221 and an n channel MOS transistor 222 connected in series between node N24 and ground node Vss. MOS transistor 215 has its substrate region connected to the source region in order to prevent generation of the substrate effect. MOS transistor 213 has its gate and drain interconnected. As a result, MOS transistor 214 is supplied with mirror current corresponding to the current flow in MOS transistor 203. More specifically, when the ratio of coefficients β (of W/L) of MOS transistors 213 and 214 is set to 1:k, MOS transistor 214 is supplied with current k times current I in MOS transistor 213.

The gate-source voltage of MOS transistor 215 is 2 (Vthn1−Vthn2). There is a constant drain current flow through MOS transistor 215 which is determined by the gate-source voltage of MOS transistor 215 (when $Vds<Vgs-Vth$, $Ids=\beta(Vgs-Vth)^2$). This condition is implemented by making β of MOS transistor 215 smaller than those of MOS transistors 219 and 220.

MOS transistor 215 is supplied with the constant current through MOS transistor 213. MOS transistor 214 is supplied with a mirror current corresponding to the current flow through MOS transistor 213.

In order to convert the current applied to node N24 through MOS transistor 214 into a voltage, p channel MOS transistor 221 and n channel MOS transistor 222 are connected in series between node N24 and ground node Vss. P channel MOS transistor 221 has its source and substrate region connected to node N24, and its gate and drain interconnected. N channel MOS transistor 222 has its gate and drain interconnected, and its source and substrate region connected to the ground voltage node. The ratio W/L of the gate width to the gate length of p channel MOS transistor 221 is set small. The ratio W/L of the gate width to the gate length of MOS transistor 222 is sufficiently larger than that of MOS transistor 221. As a result, coefficient β of MOS transistor 221 is set sufficiently smaller than coefficient β of MOS transistor 222. More specifically, $\beta 1 << \beta 2$. As a result, MOS transistor 221 operates in a resistance mode, causing a voltage drop represented by a product of the channel resistance and the applied current. On the other hand, MOS transistor 222 operates in a diode mode, causing a voltage drop of the threshold voltage Vthn.

Assume that the current applied from MOS transistor 214 is I. MOS transistor 221 causes a voltage drop of I·Rch, and MOS transistor 222 causes a voltage drop of Vthn. Therefore, $$Vref=I\cdot Rch+Vthn$$

is obtained as reference voltage Vref. Here, Rch denotes the channel resistance of MOS transistor 221. I is constant. Stable reference voltage Vref is obtained which does not depend on external power supply voltage EXV. By connecting in series MOS transistors different in the ratio W/L of the gate width to the gate length, that is, different in coefficient β, the following effects are obtained.

Figure 48:
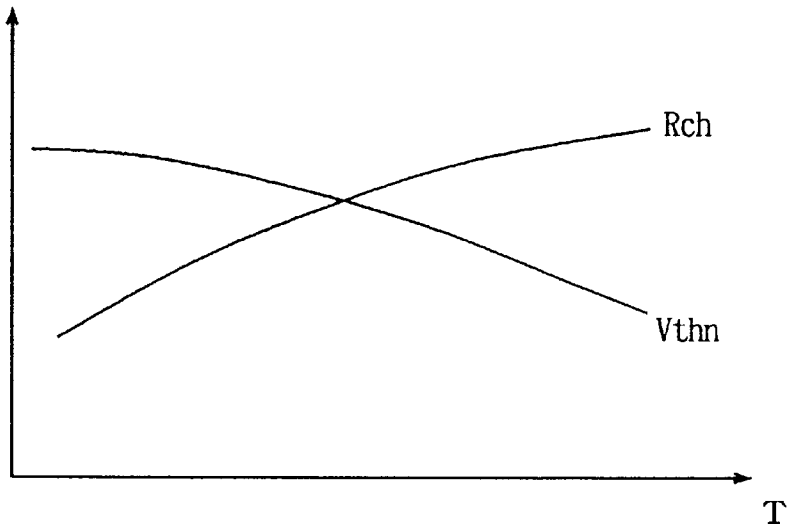
FIG. 48 is a diagram for explaining the effect brought about by the reference voltage generating circuit shown in FIG. 47.

As shown in FIG. 48, the channel resistance Rch of an MOS transistor increases as a rise of temperature T. On the other hand, the threshold voltage Vthn of an MOS transistor decreases as the rise of the temperature. Current I is provided by the difference between the threshold voltage Vthn of MOS transistors 217 and 218 and the threshold voltage Vthn of MOS transistors 219 and 220. Current I exhibits the same temperature characteristics. Current I is constant independent of the temperature. On the other hand, the channel resistance Rch of MOS transistor 221 for current/voltage conversion increases as the rise of the temperature, and the threshold voltage Vthn of MOS transistor 222 decreases as a rise of the temperature. Therefore, even if I·Rch increases as the rise of the temperature, the influence of the rise of the temperature on reference voltage Vref is canceled by decrease of the threshold voltage Vthn as the rise of the temperature. It is possible to generate approximately constant reference voltage Vref.

Note that p channel MOS transistor 221 is used for current/voltage conversion in the structure shown in FIG. 47. This is for easily implementing a relatively large channel resistance. However, an n channel MOS transistor may be used instead of p channel MOS transistor 221.

[Modification]

Figure 49:
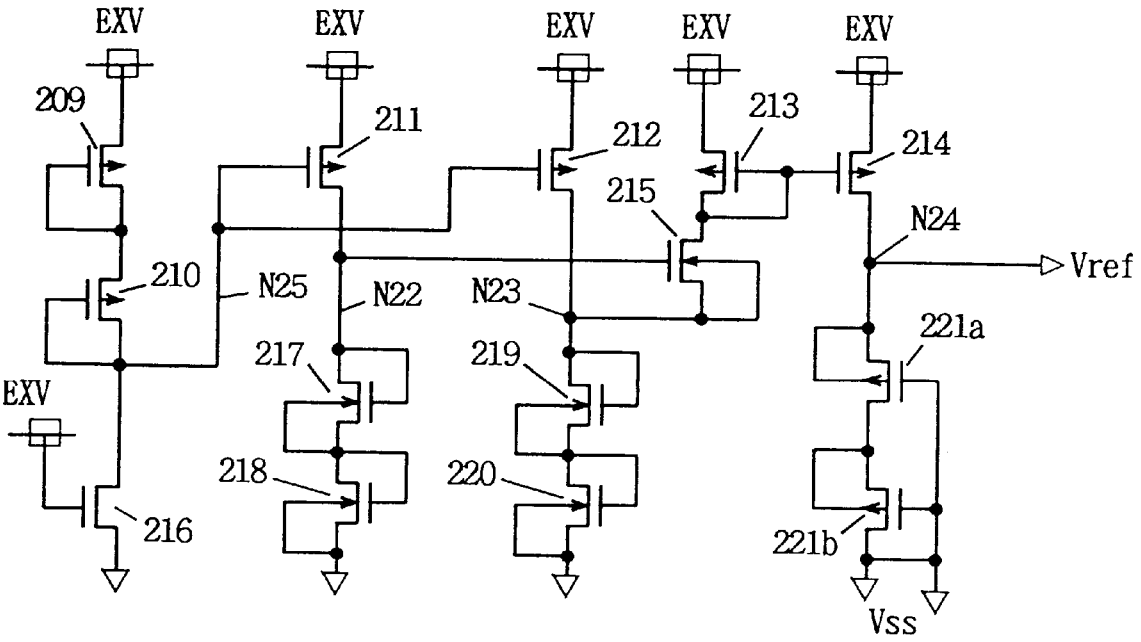
FIG. 49 is a diagram showing a further structure of the reference voltage generating circuit according to the present invention.

FIG. 49 is a diagram showing a modification of the reference voltage generating circuit shown in FIG. 48. In the reference voltage generating circuit shown in FIG. 49. p channel MOS transistors 221a and 221b are connected in series between node N24 and ground node Vss as a means for converting current into voltage. P channel MOS transistor 221a has its substrate region and source connected to node N24, and its gate connected to ground node Vss. P channel MOS transistor 221b has its substrate region and source connected to the drain of MOS transistor 221a and its gate and source connected to ground node Vss. MOS transistor 221a has an on resistance (channel resistance) sufficiently larger than MOS transistor 221b or the ratio W/L of the gate width to the gate length (or coefficient β) sufficiently smaller than MOS transistor 221b. Therefore, also in this case, the gate-source voltage of p channel MOS transistor 221b attains |Vthp|, and reference voltage Vref is represented by:

$$Vref=I\cdot Rchp+|Vthp|$$

In the above expression, Rchp denotes the channel resistance of MOS transistor 221a, and Vthp denotes the threshold voltage of MOS transistor 221a. In the structure shown in FIG. 41, MOS transistors 221a and 221b have their respective substrate regions connected to their respective source regions. Without the influence of the substrate effect, these transistors can generate reference voltage Vref at a constant voltage level stably.

As described above, according to the structure of the reference voltage generating circuit of the present invention, a constant voltage is applied to the gate and source of an MOS transistor to cause the MOS transistor to generate constant current, and mirror current corresponding to the constant current is converted into a voltage. Therefore, reference voltage at a constant voltage level can be generated stably without the influence of change of power supply voltage. By using a circuit formed of series-connected MOS transistors different in the ratio of the gate width to the gate length, that is, coefficient β as this current/voltage converting element, reference voltage Vref stable with respect to the temperature can be generated.

[Power Supply Voltage Distribution Structure 2 in Semiconductor Memory Device]

Figure 50:
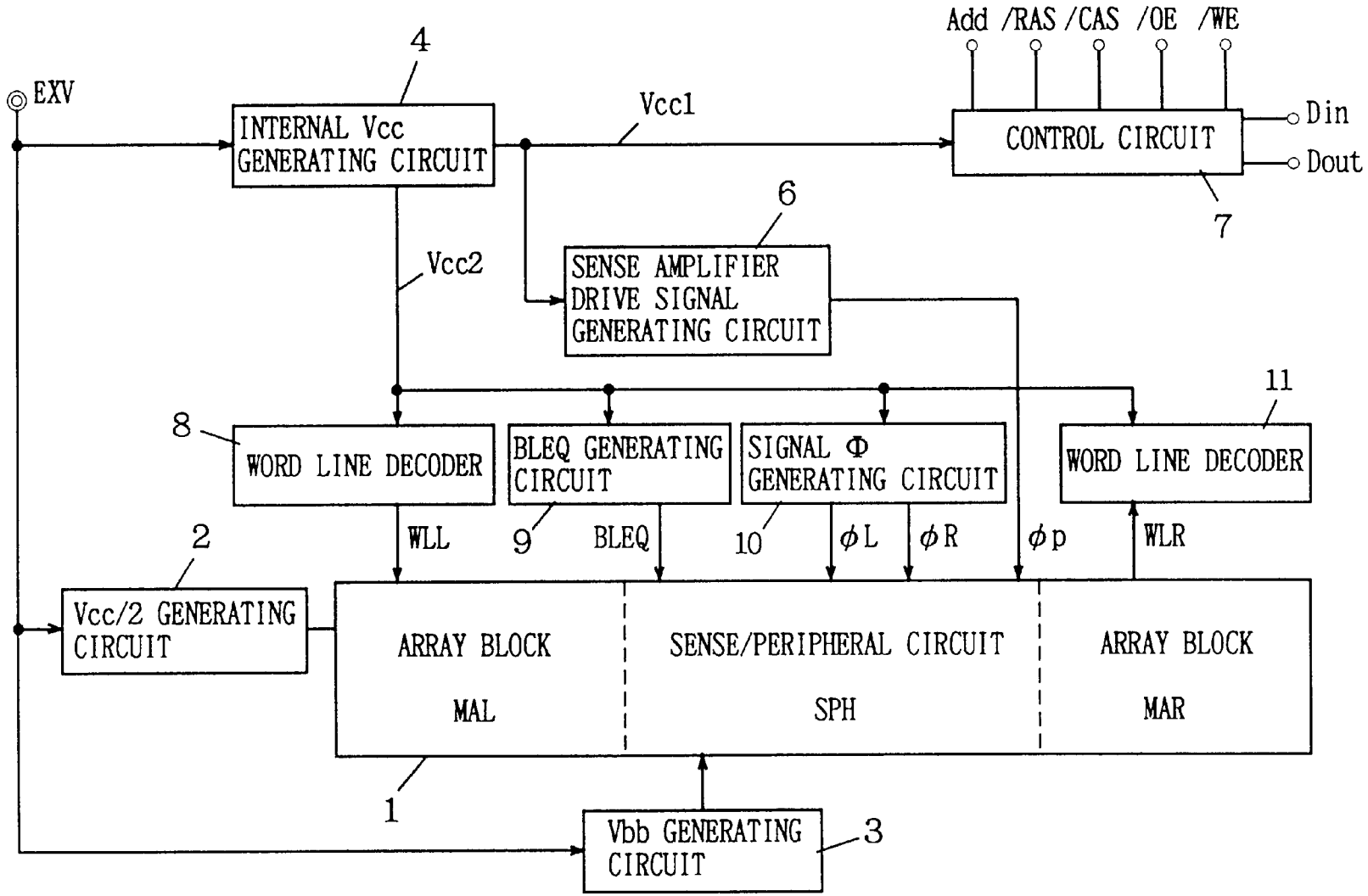
FIG. 50 is a diagram showing a further structure of internal power supply voltage distribution of the semiconductor memory device according to the present invention.

FIG. 50 is a diagram showing a further embodiment of power supply voltage distribution of a semiconductor memory device according to the present invention. The semiconductor memory device shown in FIG. 50 includes, similar to the semiconductor memory device shown in FIG. 23, memory cell array 1, Vcc/2 generating circuit 2, Vbb generating circuit 3, internal Vcc generating circuit 4, sense amplifier drive signal generating circuit 6, control circuit 7, word line decoders 8 and 11, BLEQ generating circuit 9, and signal Φ generating circuit 10. Each circuit has the same structure as that of FIG. 23. In the semiconductor memory device shown in FIG. 50, a circuit generating internal high voltage Vpp is not provided. Internal Vcc generating circuit 4 generates first internal power supply voltage Vcc1 and second internal power supply voltage Vcc2 higher than first internal power supply voltage Vcc1. Second internal power supply voltage Vcc2 is applied to word line decoders 8 and 11, BLEQ generating circuit 9, and signal Φ generating circuit 10. First internal power supply voltage Vcc1 is applied to sense amplifier drive signal generating circuit 6 and control circuit 7. Vcc/2 generating circuit 2 generates a voltage Vcc1/2 intermediate between first internal power supply voltage Vcc1 and ground voltage Vss. Vbb generating circuit 3 generates internal power supply voltage Vbb at a prescribed voltage level using external power supply voltage EXV. However, Vcc/2 generating circuit 2 and Vbb generating circuit 3 may be structured so as to generate a prescribed voltage using only internal power supply voltage Vcc1 or Vcc2.

Memory array 1 includes array blocks MAR and MAL and a sense/peripheral circuit SPH carrying out sensing operation and block selection. The structure of memory cell array 1 is the same as the structure of the memory array shown in FIG. 23.

Figure 51:
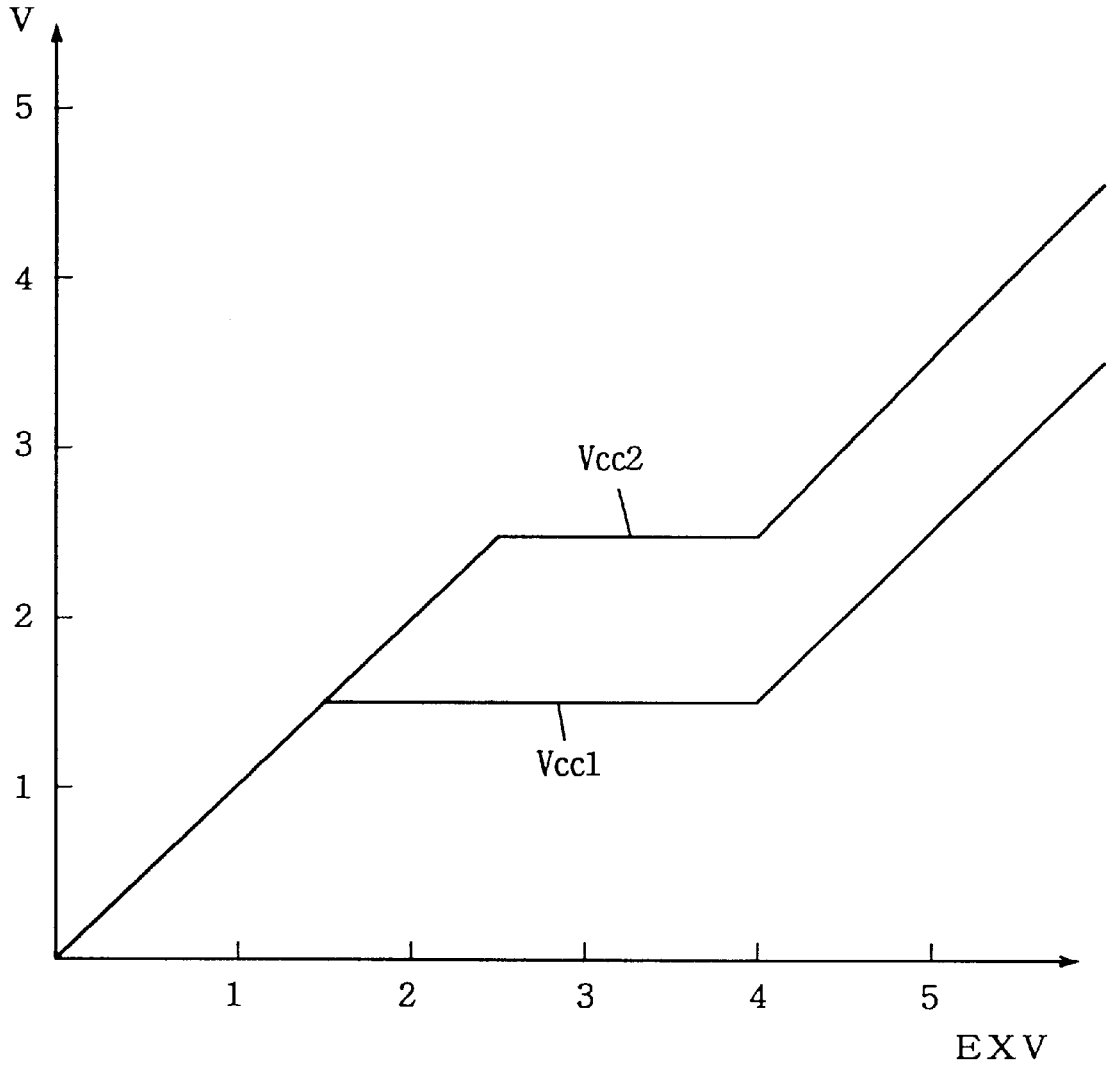
FIG. 51 is a diagram showing levels of internal power supply voltage of the semiconductor memory device shown in FIG. 50.

FIG. 51 shows the voltage levels of internal power supply voltages Vcc1 and Vcc2 generated by internal Vcc generating circuit 4. As shown in FIG. 51, during the normal operation, first internal power supply voltage Vcc1 is set to 1.5 V, and second internal power supply voltage Vcc2 is set to 2.5 V. In order to compensate for loss of the threshold voltage of an MOS transistor, a selected word line and block select signals ΦL and ΦR are set to a voltage level higher than first internal power supply voltage Vcc1 by the threshold voltage Vthn of the MOS transistor or more. When first internal power supply voltage Vcc1 is 1.5 V and second internal power supply voltage Vcc2 is 2.5 V, the difference is 1.0 V, which is larger than the threshold voltage Vthn of the MOS transistor. Therefore, even if a word line drive signal and block select signal ΦL and ΦR are generated using second internal power supply voltage Vcc2, a voltage at the first internal power supply voltage Vcc1 level can be reliably written in a memory cell without voltage loss. The internal Vcc generating circuit generating first internal power supply voltage Vcc1 at 1.5 V level and second internal power supply voltage Vcc2 at 2.5 V level can use the internal power supply voltage generating circuit described before. By adjusting the value of reference voltage Vref, the voltage levels of first and second internal power supply voltages Vcc1 and Vcc2 can be changed easily. An internal power supply voltage generating circuit either in a voltage division system using resistances or in a level shift system using MOS transistors may be used.

As shown in FIG. 50, the structure in which a word line drive signal and a block select signal are generated from an internal power supply voltage generating circuit unnecessitates generation of internal high voltage with an inefficient charge pump circuit. Therefore, a semiconductor memory device which operates with lower power consumption can be implemented.

[Power Supply Voltage Distribution 3 of Semiconductor Memory Device]

Figure 52:
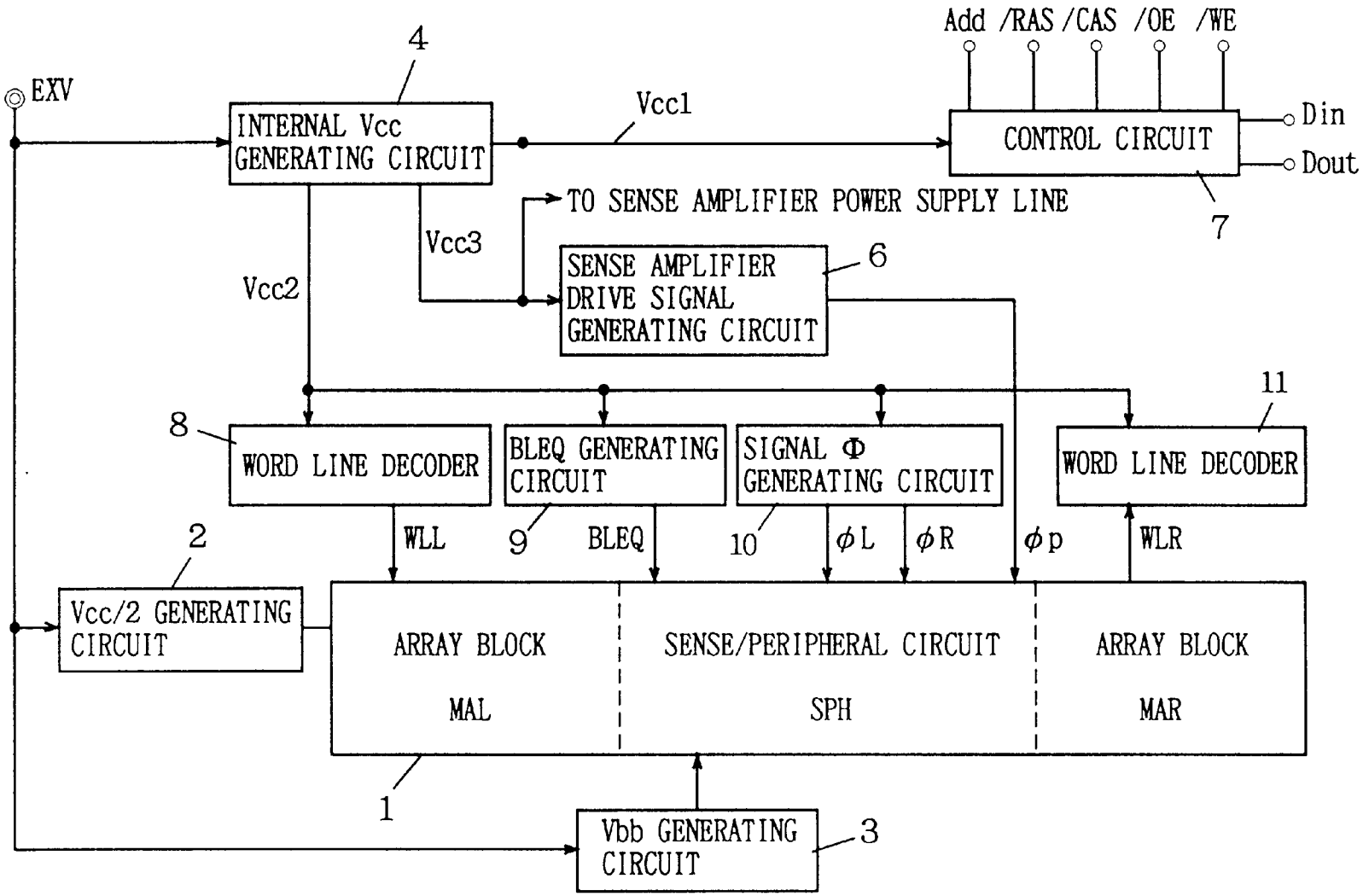
FIG. 52 is a diagram showing a further structure of internal power supply voltage distribution of the semiconductor memory device according to the present invention.

FIG. 52 is a diagram showing a structure of a third embodiment of distribution of internal power supply voltage of a semiconductor memory device according to the present invention. Referring to FIG. 52, internal Vcc generating circuit 4 generates first and second internal power supply voltages Vcc1 and Vcc2. Internal Vcc generating circuit 4 further generates third internal power supply voltage Vcc3 lower than first and second internal power supply voltages Vcc1 and Vcc2. First internal power supply voltage Vcc1 is applied to control circuit 7. Second internal power supply voltage Vcc2 is applied to word line decoders 8 and 11, BLEQ generating circuit 9, and signal Φ generating circuit 10. Third internal power supply voltage Vcc3 is transmitted onto sense amplifier drive signal generating circuit 6 and a sense amplifier power supply line. The sense amplifier power supply line corresponds to power supply node Vcc1 of the sense amplifier shown in FIG. 24. Therefore, in memory cell array 1, a bit line is charged/discharged between third internal power supply voltage Vcc3 and ground voltage Vss. Accordingly, Vcc/2 generating circuit 2 generates voltage Vcc3/2 intermediate between third internal power supply voltage Vcc3 and ground voltage Vss. Sense amplifier drive signal φp is at the third power supply voltage Vcc3 level, and word line drive signals WL and WLR, bit line equalize signal BLEQ, and block select signals ΦL and ΦR are at the second internal power supply voltage Vcc level. The voltage level of an internal control signal generated from control circuit 7 is the first internal power supply voltage Vcc1 level.

Figure 53:
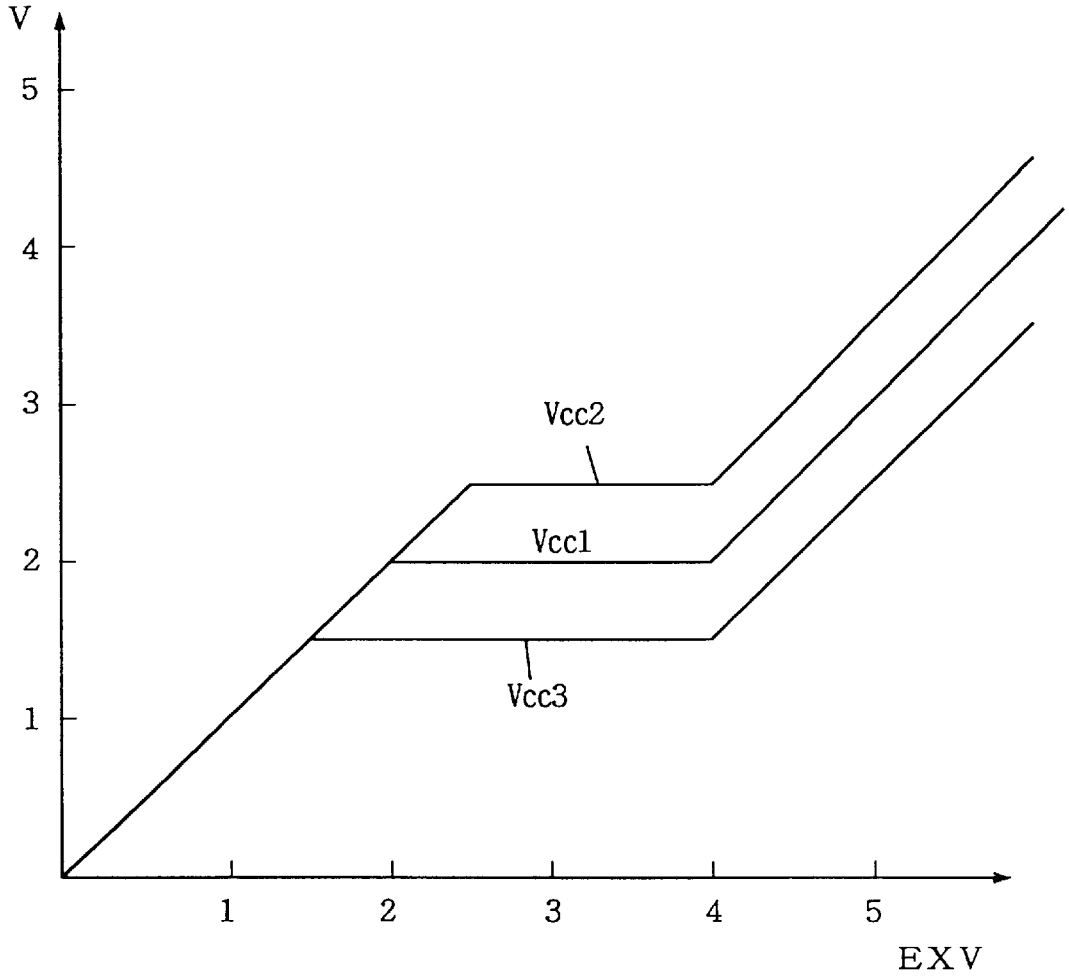
FIG. 53 is a diagram for explaining levels of internal power supply voltage of the semiconductor memory device shown in FIG. 52.
Figure 54:
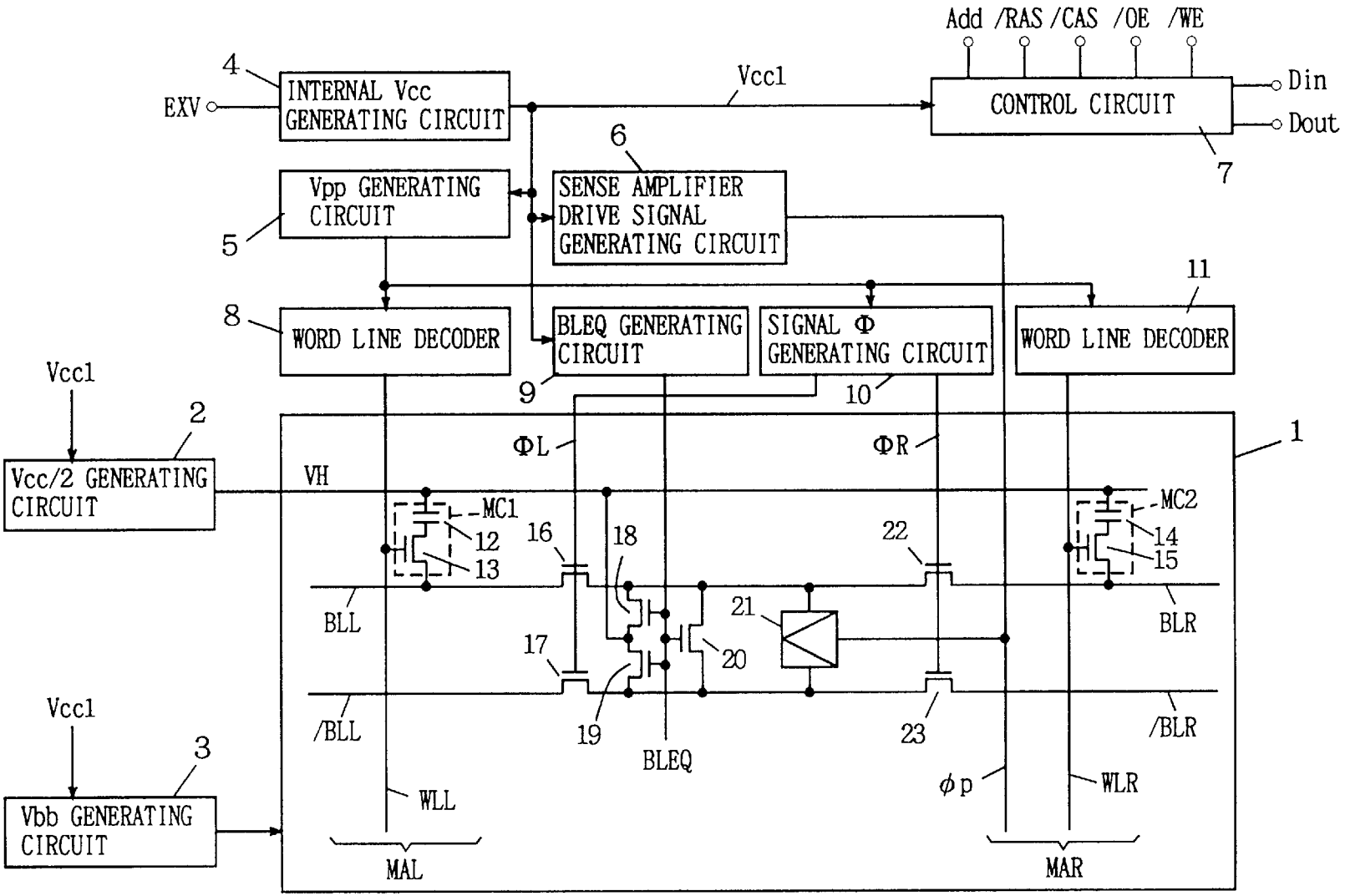
FIG. 54 is a diagram schematically showing a structure of a conventional semiconductor memory device.
Figure 55:
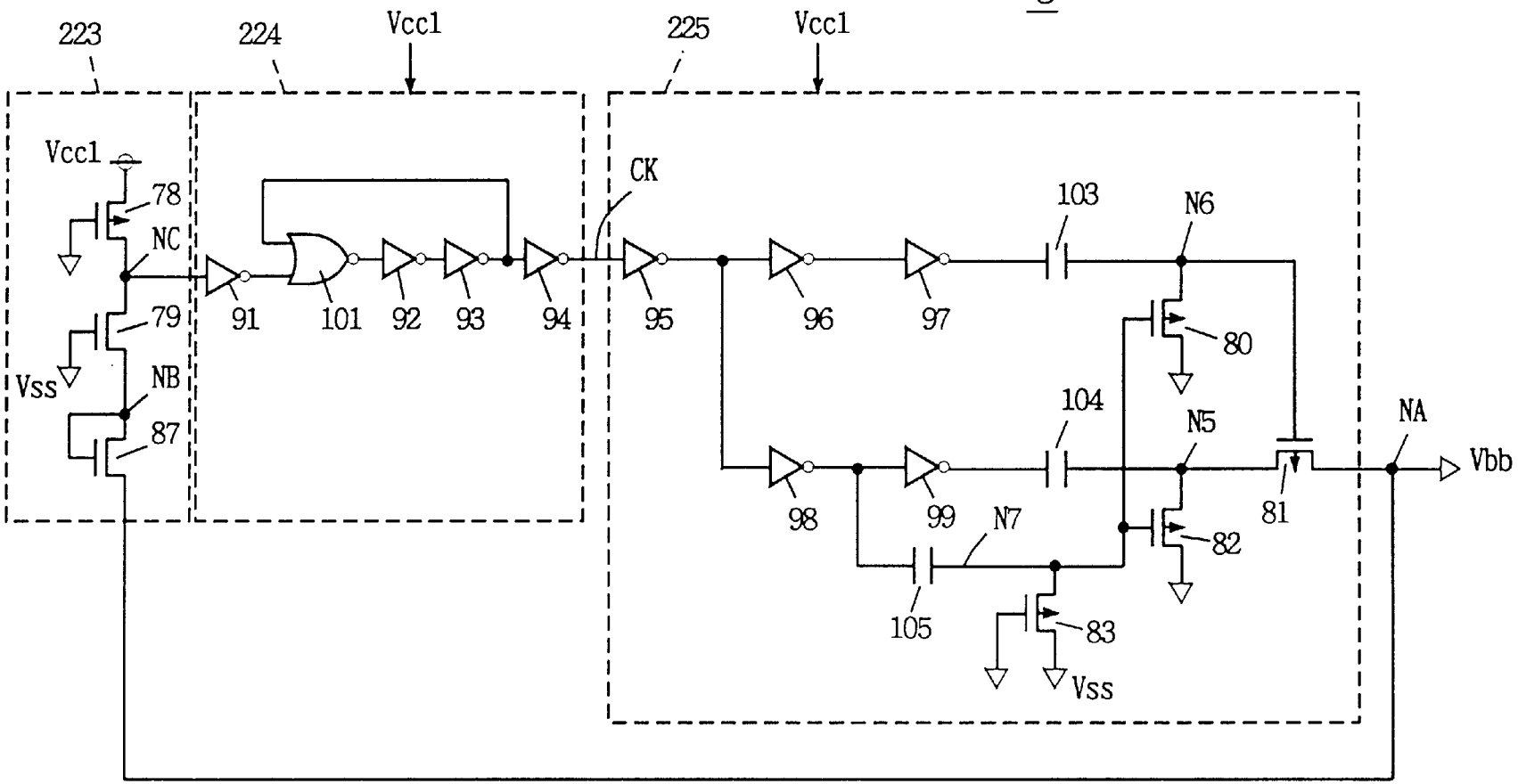
FIG. 55 is a diagram showing a structure of a conventional negative voltage generating circuit.
Figure 56:
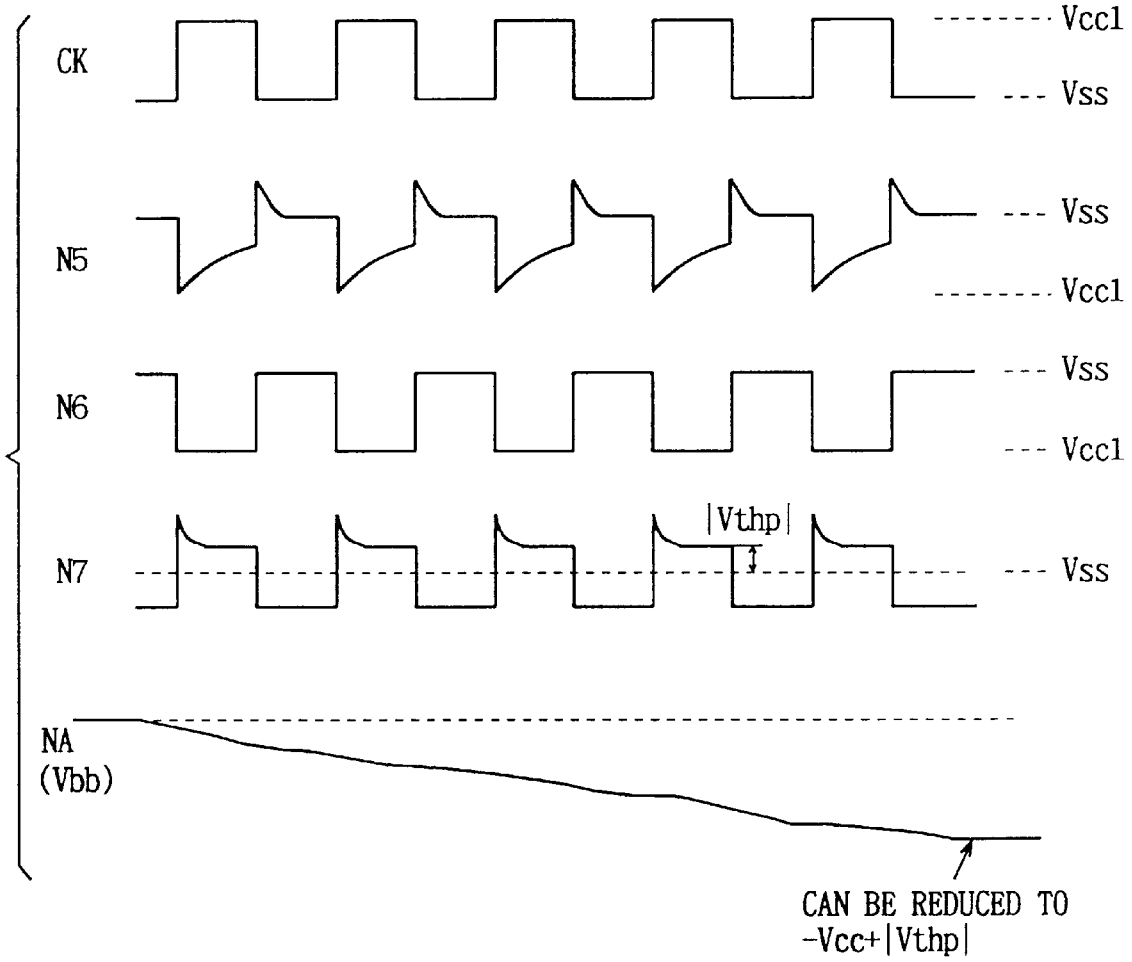
FIG. 56 is a waveform diagram showing operation of the negative voltage generating circuit shown in FIG. 55.
Figure 57:
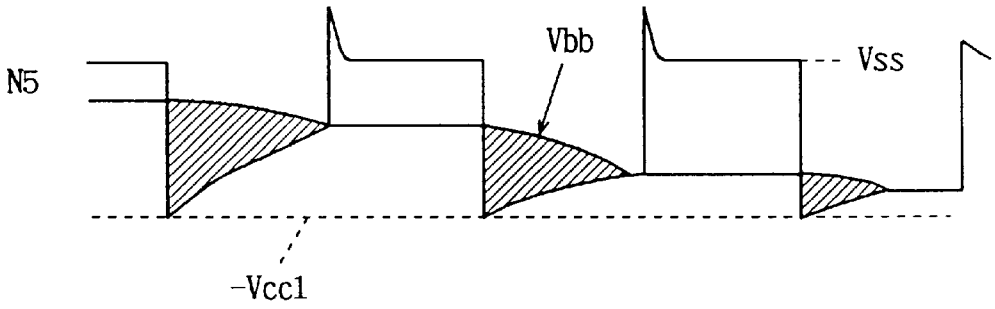
FIG. 57 is a diagram for explaining the problems of the negative voltage generating circuit shown in FIG. 55.
Figure 58:
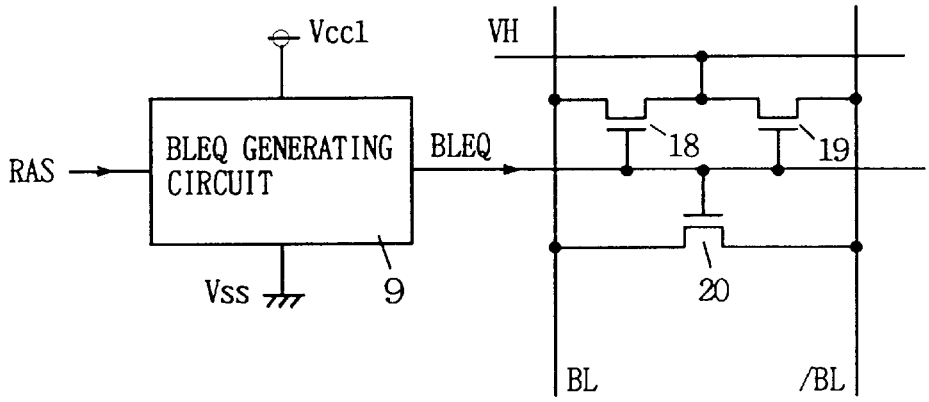
FIG. 58 is a diagram schematically showing a structure of a conventional BLEQ generating circuit.
Figure 59:
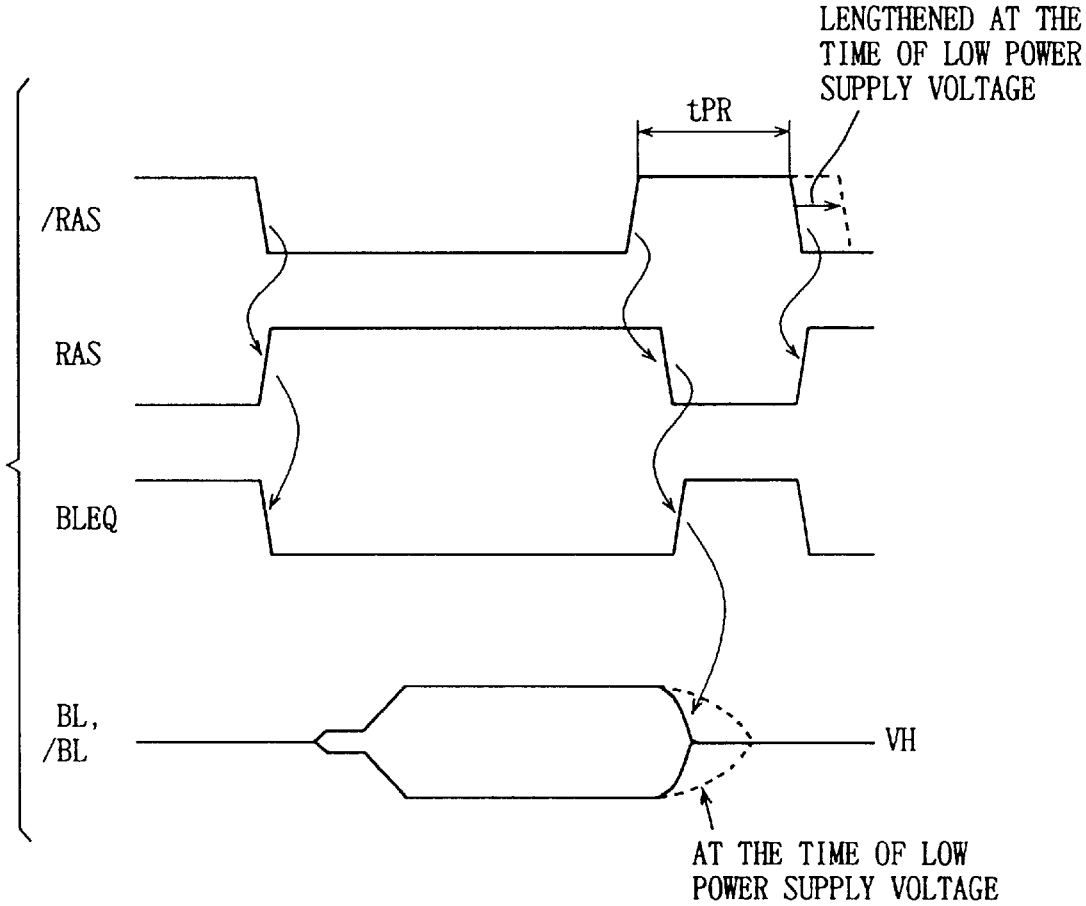
FIG. 59 is a waveform diagram for explaining the problems of the structure shown in FIG. 58.
Figure 60:
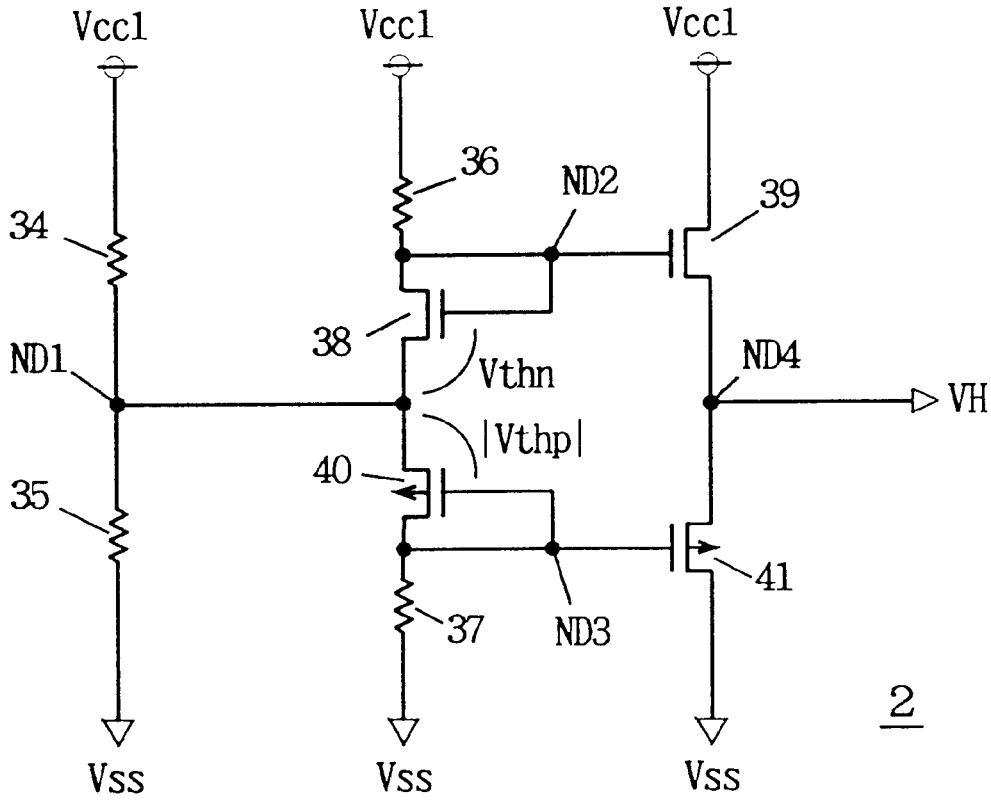
FIG. 60 is a diagram showing a structure of a conventional intermediate voltage generating circuit.
Figure 61:
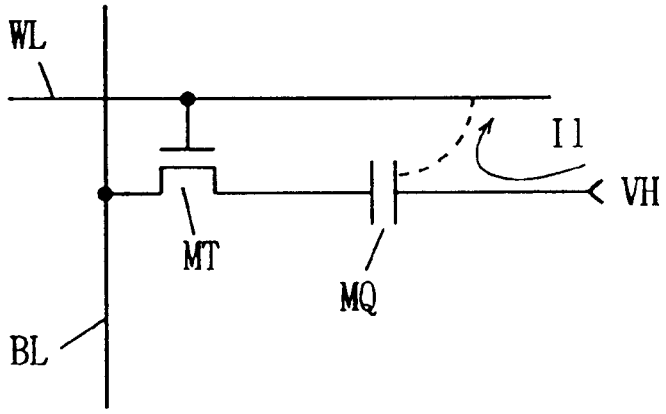
FIG. 61 is a diagram for explaining the problems of the intermediate voltage generating circuit shown in FIG. 60.
Figure 62:
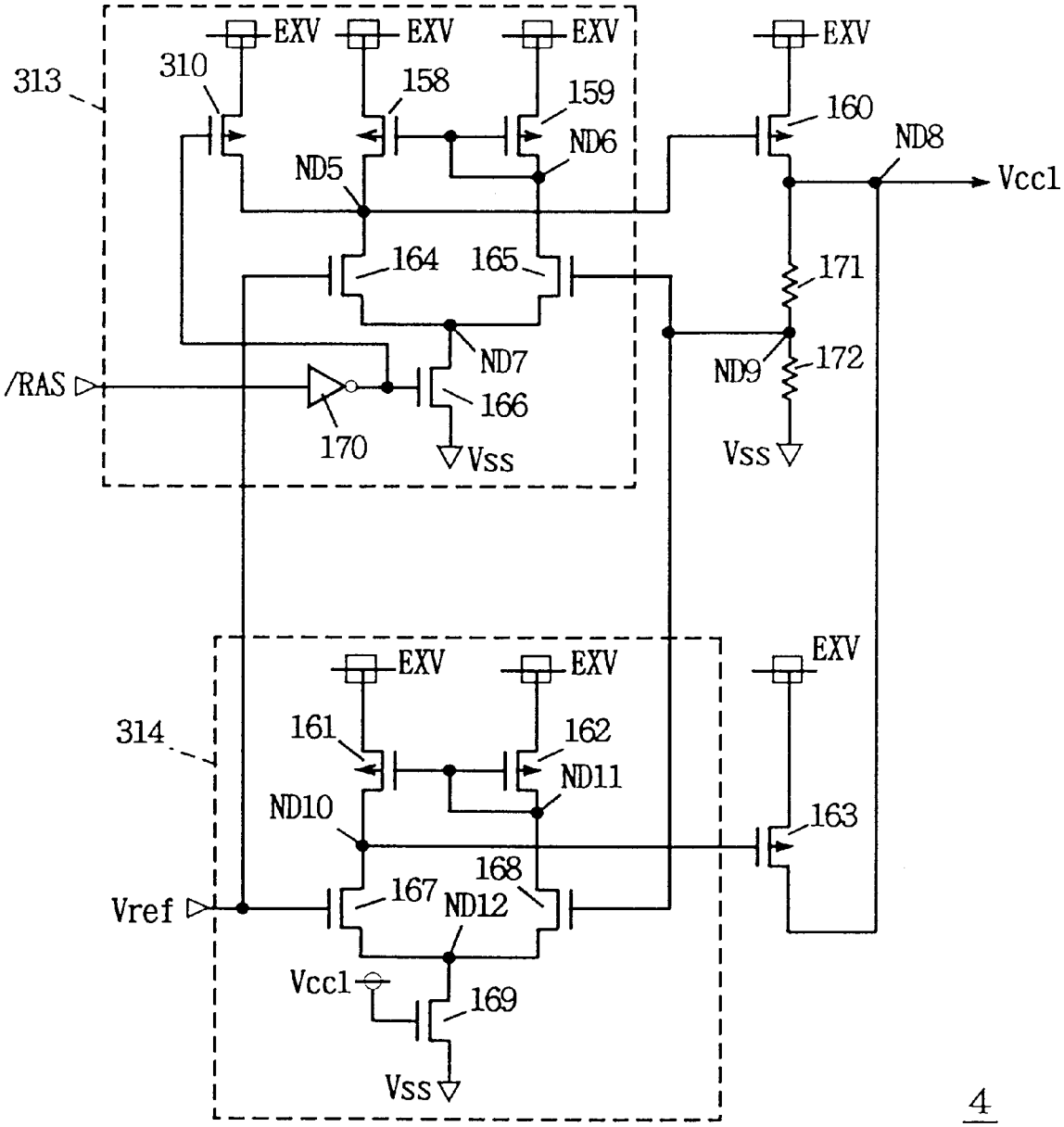
FIG. 62 is a diagram showing a structure of a conventional internal power supply voltage generating circuit.

FIG. 53 shows the voltage levels of first to third power supply voltages Vcc1, Vcc2, and Vcc3 generated by the internal Vcc generating circuit as one example. In FIG. 53, third internal power supply voltage Vcc3 is 1.5 V in a stable state, and first and second internal power supply voltages Vcc1 and Vcc2 are 2.0 V and 2.5 V, respectively, in a stable state. Normally, the voltage level of a selected word line is set to a voltage approximately 1.5 times the voltage of a bit line of a high potential. More specifically, 1.5×1.5=2.25. Therefore, a word line drive signal at a required voltage level can be generated sufficiently using second internal power supply voltage Vcc2. Application of relatively high internal power supply voltage to control circuit 7 increases the speed of operation of control circuit 7. Also in the structure shown in FIG. 57, an internal high voltage generating circuit for generating internal high voltage Vpp is not used. Therefore, the charge pumping operation for generating internal high voltage is not required, making it possible to reduce power consumption.

In the structure of power supply arrangement described above, external power supply voltage EXV is applied to an input/output buffer for interfacing between the semiconductor memory device and the outside world.

As described above, with the structure of the internal power supply voltage generating circuit according to the present invention, a plurality of kinds of internal power supply voltages are generated, and at least a bit line equalize/precharge signal is set at a voltage level higher than the charge voltage level of a bit line. Therefore, the bit line can be equalized/precharged at a high speed, making it possible to implement a semiconductor memory device operating at a high speed. Since at least the voltage level of a bit line equalize/precharge signal is increased without using charge pumping operation, increase in power consumption can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal power supply voltage generating circuit down-converting an external power supply voltage applied to an external power supply node for generating an internal power supply voltage on an internal power supply line, comprising:

comparing means for comparing a voltage on said internal power supply line and a reference voltage;

buffer means for buffering an output of said comparing means;

a first drive element supplying current from said external power supply node onto said internal power supply line in response to the output of said comparing means; and a second drive element supplying current from said external power supply node to said internal power supply line in response to an output of said buffer means.

2. The internal power supply voltage generating circuit according to claim 1, wherein said comparing means includes, level shift means coupled to receive the voltage on said internal power supply line and said reference voltage for shifting down in potential said voltage and said reference voltage, and differential amplifier means coupled to said level shift means for differentially amplifying the voltages received from said level shift means.

3. The internal power supply voltage generating circuit according to claim 2, wherein said level shift means includes source follower transistors coupled to receive said voltage on said internal power supply line and said reference voltage for transmission in a source follower mode to said differential amplifier means.

4. The internal power supply voltage generating circuit according to claim 2, wherein said differential amplifier means includes, a first differential amplifier for differentially amplifying the voltages received from said level shift means for outputting, a second differential amplifier for differentially amplifying the voltages received from said level shift means complementarily to said first differential amplifier for outputting, and a third differential amplifier coupled to receive output signals of said first and second differential amplifiers for differentially amplifying said output signals for outputting.

5. The internal power supply voltage generating circuit according to claim 2, wherein said comparing means further includes cut off means coupled to said level shift means and said differential amplifier means and responsive to an operation mode designation signal for cutting off a current flowing path in each of said level shift means and said differential amplifier means.

6. The internal power supply voltage generating circuit according to claim 5, wherein said comparing means further includes disable means responsive to said operation mode designation signal for generating and applying a signal disabling said first drive element to an output node of said differential amplifier means.

7. The internal power supply voltage generating circuit according to claim 1, wherein said buffer means includes limiting means for limiting an amplitude of an output signal thereof.

8. The internal power supply voltage generating circuit according to claim 7, wherein said limiting means includes means for shifting one level of the output signal of said buffer means, while maintaining another level of said output signal.

9. The internal power supply voltage generating circuit according to claim 1, wherein said second drive element comprises a field effect transistor of a first conductivity type, and wherein said buffer means includes a first inverter coupled to receive and invert the output signal of said comparing means, a second inverter coupled to receive and invert an output signal of said first inverter, a first field effect transistor of the first conductivity type having one conduction terminal coupled to a node receiving said external power supply voltage, another conduction terminal coupled to a control electrode node of said second drive element, and a control electrode node coupled to receive the output signal of said first inverter, a second field effect transistor of the first conductivity type having one conduction terminal coupled to said control gate of said second drive element, a control electrode node coupled to receive an output signal of said second inverter, and another conduction terminal, and clamp element for clamping said another conduction terminal to a predetermined potential.

10. The internal power supply voltage generating circuit according to claim 9, wherein said clamp element comprises a field effect transistor of the first conductivity type having one conduction terminal coupled to said another conduction terminal of said second field effect transistor, another conduction terminal coupled to receive another power supply voltage different in logic from said external power supply voltage and said internal power supply voltage, and a control electrode node coupled to receive a predetermined bias voltage.

*11. An internal power supply voltage generating circuit down-converting an external power supply voltage applied to an external power supply node for generating an internal power supply voltage on an internal power supply line, comprising:*

*comparing means for comparing a voltage on said internal power supply line and a reference voltage;*

*buffer means for buffering an output of said comparing means;*

*a first drive element supplying current from said external power supply node onto said internal power supply line in response to a difference between the voltage on said internal power supply line and a prescribed voltage; and*

*a second drive element supplying current from said external power supply node to said internal power supply line in response to an output of said buffer means.*

*12. The internal power supply voltage generating circuit according to claim 11, wherein said comparing means includes,*

*level shift means coupled to receive the voltage on said internal power supply line and said reference voltage for shifting down in potential said voltage and said reference voltage, and*

*differential amplifier means coupled to said level shift means for differentially amplifying the voltages received from said level shift means.*

*13. The internal power supply voltage generating circuit according to claim 12, wherein said level shift means includes source follower transistors coupled to receive said voltage on said internal power supply line and said reference voltage for transmission in a source follower mode to said differential amplifier means.*

*14. The internal power supply voltage generating circuit according to claim 12, wherein said differential amplifier means includes,*

*a first differential amplifier for differentially amplifying the voltages received from said level shift means for outputting,*

*a second differential amplifier for differentially amplifying the voltages received from said level shift means complementarily to said first differential amplifier for outputting, and*

*a third differential amplifier couple to receive output signals of said first and second differential amplifiers for differentially amplifying said output signals for outputting.*

*15. The internal power supply voltage generating circuit according to claim 12, wherein said comparing means further includes cut off means, coupled to said level shift means and said differential amplifier means and responsive to an operation mode designation signal for cutting off a current flowing path in each of said level shift means and said differential amplifier means.*

*16. The internal power supply voltage generating circuit according to claim 11, wherein said buffer means includes limiting means for limiting an amplitude of an output signal thereof.*

*17. The internal power supply voltage generating circuit according to claim 16, wherein said limiting means includes*

*means for shifting one level of the output signal of said buffer means, while maintaining another level of said output signal.*

*18. The internal power supply voltage generating circuit according to claim 11, wherein said second drive element comprises a field effect transistor of a first conductivity type, and wherein said buffer means includes*

*a first inverter coupled to receive and invert the output signal of said comparing means,*

*a second inverter coupled to receive and invert an output signal of said first inverter,*

*a first field effect transistor of the first conductivity type having one conduction terminal coupled to a node receiving said external power supply voltage, another conduction terminal coupled to a control electrode node of said second drive element, and a control electrode node coupled to receive the output signal of said first inverter,*

*a second field effect transistor of the first conductivity type having one conduction terminal coupled to said control gate of said second drive element, a control electrode node coupled to receive an output signal of said second inverter, and another conduction terminal, and*

*clamp element for clamping said another conduction terminal to a predetermined potential.*

*19. The internal power supply voltage generating circuit according to claim 18, wherein said clamp element comprises a field effect transistor of the first conductivity type having one conduction terminal coupled to said another conduction terminal of said second field effect transistor, another conduction terminal coupled to receive another power supply voltage different in logic from said external power supply voltage and said internal power supply voltage, and a control electrode node coupled to receive a predetermined bias voltage.*

* * * * *